(12) United States Patent
Yokokawa et al.

(10) Patent No.: US 7,299,397 B2
(45) Date of Patent: Nov. 20, 2007

(54) DECODING APPARATUS, DECODING METHOD, AND PROGRAM TO DECODE LOW DENSITY PARITY CHECK CODES

(75) Inventors: Takashi Yokokawa, Tokyo (JP); Toshiyuki Miyauchi, Tokyo (JP); Yasuhiro Iida, Tokyo (JP)

(73) Assignee: Sony Corporation, Tokyo (JP)

( * ) Notice: Subject to any disclaimer, the term of this patent is extended or adjusted under 35 U.S.C. 154(b) by 78 days.

(21) Appl. No.: 10/521,054

(22) PCT Filed: Apr. 19, 2004

(86) PCT No.: PCT/JP2004/005562

§ 371 (c)(1),
(2), (4) Date: Jan. 12, 2005

(87) PCT Pub. No.: WO2004/102811

PCT Pub. Date: Nov. 25, 2004

(65) Prior Publication Data

US 2005/0240853 A1    Oct. 27, 2005

(30) Foreign Application Priority Data

May 13, 2003  (JP)  ............................. 2003-133941
Aug. 18, 2003  (JP)  ............................. 2003-294383

(51) Int. Cl.
*H03M 13/00* (2006.01)
(52) U.S. Cl. ..................................................... 714/752
(58) Field of Classification Search ................. 714/752
See application file for complete search history.

(56) References Cited

U.S. PATENT DOCUMENTS 6,539,367 B1    3/2003   Blanksby et al.

(Continued)

FOREIGN PATENT DOCUMENTS

EP    1 158 682    11/2001

(Continued)

OTHER PUBLICATIONS

Robert G. Gallager, *Low-Density Parity Check Codes* (M. I. T. Press 1963).

(Continued)

*Primary Examiner*—Guy Lamarre
*Assistant Examiner*—Sam Rizk
(74) *Attorney, Agent, or Firm*—Finnegan, Henderson, Farabow, Garrett & Dunner, L.L.P.

(57) ABSTRACT

The present invention relates to a decoding apparatus and a decoding method for realizing the decoding of LDPC codes, in which, while the circuit scale is suppressed, the operating frequency can be suppressed within a sufficiently feasible range, and control of memory access can be performed easily, and to a program therefor. A check matrix of LDPC codes is formed by a combination of a (P×P) unit matrix, a matrix in which one to several 1s of the unit matrix are substituted with 0, a matrix in which they are cyclically shifted, a matrix, which is the sum of two or more of them, and a (P×P) 0-matrix. A check node calculator 313 simultaneously performs p check node calculations. A variable node calculator 319 simultaneously performs p variable node calculations.

40 Claims, 35 Drawing Sheets

U.S. PATENT DOCUMENTS

| | | | |
|---|---|---|---|
| 6,633,856 B2* | 10/2003 | Richardson et al. | 706/15 |
| 6,785,863 B2* | 8/2004 | Blankenship et al. | 714/799 |
| 6,938,196 B2* | 8/2005 | Richardson et al. | 714/752 |
| 6,957,375 B2* | 10/2005 | Richardson | 714/752 |
| 6,961,888 B2* | 11/2005 | Jin et al. | 714/752 |
| 2002/0186759 A1* | 12/2002 | Goldstein et al. | 375/222 |
| 2004/0019845 A1* | 1/2004 | Eroz et al. | 714/801 |
| 2004/0034828 A1* | 2/2004 | Hocevar | 714/800 |
| 2004/0187129 A1* | 9/2004 | Richardson | 718/100 |
| 2005/0278606 A1* | 12/2005 | Richardson | 714/760 |

FOREIGN PATENT DOCUMENTS

| | | |
|---|---|---|
| JP | 2002-33670 | 1/2002 |
| JP | 2003-269302 | 9/2003 |

OTHER PUBLICATIONS

David J. C. MacKay, "Good Error-Correcting Codes Based on Very Sparse Matrices," *IEEE Transactions on Information Theory*, vol. 45, No. 2, pp. 399-431, Mar. 1999.

Michael G. Luby, Michael Mitzenmacher, M. Amin Shokrollahi & Daniel A. Spielman, "Analysis of Low Density Codes and Improved Design Using Irregular Graphs," *Proceedings of ACM Symposium on Theory of Computing*, pp. 249-258 (1998).

C. Howland & A. Blanksby, "Parallel Decoding Architectures for Low Density Parity Check Codes," *Symposium on Circuits and Systems*, part IV, pp. 742-745 (2001).

Engling Yeo, Payam Pakzad, Borivoje Nikolic & Venkat Anantharam, "VLSI Architectures for Iterative Decoders in Magnetic Recording Channels," *IEEE Transactions on Magnetics*, vol. 37, No. 2, pp. 748-755, Mar. 2001.

S. Kim et al, 'Parallel VSLI Architectures for a Class of LD PC Codes', IEEE International Symposium on Circuits and Systems, 2002, ISCAS 2002, vol. 2, Nov. 2002, p. 26-29.

* cited by examiner

FIG. 1 - Prior Art
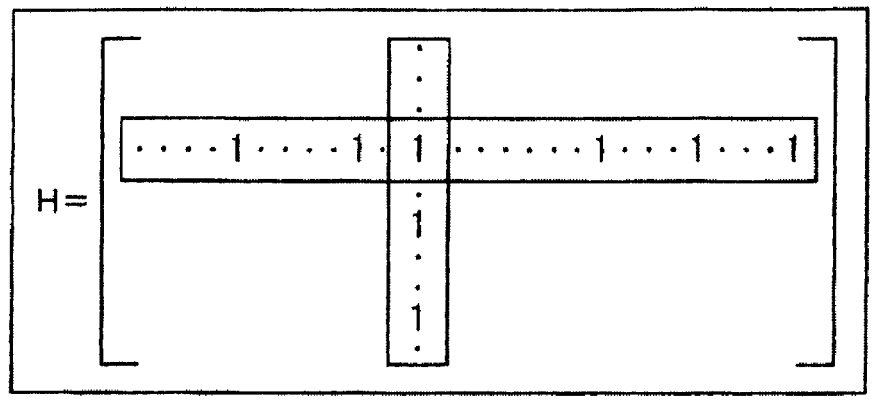
FIG. 2 - Prior Art
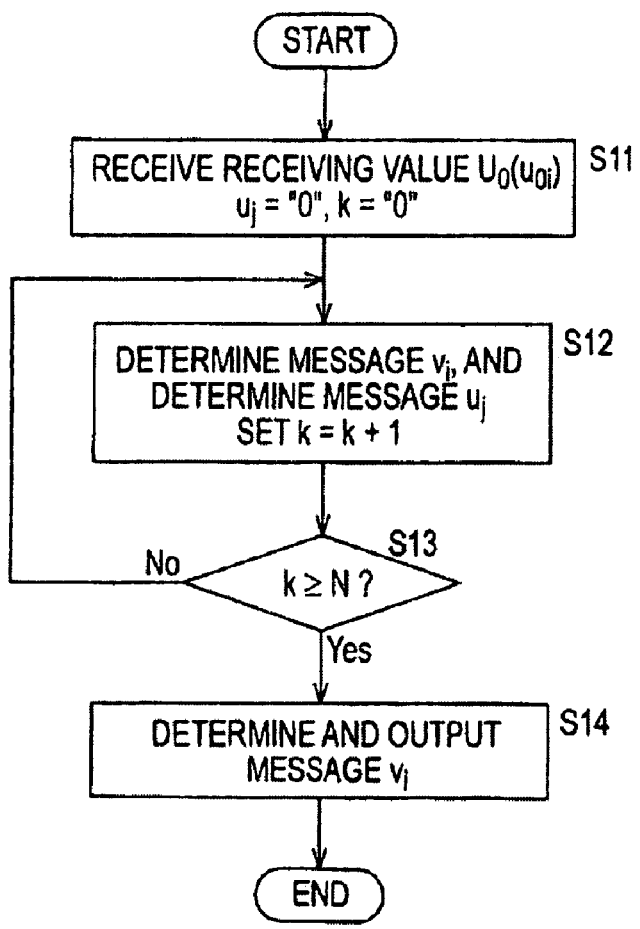

FIG. 3 - Prior Art
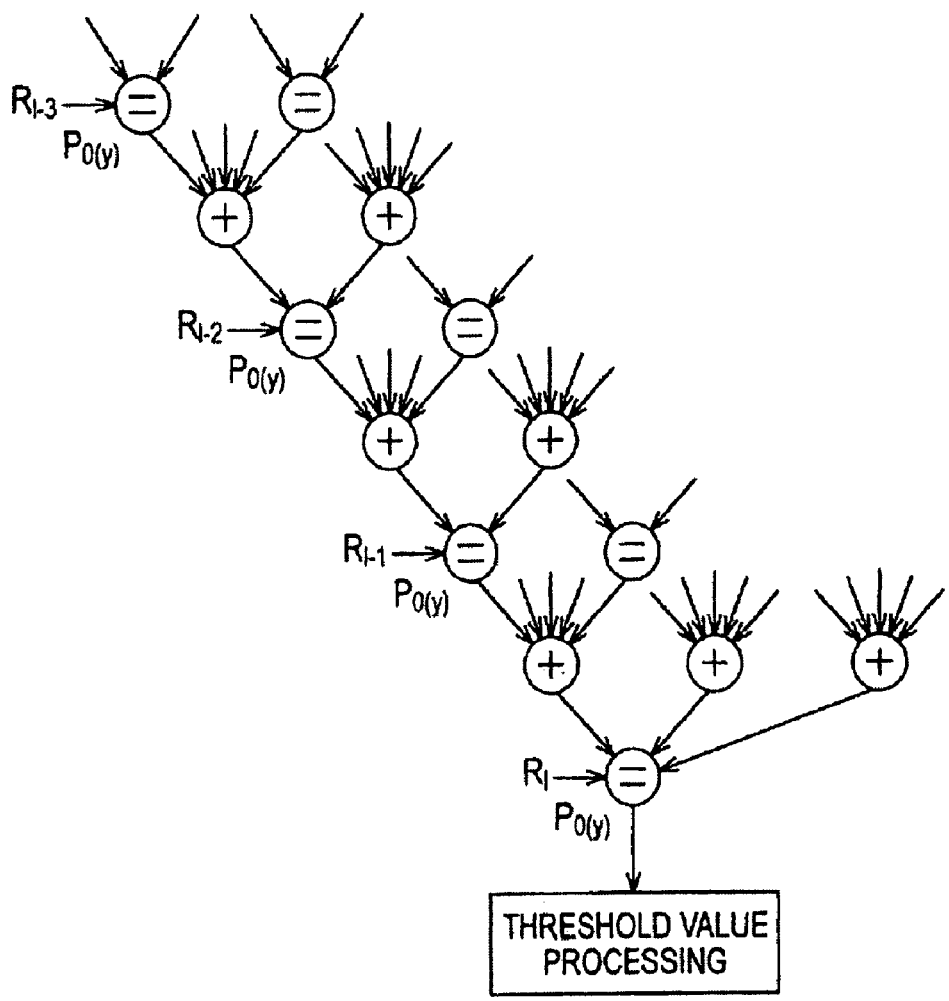
FIG. 4 - Prior Art
$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 0 & 0 & 1 & 0 & 0 & 0 \\ 0 & 0 & 0 & 1 & 1 & 0 & 1 & 1 & 0 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG. 5 - Prior Art
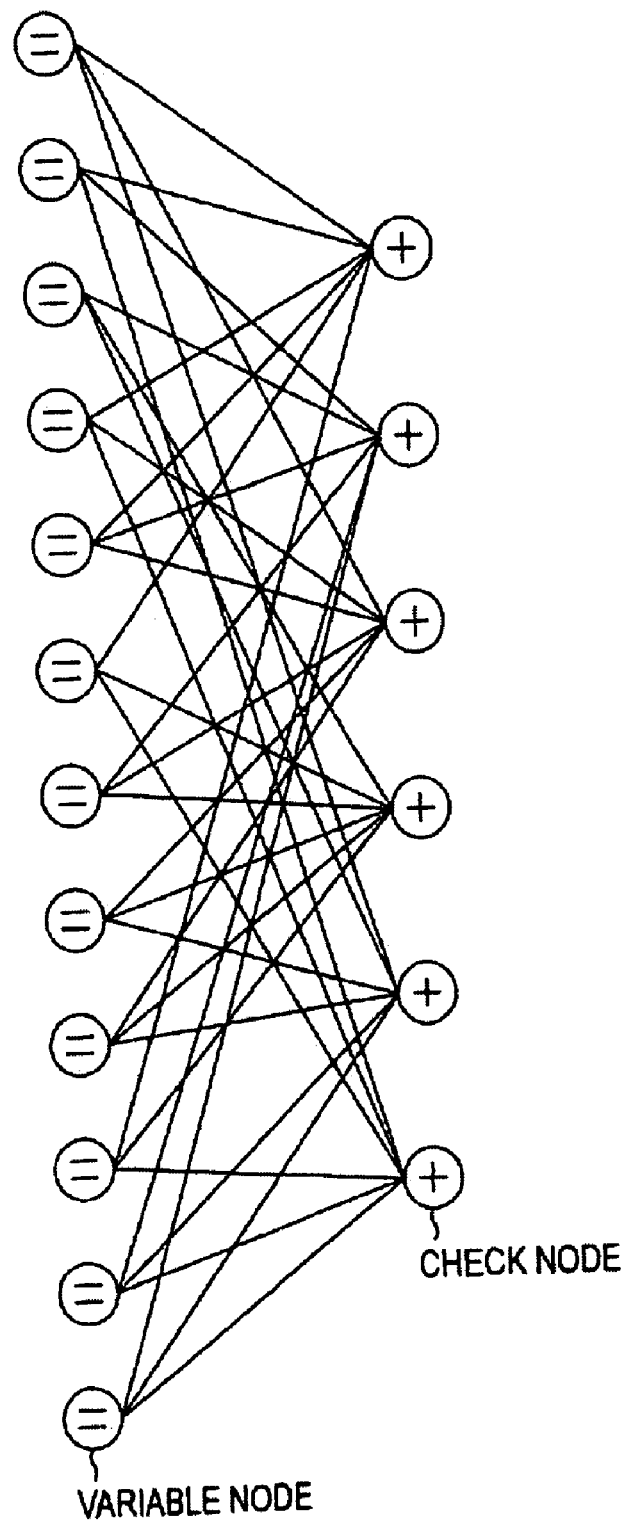

FIG. 6 - Prior Art
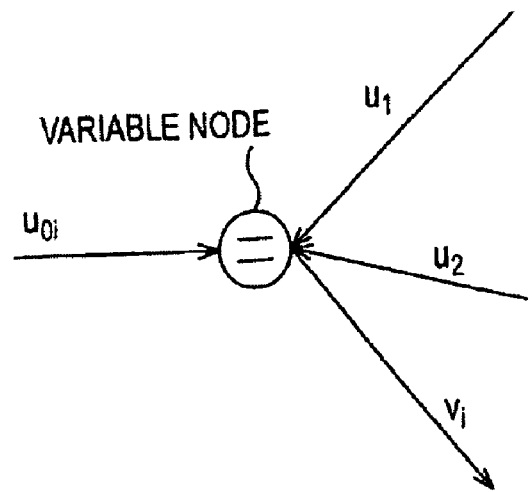
FIG. 7 - Prior Art
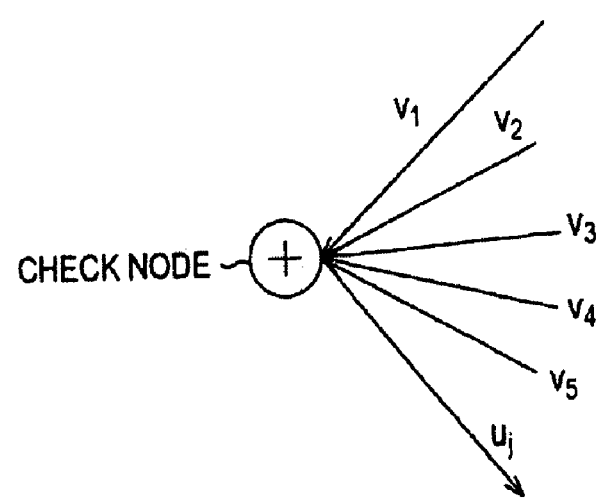

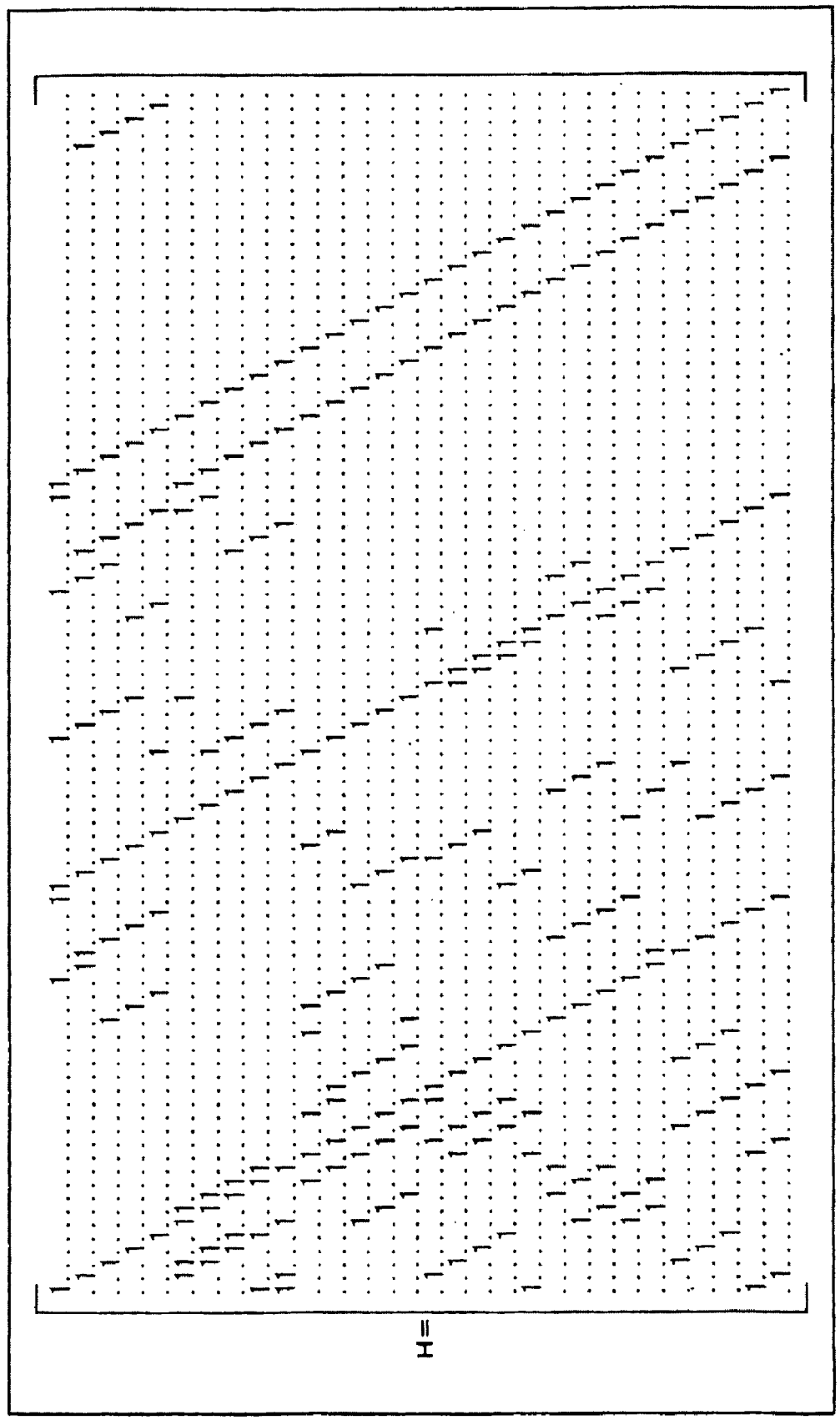
FIG. 8 - Prior Art

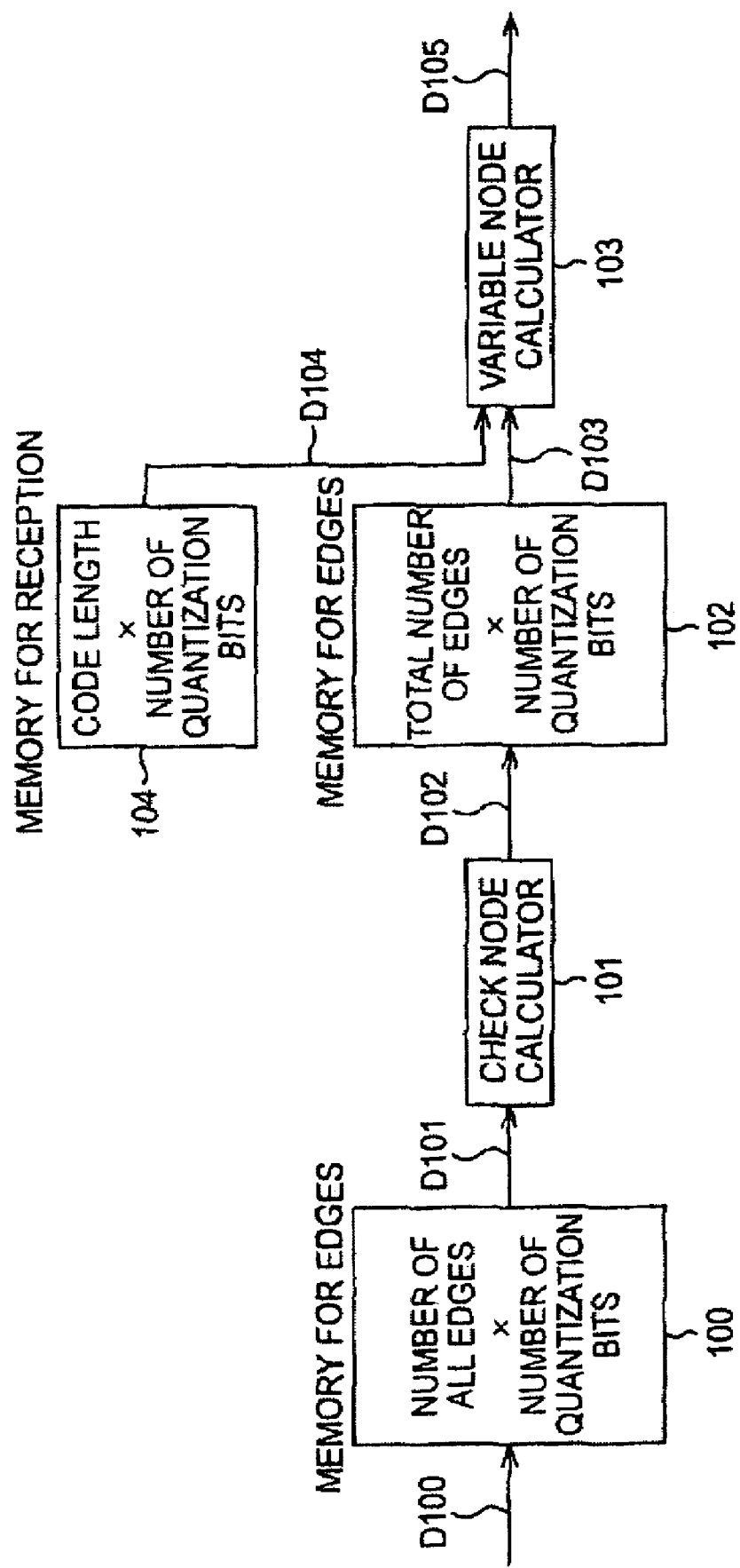
FIG. 9 - Prior Art

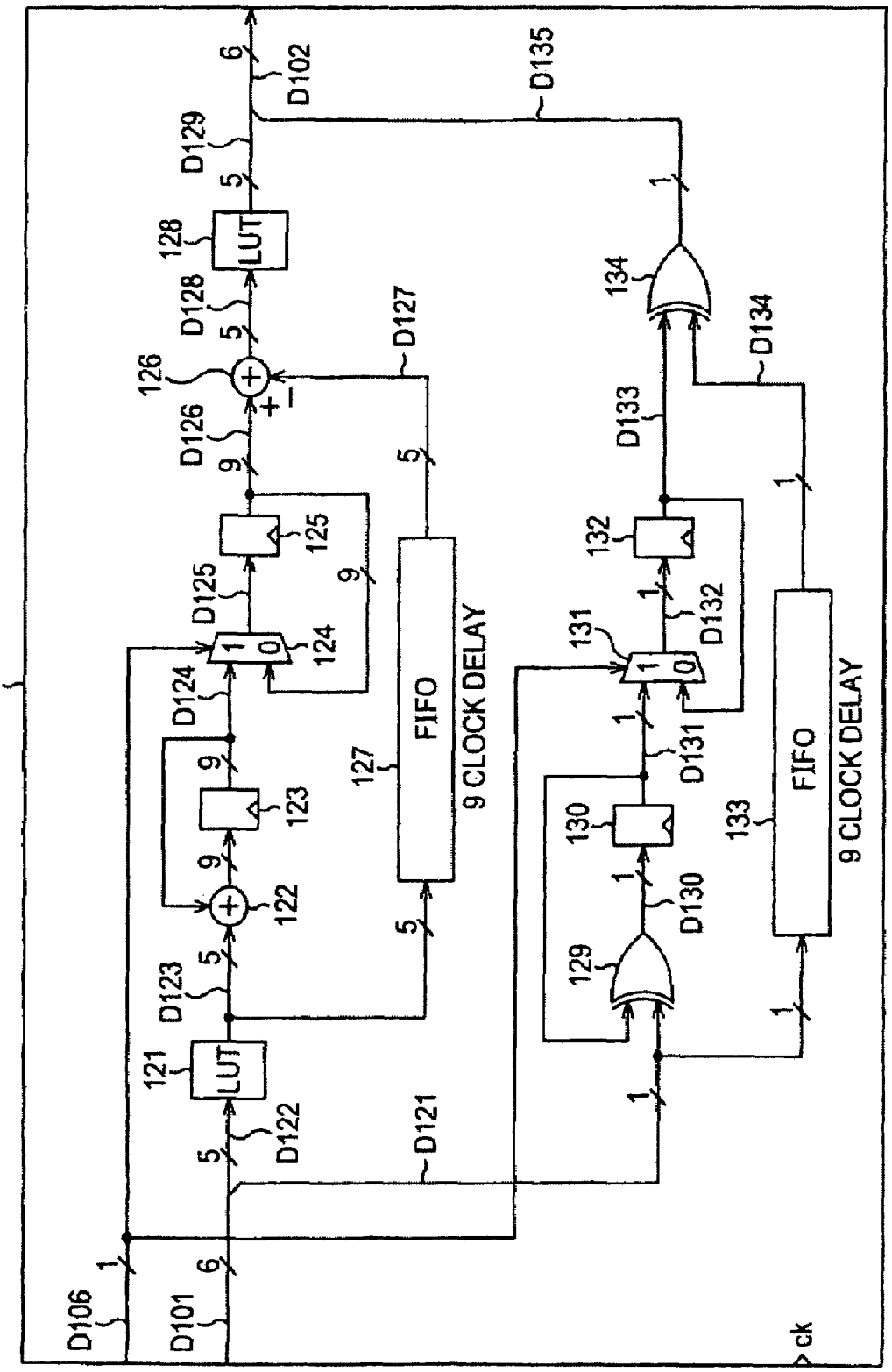
FIG. 10 - Prior Art

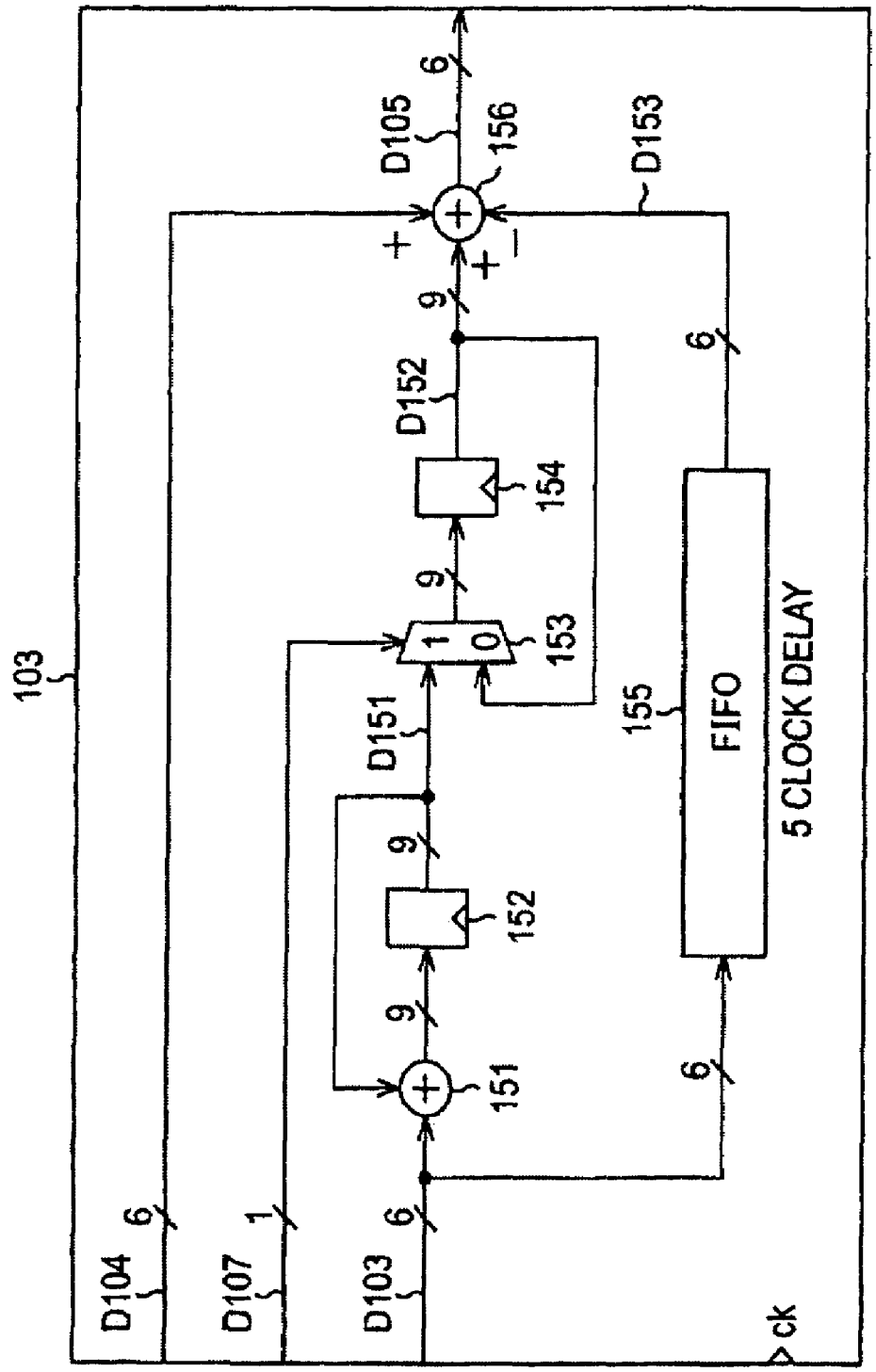
FIG. 11 - Prior Art

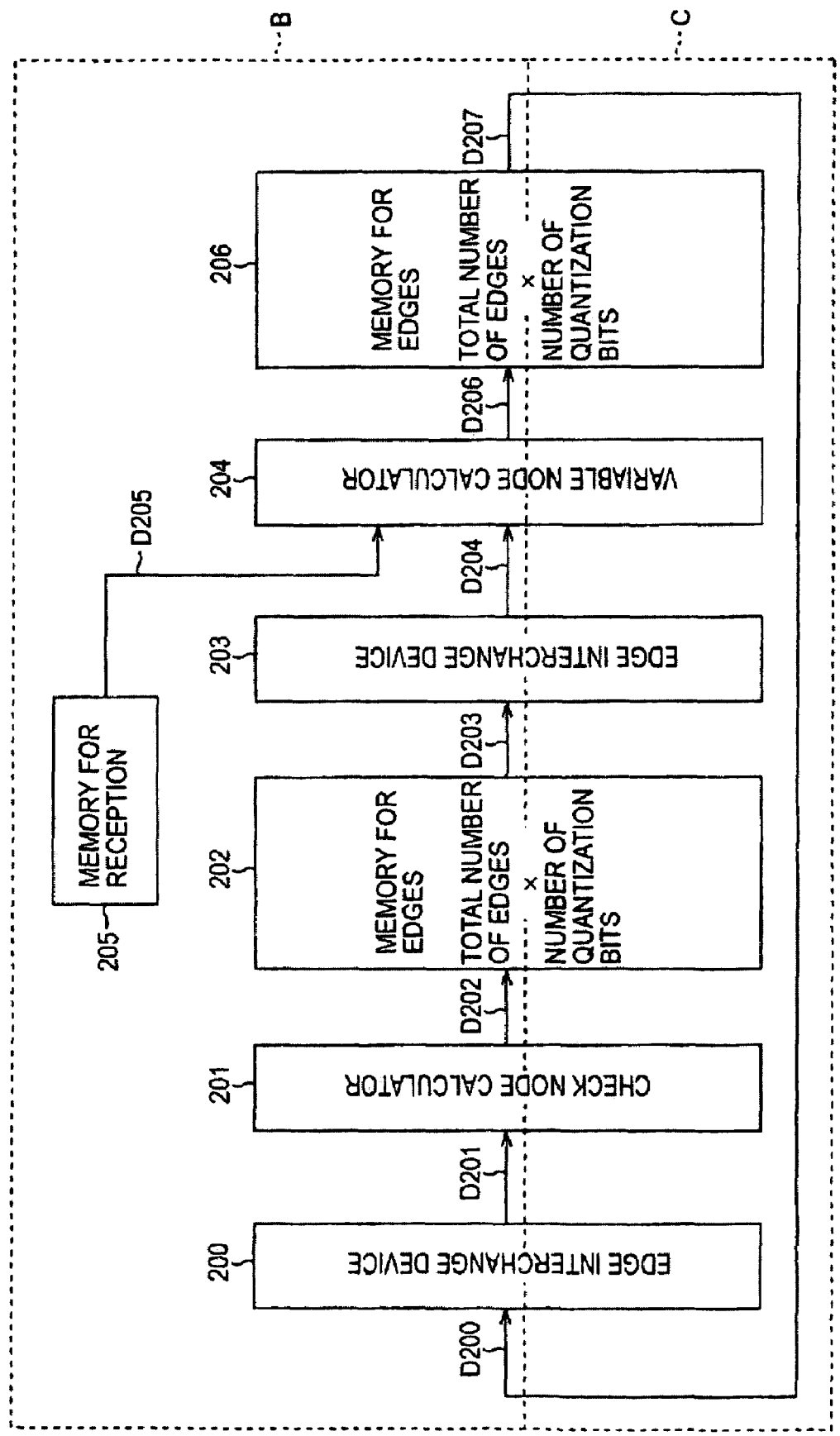
FIG. 12A - Prior Art

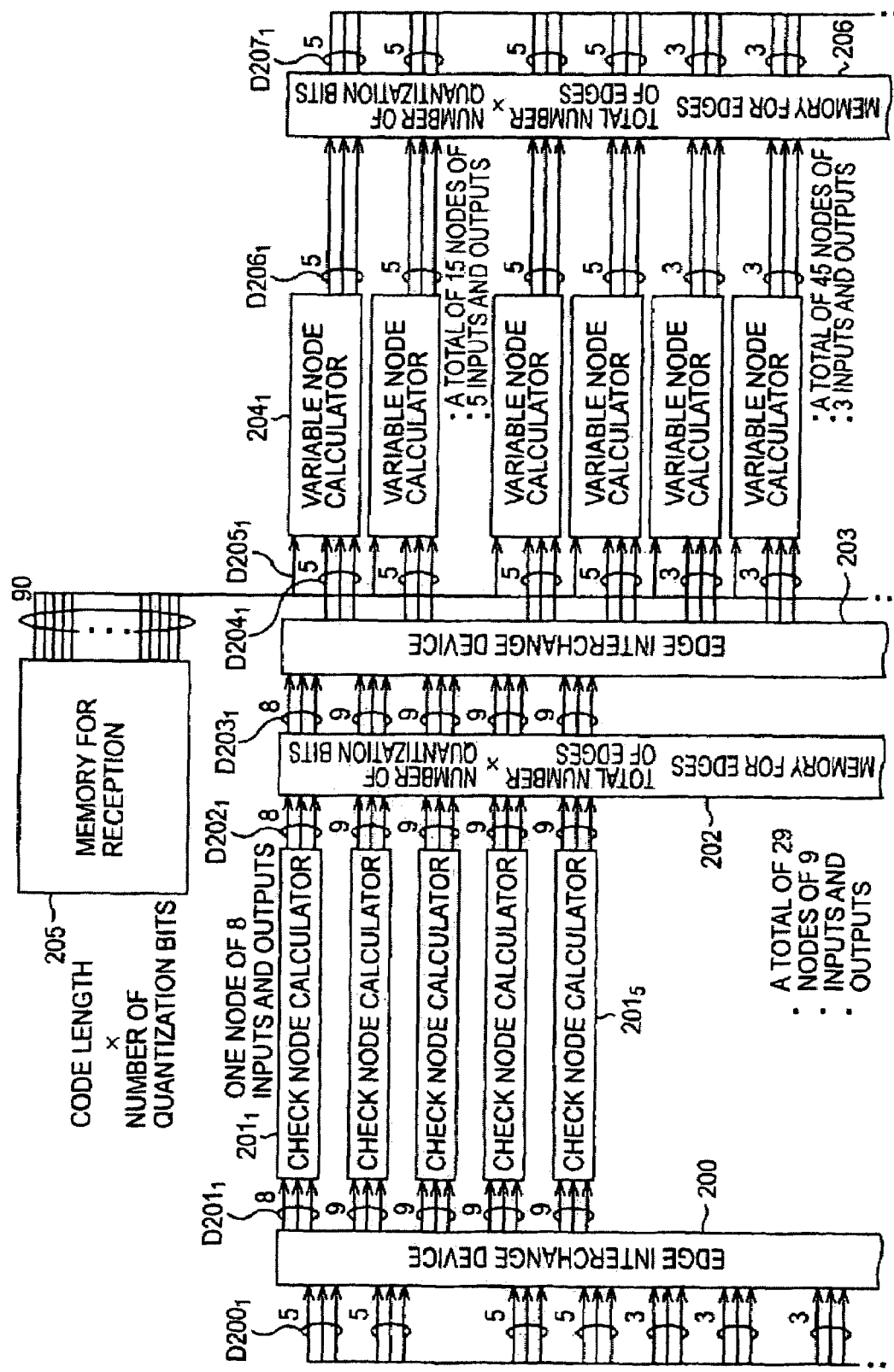
FIG. 12B - Prior Art

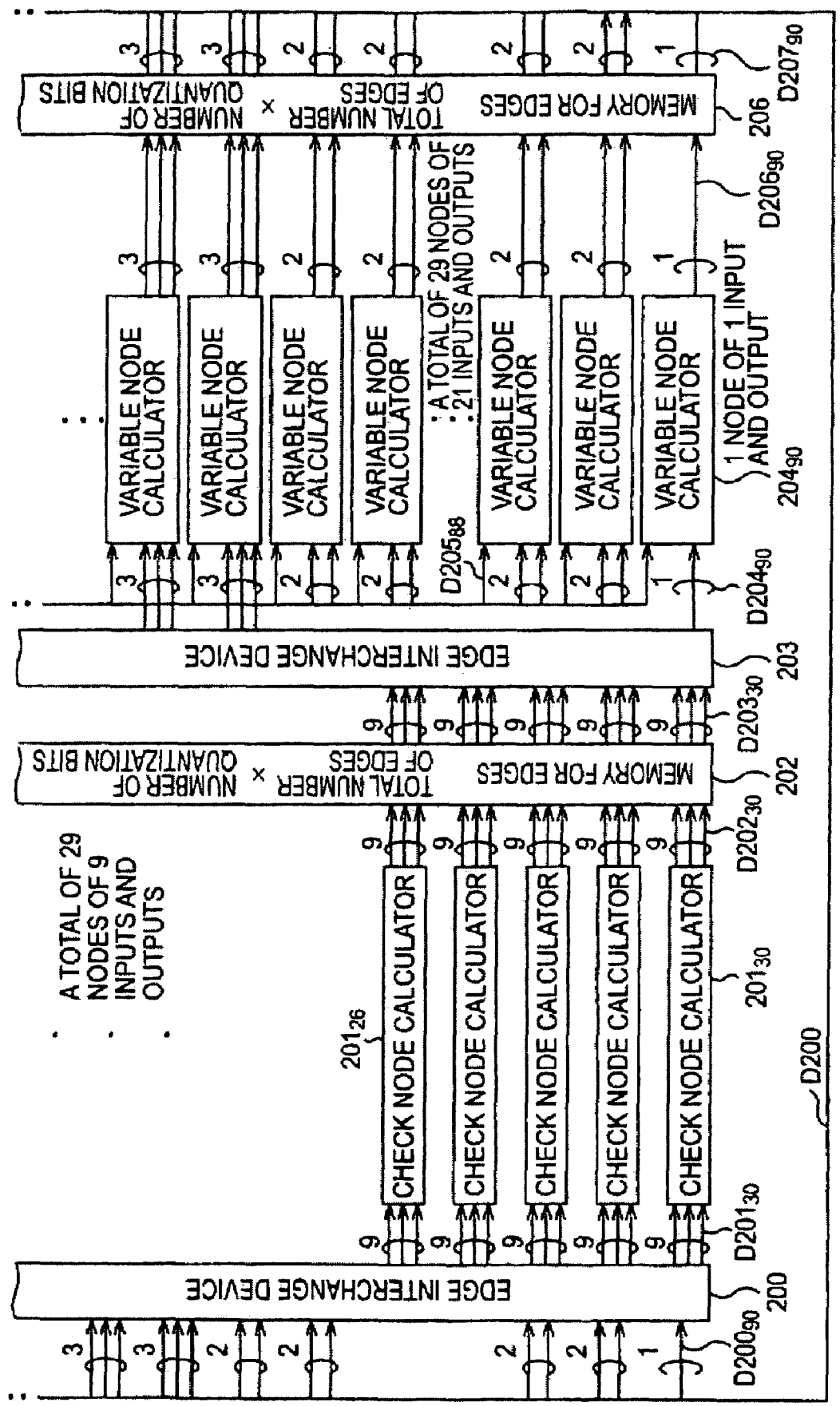
FIG. 12C - Prior Art

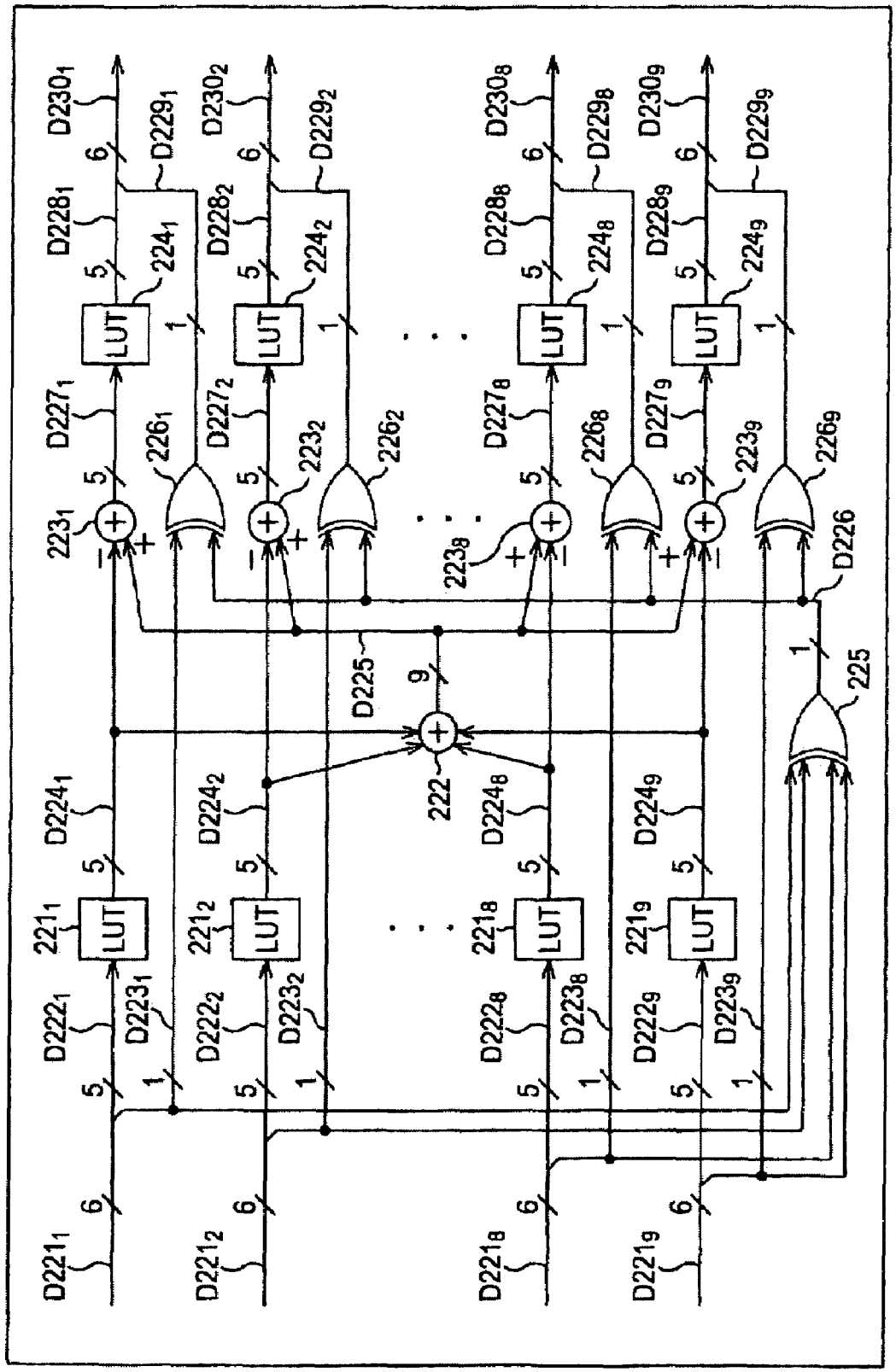
FIG. 13 - Prior Art

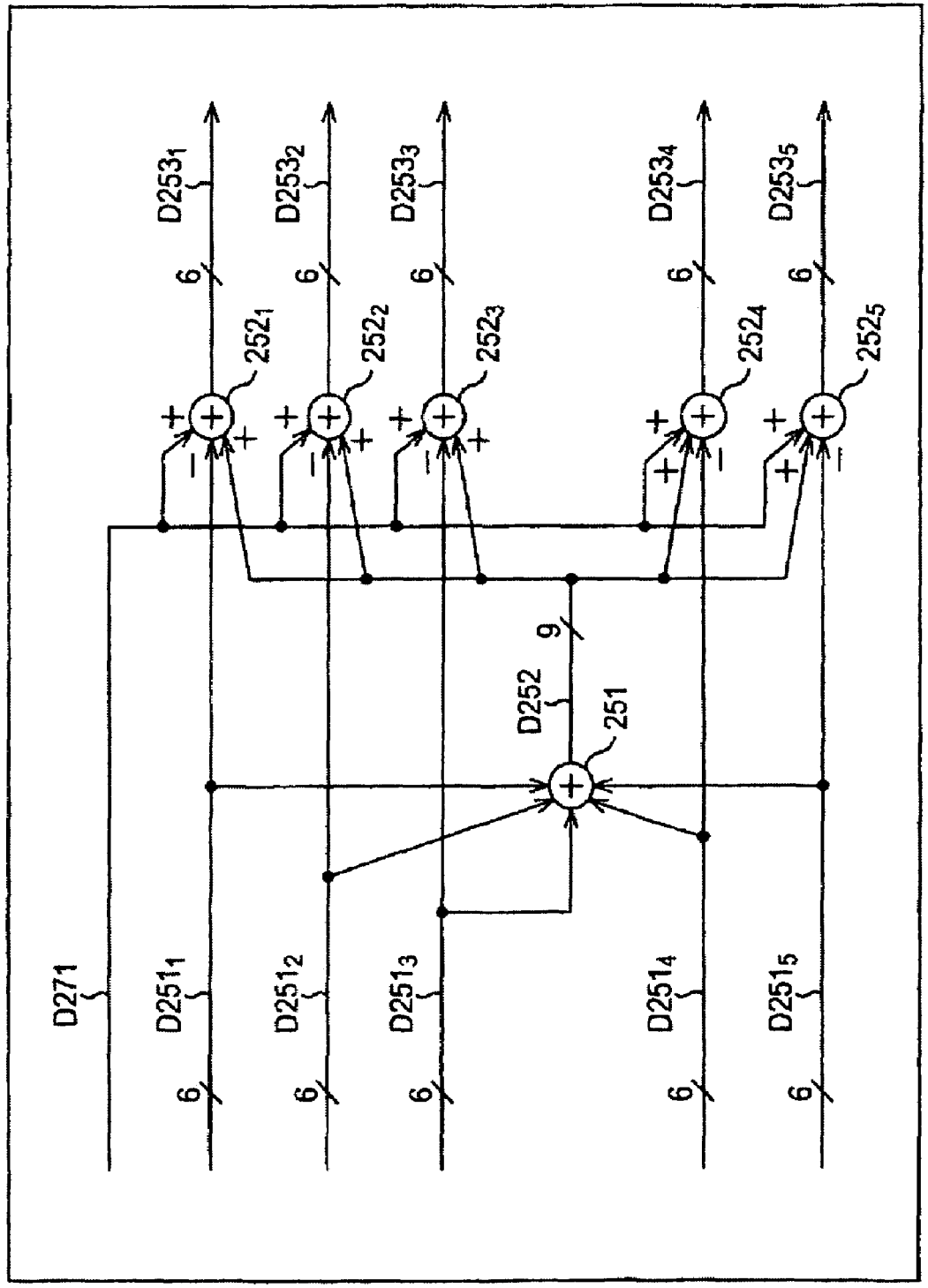

DECODING APPARATUS, DECODING METHOD, AND PROGRAM TO DECODE LOW DENSITY PARITY CHECK CODES

TECHNICAL FIELD

The present invention relates to a decoding apparatus, a decoding method, and a program. More particularly, the present invention relates to a decoding apparatus and a decoding method for decoding codes on which coding is performed using low density parity check codes (LDPC codes), and to a program therefor.

BACKGROUND ART

In recent years, research in, for example, communication fields such as mobile communication and deep space communication, and broadcasting fields such as terrestrial-wave or satellite digital broadcasts has progressed remarkably. Along with this situation, research on coding theories for making error correction coding and decoding efficient has been actively carried out.

As a theoretical limit of code performance, the Shannon limit implied by the so-called Shannon's (C. E. Shannon) channel coding theorem is known. Research on coding theories has been carried out for the purpose of developing codes exhibiting performance near this Shannon limit. In recent years, as a coding method exhibiting performance near the Shannon limit, for example, techniques for what is commonly called "turbo coding", such as parallel concatenated convolutional codes (PCCC) and serially concatenated convolutional codes (SCCC), have been developed. Furthermore, whereas this turbo coding has been developed, low density parity check codes (hereinafter referred to as "LDPC codes"), which is a coding method that has been known for a long time, have attracted attention.

LDPC codes were proposed first in R. G. Gallager, "Low Density Parity Check Codes", Cambridge, Mass.: M. I. T. Press, 1963. Thereafter, LDPC codes reattracted attention in D. J. C. MacKay, "Good error correcting codes based on very sparse matrices", submitted to IEEE Trans. Inf. Theory, IT-45, pp. 399-431, 1999, and M. G. Luby, M. Mitzenmacher, M. A. Shokrollahi and D. A. Spielman, "Analysis of low density codes and improved designs using irregular graphs", in Proceedings of ACM Symposium on Theory of Computing, pp. 249-258, 1998.

It is beginning to be known from this recent research that, for the LDPC codes, as the code length increases, performance close to the Shannon limit can be obtained, similarly to turbo coding. Furthermore, since the LDPC codes have the property that the minimum length is proportional to the code length, they have the advantages that the block error probability characteristics are good, and a so-called error floor phenomenon, which is observed in decoding characteristics of turbo coding, hardly occurs.

Such LDPC codes will now be described in detail below. The LDPC codes are linear codes and do not always need to be two-dimensional, but here, a description is given assuming that the LDPC codes are two-dimensional.

The greatest features of the LDPC codes are that the parity check matrix that defines the LDPC codes are sparse. Here, a sparse matrix is formed in such a manner that the number of 1s in the elements of the matrix is very small. If the sparse check matrix is denoted as H, examples thereof include a check matrix in which, as shown in FIG. 1, the Hamming weight of each column (number of 1s; weight) is "3", and the Hamming weight of each row is "6".

As described above, the LDPC codes defined by the check matrix H in which the Hamming weight of each row and each column is fixed are called "regular LDPC codes". On the other hand, the LDPC codes defined by a check matrix H in which the Hamming weight of each row and each column is not fixed are called "irregular LDPC codes".

Coding by such LDPC codes is realized by generating a generation matrix G on the basis of the check matrix H and by generating a code word by multiplying this generation matrix G by a two-dimensional information message. More specifically, a coding apparatus for performing coding by LDPC codes computes a generation matrix G in which the equation $GH^T=0$ holds with a transpose matrix $H^T$ of the check matrix H. Here, when the generation matrix G is a k×n matrix, the coding apparatus multiplies the generation matrix G by a k-bit information message (vector u), and generates an n-bit codeword c (=uG). The codeword generated by this coding apparatus is transmitted with the code bit whose value is "0" being mapped to "+1" and the code bit whose value is "1" being mapped to "−1", and is received at the reception side via a predetermined communication channel.

On the other hand, decoding of the LDPC codes can be performed by a message passing algorithm by belief propagation on a so-called Tanner graph, which is formed of a variable node (also called a message node) and a check node; this message passing algorithm was proposed by Gallager and is known as "probabilistic decoding". Hereafter, the variable nodes and the check nodes are also referred to simply as nodes where appropriate.

However, in probabilistic decoding, since messages exchanged between nodes are real-number values, in order to find an analytical solution, it is necessary to trace the probability distribution of the message that takes a continuous value. This necessitates analysis involving a large degree of difficulty. Accordingly, Gallager has proposed an algorithm A or an algorithm B as an algorithm for decoding LDPC codes.

In general, decoding of the LDPC codes is performed in accordance with the procedure shown in FIG. 2. Here, the receiving value is denoted as $U_0$ ($u_{0i}$), the message output from the check node is denoted as $u_j$, and the message output from the variable node is denoted as $v_i$. Here, the message is a real-number value such that the "0"-likeness of the value is represented by a so-called log likelihood ratio.

In the decoding of the LDPC codes, initially, as shown in FIG. 2, in step S11, the receiving value $U_0$ ($u_{0i}$) is received, the message $u_j$ is initialized to 0, and a variable k that takes an integer as a counter for an iterative process is initialized to 0. The process then proceeds to step S12. In step S12, based on the received value $U_0$ ($u_{0i}$), a message $v_i$ is determined by performing a computation shown in equation (1). Furthermore, based on this message $v_i$, a message $u_j$ is determined by performing a computation shown in equation (2).

$$v_i = u_{0i} + \sum_{j=1}^{d_v-1} u_j \quad (1)$$

$$\tanh\left(\frac{u_j}{2}\right) = \prod_{i=1}^{d_c-1} \tanh\left(\frac{v_i}{2}\right) \quad (2)$$

Here, $d_v$ and $d_c$ in equations (1) and (2) are parameters respectively that indicate the number of 1s in the vertical direction (in the row direction) and in the horizontal direction (in the column direction) of the check matrix H and that can be selected as desired. For example, in the case of a (3, 6) code, $d_v=3$ and $d_c=6$.

In the computation of each of equations (1) and (2), since the message input from an edge from which a message is to be output is not used as a parameter for a sum or product computation, the range of the sum or product computation is from 1 to $d_v-1$ or 1 to $d_c-1$. In practice, the computation shown in equation (2) is performed by creating in advance a table of a function $R(v_1, v_2)$, shown in equation (3), that is defined by one output with respect to two inputs $v_1$ and $v_2$ and by using this table continuously (recursively), as shown in equation (4).

$$x = 2\tan h^{-1}\{\tan h(v_1/2)\tan h(v_2/2)\} = R(v_1, v_2) \quad (3)$$

$$u_j = R(v_1, R(v_2, R(v_3, \ldots R(v_{d_c-2}, v_{d_c-1})))) \quad (4)$$

In step S12, furthermore, the variable k is incremented by 1, and the process then proceeds to step S13. In step S13, it is determined whether or not the variable k is greater than or equal to a predetermined number N of iterative decodings. When it is determined in step S13 that the variable k is not greater than or equal to N, the process returns to step S12, and the identical processing is performed again.

When it is determined in step S13 that the variable k is greater than or equal to N, the process proceeds to step S14, where the message v serving as the decoded result, which is finally output as a result of performing the computation shown in equation (5), is determined and output. This completes the decoding process of the LDPC codes.

$$v_i = u_{0i} + \sum_{j=1}^{d_v} u_j \quad (5)$$

Here, unlike the computation of equation (1), the computation of equation (5) is performed using the input messages from all the edges connected to the variable nodes.

In such LDPC code decoding, for example, in the case of (3, 6) code, as shown in FIG. 3, messages are exchanged between nodes. In the node (variable node) indicated by "=" in FIG. 3, the computation shown in equation (1) is performed. In the node indicated by "+" (check node), the computation shown in equation (2) is performed. In particular, in the algorithm A, the message is formed to be two-dimensional; in the node indicated by "+", an exclusive OR computation of $d_c-1$ input messages is performed; and in the node indicated by "=", with respect to the received value R, when all the $d_v-1$ input messages are different bit values, the sign is inverted and output.

Furthermore, in recent years, research on an implementation method of the decoding of LDPC codes has been carried out. Before describing the implementation method, the decoding of LDPC codes is described in a schematic form.

FIG. 4 shows an example of a parity check matrix of (3,6) LDPC codes (a coding rate of ½, a code length of 12). The parity check matrix of LDPC codes can be written by using a Tanner graph, as shown in FIG. 5. In FIG. 5, nodes indicated by "+" are check nodes, and nodes indicated by "=" are variable nodes. The check nodes and the variable nodes correspond to the rows and the columns of the parity check matrix, respectively. The connecting line between the check node and the variable node is an edge and corresponds to "1" of the check matrix. That is, when the element of the j-th row and the i-th column of the check matrix is 1, in FIG. 5, the i-th variable node (node of "=") from the top and the j-th check node (node of "+") from the top are connected to each other by an edge. The edge indicates that the sign bit corresponding to the variable node has a constraint condition corresponding to the check node. FIG. 5 shows a Tanner graph of the check matrix of FIG. 4.

In the sum product algorithm, which is a method of decoding LDPC codes, the computation of the variable node and the computation of the check node are repeatedly performed.

In the variable node, as shown in FIG. 6, the computation of equation (1) is performed. That is, in FIG. 6, the message $v_i$ corresponding to the edge to be calculated is calculated by using the messages $u_1$ and $u_2$ from the remaining edges connected to the variable node, and the received information $u_{0i}$. The messages corresponding to the other edges are also calculated similarly.

Before describing the check node computation, equation (2) is rewritten as shown in equation (6) by using the equation $a \times b = \exp\{\ln(|a|)+\ln(|b|)\} \times \text{sign}(a) \times \text{sign}(b)$, where sign (x) is 1 when $x \geq 0$ and is $-1$ when $x<0$.

$$\begin{aligned} u_j &= 2\tanh^{-1}\left(\prod_{i=1}^{d_c-1} \tanh\left(\frac{v_i}{2}\right)\right) \\ &= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right] \\ &= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right] \end{aligned} \quad (6)$$

Furthermore, in the case of $x \geq 0$, when the definition $\phi(x)=\ln(\tan h(x/2))$ is made, since $\phi^{-1}(x)=2\tan h^{-1}(e^{-x})$, equation (6) can be written as equation (7).

$$u_j = \phi^{-1}\left(\sum_{i=1}^{d_c-1} \phi(|v_i|)\right) \times \prod_{i=1}^{d_c-1} \text{sign}(v_i) \quad (7)$$

In the check node, as shown in FIG. 7, the computation of equation (7) is performed. That is, in FIG. 7, the message $u_j$ corresponding to the edge for which a calculation is to be performed is calculated by using the messages $v_1, v_2, v_3, v_4$, and $v_5$ from the remaining edges connected to the check node. The messages corresponding to the other edges are also calculated similarly.

The function $\phi(x)$ can also be expressed as $\phi(x)=\ln((e^x+1)/(e^x-1))$ and when x>0, $\phi(x)=\phi^{-1}(x)$. When the functions $\phi(x)$ and $\phi^{-1}(x)$ are implemented as hardware, there are cases in which they are implemented using an LUT (Look-Up Table), and both of them are the same LUT.

When the sum product algorithm is implemented as hardware, it is necessary to repeatedly perform the variable node computation expressed by equation (1) and the check node computation expressed by equation (7) with an appropriate circuit scale and at an appropriate operating frequency.

As an example of the implementation of the decoding apparatus, a description is given first of an implementation method in a case where decoding is performed by simply performing the computation of each node one-by-one in sequence (full serial decoding).

It is assumed here that, for example, codes (a coding rate of 2/3, and a code length of 90) represented by a 30 (rows)×90 (columns) check matrix of FIG. 8 are decoded. The number of 1s of the check matrix of FIG. 8 is 269; therefore, in the Tanner graph, the number of edges becomes 269. Here, in the check matrix of FIG. 8, 0 is represented by ".".

FIG. 9 shows an example of the configuration of a decoding apparatus for decoding LDPC codes once.

In the decoding apparatus of FIG. 9, a message corresponding to one edge is calculated for each clock at which it operates.

More specifically, the decoding apparatus of FIG. 9 includes two memories 100 and 102 for edges, one check node calculator 101, and one variable node calculator 103, one memory 104 for reception, and one control section 105.

In the decoding apparatus of FIG. 9, message data is read one-by-one from the memory 100 or 102 for edges, and by using the message data, the message data corresponding to the desired edge is calculated. Then, the message data determined by that calculation is stored one-by-one in the memory 100 or 102 for edges at a subsequent stage. When iterative decoding is to be performed, the iterative decoding is realized by serially concatenating a plurality of the decoding apparatuses of FIG. 9 for decoding LDPC codes once or by repeatedly using the decoding apparatus of FIG. 9. Here, it is assumed that, for example, a plurality of the decoding apparatuses of FIG. 9 are connected.

The memory 100 for edges stores messages D100 supplied from the variable node calculator 103 of the decoding apparatus (not shown) at a previous stage in the order in which the check node calculator 101 at a subsequent stage reads them. Then, at the phase of the check node calculation, the memory 100 for edges supplies, to the check node calculator 101, the messages D100 as a message output D101 in the order in which they are stored.

Based on the control signal D106 supplied from the control section 105, the check node calculator 101 performs a computation in accordance with equation (7) by using the message D101 supplied from the memory 100 for edges, and supplies a message D102 determined by that computation to the memory 102 for edges at a subsequent stage.

The memory 102 for edges stores the messages D102 supplied from the check node calculator 101 at a previous stage in the order in which the variable node calculator 103 at a subsequent stage reads them. Then, at the phase of the variable node calculation, the memory 102 for edges supplies the message D102 as a message D103 to the variable node calculator 103 in the order in which they are stored.

Furthermore, a control signal D107 is supplied to the variable node calculator 103 from the control section 105, and received data D104 is supplied thereto from the memory 104 for reception. Based on a control signal D107, the variable node calculator 103 performs a computation in accordance with equation (1) by using the message D103 supplied from the memory 100 for edges and the received data D104 supplied from the memory 100 for reception, and supplies a message D105 obtained as a result of the computation to the memory 100 for edges, of the decoding apparatus (not shown) at a subsequent stage.

In the memory 104 for reception, received data (LDPC codes) that are converted into LDPC codes are stored. The control section 105 supplies a control signal D106 for controlling a variable node computation and a control signal D107 for controlling a check node computation to the check node calculator 101 and the variable node calculator 103, respectively. The control section 105 supplies the control signal D106 to the check node calculator 101 when the messages of all the edges are stored in the memory 100 for edges, and the control section 105 supplies the control signal D107 to the variable node calculator 103 when the messages of all the edges are stored in the memory 102 for edges.

FIG. 10 shows an example of the configuration of the check node calculator 101 of FIG. 9 for performing check node computations one-by-one.

In FIG. 10, the check node calculator 101 is shown by assuming that each message, together with the sign bit, is quantized into a total of six bits. Furthermore, in FIG. 10, a check node computation of LDPC codes represented by the check matrix of FIG. 8 is performed. Furthermore, a clock ck is supplied to the check node calculator 101 of FIG. 10, this clock ck being supplied to necessary blocks. Each block performs processing in synchronization with the clock ck.

Based on, for example, a 1-bit control signal D106 supplied from the control section 105, the check node calculator 101 of FIG. 10 performs computations in accordance with equation (7) by using the messages D101 that are read one-by-one from the memory 100 for edges.

More specifically, in the check node calculator 101, 6-bit messages D101 (messages $v_i$) from the variable node, corresponding to each column of the check matrix, are read one-by-one, the absolute value D122 ($|v_i|$), which is the lower-order bits thereof, is supplied to the LUT 121, and a sign bit D121, which is the highest bit thereof, is supplied to an EXOR circuit 129 and an FIFO (First In First Out) memory 133, respectively. Furthermore, the control signal D106 is supplied to the check node calculator 101 from the control section 105, and the control signal D106 is supplied to a selector 124 and a selector 131.

The LUT 121 reads a 5-bit computation result D123 ($\phi(|v_i|)$) such that the computation of $\phi(|v_i|)$ in equation (7) is performed on the absolute value D122 ($|v_i|$), and supplies it to an adder 122 and an FIFO memory 127.

The adder 122 integrates the computation results D123 by adding together the computation results D123 ($\phi(|v_i|)$) and a 9-bit value D124 stored in a register 123, and stores the 9-bit integration value obtained thereby in the register 123 again. When the computation results for the absolute values D122 ($|v_i|$) of the messages D101 from all the edges over one row of the check matrix are integrated, the register 123 is reset.

When the messages D101 over one row of the check matrix are read one-by-one and the integrated value such that the computation results D123 for one row is stored in the register 123, the control signal D106 supplied from the control section 105 changes from 0 to 1. For example, when the row weight is "9", the control signal D106 is "0" at the first to eighth clocks, and is "1" at the ninth clock.

When the control signal D106 is "1", the selector 124 selects the value stored in the register 123, that is, the 9-bit value D124 ($\Sigma\phi(|v_i|)$ from i=1 to i=$d_c$) such that $\phi(|v_i|)$ determined from the messages D101 (messages $v_i$) from all the edges over one row of the check matrix, and outputs the value as a value D125 to a register 125, whereby it is stored. The register 125 supplies the stored value D125 as a 9-bit value D126 to the selector 124 and the adder 126. When the control signal D106 is "0", the selector 124 selects the value D126 supplied from the register 125, and outputs the value to the selector 124, whereby it is stored again. That is, until $\phi(|v_i|)$ determined from the messages D101 (messages $v_i$) from all the edges over one row of the check matrix are integrated, the register 125 supplies the previously integrated $\phi(|v_i|)$ to the selector 124 and the adder 126.

On the other hand, the FIFO memory 127 delays the computation results D123 ($\phi(|(|v_i|)))$ output by the LUT 121 until a new value D126 ($\Sigma\phi(|v_i|)$ from i=1 to i=$d_c$) is output from the register 125, and supplies them as a 5-bit value D127 to a subtractor 126. The subtractor 126 subtracts, from the value D126 supplied from the register 125, the value D127 supplied from the FIFO memory 127, and supplies the subtracted result as a 5-bit subtracted value D128 to the LUT 128. That is, the subtractor 126 subtracts $\phi(|v_i|)$ determined from the messages D101 (messages $v_i$) from the edge to be determined, from the integrated value of $\phi(|v_i|)$ determined from the messages D101 (messages $v_i$) from all the edges over one row of the check matrix, and supplies the subtracted value ($\Sigma\phi(|v_i|)$ from i=1 to i=$d_c$−1) as a subtracted value D128 to the LUT 128.

The LUT 128 outputs the 5-bit computation results D129 ($\phi^{-1}(\Sigma\phi(|v_i|))$) such that the computation of $\phi^{-1}(\Sigma\phi(|v_i|))$ in equation (7) is performed on the subtracted value D128 ($\Sigma\phi(|v_i|)$ from i=1 to i=$d_c$−1).

In parallel with the above processing, the EXOR circuit 129 performs a multiplication of sign bits by computing the exclusive OR of a 1-bit value D131 stored in a register 130 and the sign bit D121, and stores the 1-bit multiplication result D130 in the register 130 again. When the sign bits D121 of the messages D101 from all the edges over one row of the check matrix are multiplied, the register 130 is reset.

When the multiplied results D130 ($\Pi sign (v_i)$ from i=1 to $d_c$) such that the sign bits D121 of the messages D101 from all the edges over one row of the check matrix are multiplied are stored, the control signal D106 supplied from the control section 105 changes from "0" to "1".

When the control signal D106 is "1", the selector 131 selects the value stored in the register 130, that is, the value D131 ($\Pi sign (v_i)$ from i=1 to i=$d_c$) such that the sign bits D121 of the messages D101 from all the edges over one row of the check matrix are multiplied, and outputs the value as a 1-bit value D133 to a register 132, whereby it is stored. The register 132 supplies the stored value D132 as a 1-bit value D132 to the selector 131 and the EXOR circuit 134. When the control signal D106 is "0", the selector 131 selects a value D133 supplied from the register 132, and outputs the value to the register 132, whereby it is stored again. That is, until the sign bits D121 of the messages D101 (messages $v_i$) from all the edges over one row of the check matrix are multiplied, the register 132 supplies the value stored at the previous time to the selector 131 and the EXOR circuit 134.

On the other hand, the FIFO memory 133 delays the sign bits D121 until a new value D133 ($\Pi sign (v_i)$ from i=1 to i=$d_c$) is supplied from the register 132 to the EXOR circuit 134, and supplies the result as a 1-bit value D134 to the EXOR circuit 134. The EXOR circuit 134 divides the value D133 by the value D134 by computing the exclusive OR of the value D133 supplied from the register 132 and the value D134 supplied from the FIFO memory 133, and outputs a 1-bit divided result as a divided value D135. That is, the EXOR circuit 134 divides the multiplication value of the sign bits D121 (sign $(|v_i|)$) of the messages D101 from all the edges over one row of the check matrix by the sign bits D121 (sign $(|v_i|)$) of the messages D101 from the edge to be determined, and outputs the divided value ($\Pi sign (|v_i|)$ from i=1 to i=$d_c$−1) as a divided value D135.

In the check node calculator 101, a total of six bits such that the 5-bit computation result D129 output from the LUT 128 is the lower-order 5 bits and the 1-bit divided value D135 output from the EXOR circuit 134 is the highest-order bit is output as a message D102 (message $u_j$).

As described above, in the check node calculator 101, the computation of equation (7) is performed, and a message $u_j$ is determined.

Since the maximum of the row weight of the check matrix of FIG. 8 is 9, that is, since the maximum number of the messages supplied to the check node is 9, the check node calculator 101 has an FIFO memory 127 and the FIFO memory 133 for delaying nine messages ($\phi(|v_i|)$). When a message of the row whose weight is less than 9 is to be calculated, the amount of delay in the FIFO memory 127 and the FIFO memory 133 is reduced to the value of the row weight.

FIG. 11 shows an example of the configuration of the variable node calculator 103 of FIG. 9, for performing variable node calculations one-by-one.

In FIG. 11, the variable node calculator 103 is shown by assuming that each message, together with the sign bit, is quantized into a total of six bits. In FIG. 11, the variable node computation of LDPC codes represented by the check matrix of FIG. 8 is performed. Furthermore, a clock ck is supplied to the variable node calculator 103 of FIG. 11, and the clock ck is supplied to necessary blocks. Each block performs processing in synchronization with the clock ck.

Based on, for example, a 1-bit control signal D107 supplied from the control section 105, the variable node calculator 103 of FIG. 11 performs computations in accordance with equation (1) by using the messages D103 that are read one-by-one from the memory 102 for edges and the received data D104 that is read from the memory 104 for reception.

More specifically, in the variable node calculator 103, 6-bit messages D103 (messages $u_j$) from the check node corresponding to each row of the check matrix is read one-by-one, and the messages D103 are supplied to the adder 151 and the FIFO memory 155. Furthermore, in the variable node calculator 103, 6-bit received data D104 are read one-by-one from the memory 104 for reception, and is supplied to the adder 156. Furthermore, a control signal D107 is supplied to the variable node calculator 103 from the control section 105, and the control signal D107 is supplied to a selector 153.

The adder 151 integrates the messages D103 by adding together the messages D103 (messages $u_j$) and a 9-bit value D151 stored in the register 152, and stores the 9-bit integrated value in the register 152 again. When the message D103 from all the edges over one row of the check matrix are integrated, the register 152 is reset.

When the messages D103 from all the edges over one row of the check matrix are read one-by-one, and the value such that the messages D103 for one column are integrated is stored in the register 152, the control signal D107 supplied from the control section 105 changes from "0" to "1". For example, when the column weight is "5", the control signal D107 is "0" at the first clock up to the fourth clock and is "0" at the fifth clock.

When the control signal D107 is "1", the selector 153 selects the value stored in the register 152, that is, a 9-bit value D151 ($\Sigma u_j$ from j=1 to $d_v$) such that the messages D103 (messages $u_j$) from all the edges over one row of the check matrix are integrated, and outputs the value to the register 154, whereby it is stored. The register 154 supplies the stored value D151 as a 9-bit value D152 to the selector 153 and the adder-subtractor 156. When the control signal D107 is "0", the selector 153 selects a value D152 supplied from the register 154, and outputs the value to a register 154, whereby it is stored again. That is, until the messages D103 (messages $u_j$) from all the edges over one row of the check matrix are integrated, the register 154 supplies the previously integrated value to the selector 153 and the adder-subtractor 156.

On the other hand, the FIFO memory 155 delays the message D103 from the check node until a new value D152 ($\Sigma u_j$ from j=1 to $d_v$) is output from the register 154, and supplies it as a 6-bit value D153 to the adder-subtractor 156. The adder-subtractor 156 subtracts the value D153 supplied from the FIFO memory 155, from the value D152 supplied from the register 154. That is, the adder-subtractor 156 subtracts the message $u_j$ from the edge to be determined, from the integrated value of the messages D103 (messages $u_j$) from all the edges over one row of the check matrix, and determines the subtracted value ($\Sigma u_j$ from j=1 to $d_v$−1). Furthermore, the adder-subtractor 156 adds the received data D104 supplied from the memory 104 for reception to the subtracted value ($\Sigma u_j$ from j=1 to $d_v$,1), and outputs the 6-bit value obtained thereby as a message D105 (message $v_i$).

As described above, in the variable node calculator 103, the computation of equation (1) is performed, and the message $v_i$ is determined.

Since the maximum of the column weight of the check matrix of FIG. 8 is 5, that is, since the maximum number of the messages supplied to the variable node is 5, the variable node calculator 103 has an FIFO memory 155 for delaying five messages ($u_j$). When a message of a column whose weight is less than 5 is to be calculated, the amount of delay in the FIFO memory 155 is reduced to the value of the column weight.

In the decoding apparatus of FIG. 9, a control signal is supplied from the control section 105 in accordance with the weight of the check matrix. According to the decoding apparatus of FIG. 9, if only the capacities of the memories for edges 100 and 102 and the FIFO memories 127, 133, and 155 of the check node calculator 101 and the variable node calculator 103 are sufficient, LDPC codes of various check matrices can be decoded by changing only the control signal.

Although not shown, in the decoding apparatus of FIG. 9, at the final stage of the decoding, instead of the variable node calculation of equation (1), the computation of equation (5) is performed, and the computation result is output as the final decoded result.

When LDPC codes are decoded by repeatedly using the decoding apparatus of FIG. 9, the check node computation and the variable node computation are alternately performed. That is, in the decoding apparatus of FIG. 9, a variable node computation is performed by the variable node calculator 103 by using the result of the check node computation by the check node calculator 101, and a check node computation is performed by the check node calculator 101 by using the result of the variable node computation by the variable node calculator 103.

Therefore, for performing one decoding using the check matrix having 269 edges of FIG. 8, 269×2=538 clocks are required. For example, in order to perform 50 iterative decodings, 538×50=26900 clock operations are necessary while one frame in which 90 codes (received data) are set as one frame, which is the code length, is received, and thus, a high-speed operation approximately 300 (≅26900/90) times as high as the receiving frequency becomes necessary. If the receiving frequency is assumed to be several tens of MHz, operation at a speed of GHz or higher is required.

Furthermore, in a case where, for example, 50 decoding apparatuses of FIG. 9 are concatenated to decode LDPC codes, a plurality of variable node calculations and check node calculations can be performed simultaneously. For example, while a variable node computation of the first frame is being performed, a check node computation of the second frame is performed, and a variable node computation of the third frame is performed. In this case, while 90 codes are received, since 269 edges need to be calculated, the decoding apparatus needs to operate at a frequency approximately 3 (≅269/90) times as high as the receiving frequency, and thus realization is sufficiently possible. However, in this case, the circuit scale becomes, in simple terms, 50 times as large as the decoding apparatus of FIG. 9.

Next, a description is given of the implementation method of the decoding apparatus in a case where decoding is performed by simultaneously performing computations of all the nodes (full parallel decoding).

This implementation method is described in, for example, C. Howland and A. Blanksby, "Parallel Decoding Architectures for Low Density Parity Check Codes", Symposium on Circuits and Systems, 2001.

FIGS. 12A to 12C show the configuration of examples of the decoding apparatus for decoding the codes (a coding rate of ⅔, and a code length of 90) represented by the check matrix of FIG. 8. FIG. 12A shows the overall configuration of the decoding apparatus. FIG. 12B shows the detailed configuration of the upper portion in the figure surrounded by the dotted line B, of the decoding apparatus of FIG. 12A. FIG. 12C shows the detailed configuration of the lower portion in the figure surrounded by the dotted line C, of the decoding apparatus of FIG. 12A.

The decoding apparatus of FIGS. 12A to 12C includes one memory 205 for reception, two edge interchange devices 200 and 203, two memories 202 and 206 for edges, a check node calculator 201 made up of 30 check node calculators $201_1$ to $201_{30}$, and a variable node calculator 204 made up of 90 variable node calculators $204_1$ to $204_{90}$.

In the decoding apparatus of FIGS. 12A to 12C, all the message data corresponding to 269 edges is read simultaneously from the memory 202 or 206 for edges, and by using the message data, new message data corresponding to the 269 edges is computed. Furthermore, all the new message data determined as a result of the computation is simultaneously stored in the memory 206 or 202 for edges at a subsequent stage. By repeatedly using the decoding apparatus of FIGS. 12A to 12C, iterative decoding is realized. Each section will now be described below in detail.

The memory 206 for edges simultaneously stores all the messages $D206_1$ to $D206_{90}$ from the variable node calculators $204_1$ to $204_{90}$ at a previous stage, reads the messages $D206_1$ to $D206_{90}$ as messages $D207_1$ to $D207_{90}$ at the next clock (the timing of the next clock), and supplies them as messages D200 ($D200_1$ to $D200_{90}$) to the edge interchange device 200 at the subsequent stage. The edge interchange device 200 rearranges (interchanges) the order of the messages $D200_1$ to $D200_{90}$ supplied from the memory 206 for edges in accordance with the check matrix of FIG. 8, and supplies them as messages $D201_1$ to $D201_{30}$ to the check node calculators $201_1$ to $201_{30}$.

The check node calculators $201_1$ to $201_{30}$ perform a computation in accordance with equation (7) by using the messages $D201_1$ to $D201_{30}$ supplied from the edge interchange device 200, and supplies the messages $D202_1$ to $D202_{30}$ obtained as a result of the computation to the memory 202 for edges.

The memory 202 for edges simultaneously stores all the messages $D202_1$ to $D202_{30}$ supplied from the check node calculators $201_1$ to $201_{30}$ at the previous stage, and at the next time, supplies all the messages $D202_1$ to $D202_{30}$, as messages $D203_1$ to $D203_{30}$, to the edge interchange device 203 at the subsequent stage.

The edge interchange device 203 rearranges the order of the messages $D203_1$ to $D203_{30}$ supplied from the memory 202 for edges in accordance with the check matrix of FIG. 8, and supplies them as messages $D204_1$ to $D204_{90}$ to the variable node calculators $204_1$ to $204_{90}$.

The variable node calculators $204_1$ to $204_{90}$ perform a computation in accordance with equation (1) by using the messages $D204_1$ to $D204_{90}$ supplied from the edge interchange device 203 and the received data $D205_1$ to $D205_{90}$ supplied from the memory 205 for reception, and supplies messages $D206_1$ to $D206_{90}$ obtained as a result of the computation to the memory 206 for edges at the subsequent stage.

FIG. 13 shows an example of the configuration of a check node calculator $201_m$ (m=1, 2, ..., 30) of FIGS. 12A to 12C for simultaneously performing check node calculations.

In the check node calculator $201_m$ of FIG. 13, similarly to the check node calculator 101 of FIG. 10, the check node computation of equation (7) is performed, and the check node calculations are simultaneously performed for all the edges.

More specifically, in the check node calculator $201_m$ of FIG. 13, all the messages $D221_1$ to $D221_9$ ($v_i$) from the variable node corresponding to each row of the check matrix of FIG. 8, which are supplied from the edge interchange device 200, are read simultaneously, and the absolute values $D222_1$ to $D222_9$ (|$v_i$|) which are the respective lower-order 5 bits thereof, are supplied to the LUTs $221_1$ to $221_9$, respectively. 1-bit sign bits $D223_1$ to $D223_9$, which are the highest-order bits of the message $D221_1$ to $D221_9$($v_i$), are supplied to the EXOR circuits $226_1$ to $226_9$, respectively, and are also supplied to the EXOR circuit 225.

The LUTs $221_1$ to $221_9$ read 5-bit computation results $D224_1$ to $D224_9$ ($\phi$(|$v_i$|)) such that the computation of $\phi$(|$v_i$|) in equation (7) is performed, respectively, on the absolute values $D222_1$ to $D222_9$ (|$v_i$|), respectively, and supplies them to the respective subtractors $223_1$ to $223_9$. The LUTs $221_1$ to $221_9$ supply the computation results $D224_1$ to $D224_9$ ($\phi$(|$v_i$|)) to an adder 222.

The adder 222 computes the total sum of the values of the computation results $D224_1$ to $D224_9$ ($\phi$(|$v_i$|)) (the total sum of the computation results for one row), and supplies the 9-bit computation results $D225$ ($\Sigma\phi$(|$v_i$|) from i=1 to 9) to the subtractors $223_1$ to $223_9$. The subtractors $223_1$ to $223_9$ subtract the computation results $D224_1$ to $D224_9$ ($\phi$(|$v_i$|)) from the computation results $D225$, respectively, and supply the 5-bit subtracted value $D227_1$ to $D227_9$ to the LUTs $224_1$ to $224_9$. That is, the subtractors $223_1$ to $223_9$ subtract $\phi$(|$v_i$|) determined from the message $v_i$ from the edge to be determined, from the integrated value of $\phi$(|$v_i$|) determined from the message $v_i$ from all the edges, and supply the subtracted values $D227_1$ to $D227_9$ ($\Sigma\phi$(|$v_i$|) from i=1 to 8) to the LUTs $224_1$ to $224_9$, respectively. The LUTs $224_1$ to $224_9$ read the 5-bit computation results $D228_1$ to $D228_9$ such that the computation of $\phi^{-1}$ ($\Sigma\phi$(|$v_i$|)) in equation (7) is performed on the subtracted values $D227_1$ to $D227_9$, and outputs them.

On the other hand, the EXOR circuit 225 performs a multiplication of the sign bits $D223_1$ to $D223_9$ by computing the exclusive OR of all the sign bits $D223_1$ to $D223_9$, and supplies a 1-bit multiplication value $D226$ (multiplication value of the sign bits for one row ($\Pi$sign ($v_i$) from i=1 to 9)) to the respective EXOR circuit $226_1$ to $226_9$. By computing the exclusive OR of the multiplication value $D226$ and the sign bits $D223_1$ to $D223_9$, respectively, the EXOR circuits $226_1$ to $226_9$ determine 1-bit divided values $D229_1$ to $D229_9$ ($\Pi$sign ($v_i$) from i=1 to 8) such that the multiplication value $D226$ is divided by the sign bits $D223_1$ to $D223_9$, respectively, and output them.

In the check node calculator $201_m$, a total of six bits such that the 5-bit computation results $D228_1$ to $D228_9$ output from the LUTs $224_1$ to $224_9$ are each made to be the five lower-order bits and the divided values $D229_1$ to $D229_9$ output from the EXOR circuits $226_1$ to $226_9$ are each made to be the highest-order bit is output as messages $D230_1$ to $D230_9$ obtained as a result of the check node computation.

In the manner described above, in the check node calculator $201_m$, the computation of equation (7) is performed, and the message $u_j$ is determined.

In FIG. 13, the check node calculator $201_m$ is shown by assuming that each message, together with the sign bit, is quantized to a total of six bits. The circuit of FIG. 13 corresponds to one check node. For the check matrix to be processed here in FIG. 8, since check nodes of 30 rows, which is the number of the rows thereof, exist, the decoding apparatus of FIGS. 12A to 12C has 30 check node calculators $201_m$ shown in FIG. 13.

In the check node calculator $201_m$ of FIG. 13, nine messages can be calculated simultaneously. For the row weight of the check matrix to be processed here in FIG. 8, the weight of the first row is 8, and the weight of the second row is 9, that is, there is one case in which the number of messages supplied to the check node is 8 and there are nine cases in which the number of messages is 9. Therefore, the check node calculator $201_1$ has a circuit configuration capable of simultaneously calculating eight messages similarly to the circuit of FIG. 13, and the remaining check node calculators $201_2$ to $201_{30}$ are configured in the same way as for the circuit of FIG. 13.

FIG. 14 shows an example of the configuration of a variable node calculator $204_p$ (p=1, 2, ..., 90) of FIGS. 12A to 12C for simultaneously performing variable node computations.

In the variable node calculators $204_p$ of FIG. 14, similarly to the variable node calculator 103 of FIG. 11, the variable node computations of equation (1) are performed, and the variable node computations are simultaneously performed for all the edges.

More specifically, in the variable node calculators $204_p$ of FIG. 14, all the 6-bit messages $D251_1$ to $D251_5$ (messages $u_j$) from the check node corresponding to each row of the check matrix, which are supplied from the edge interchange device 203, are read simultaneously, and these messages are supplied to the respective adders $252_1$ to $252_5$ and are also supplied to the adder 251. Furthermore, received data $D271$ is supplied to the variable node calculator $204_p$ from the memory 205 for reception and the received data $D271$ is supplied to the adders-subtractors $252_1$ to $252_5$.

The adder 251 integrates all the messages $D251_1$ to $D251_5$ (messages $u_j$), and supplies a 9-bit integrated value $D252$ (the total sum value of messages for one column ($\Sigma u_j$ from j=1 to 5)) to the adders-subtractors $252_1$ to $252_5$. The adders-subtractors $252_1$ to $252_5$ subtract the messages $D251_1$ to $D251_5$ (messages $u_j$) from the added value $D252$, respectively. That is, the adders-subtractors $252_1$ to $252_5$ subtract the messages $D251_1$ to $D251_5$ (messages $u_j$) from the edge to be determined, from the integrated value $D252$ of the messages $u_j$ from all the edges, respectively, and determine the subtracted value ($\Sigma u_j$ from j=1 to 4).

Furthermore, the adders-subtractors $252_1$ to $252_5$ add the received data $D271$ ($u_{0i}$) to the subtracted value ($\Sigma u_j$ from j=1 to 4), and output 6-bit added values $D253_1$ to $D253_5$ as the results of the variable node computations.

In the manner described above, in the variable node calculator $204_p$, the computation of equation (1) is performed, and the message $v_i$ is determined.

In FIG. 14, the variable node calculators $204_p$ is shown by assuming that each message, together with the sign bit, is quantized to six bits. The circuit of FIG. 14 corresponds to one variable node. For the check matrix to be processed here in FIG. 8, since variable nodes of 90 columns, which is the number of the columns thereof, exist, the decoding apparatus of FIGS. 12A to 12C has 90 circuits shown in FIG. 14.

In the variable node calculators $204_p$ of FIG. 14, it is possible to simultaneously calculate five messages. The check matrix to be processed here in FIG. 8 has 15, 45, 29, and 1 columns having weights of 5, 3, 2, and 1, respectively. Therefore, 15 variable node calculators out of the variable node calculators $204_1$ to $204_{90}$ have the same circuit configuration as that of the circuit of FIG. 14. The remaining 45, 29, and 1 variable node calculators have the circuit configuration capable of simultaneously calculating 3, 2, and 1 messages similarly to the circuit of FIG. 14.

Although not shown, also, in the decoding apparatus of FIGS. 12A to 12C, similarly to the case of FIG. 9, at the final stage of the decoding, instead of the variable node calculation of equation (1), the computation of equation (5) is performed, and the computation result is output as the final decoded result.

According to the decoding apparatus of FIGS. 12A to 12C, it is possible to simultaneously calculate all the messages corresponding to 269 edges at one clock.

When decoding is performed by repeatedly using the decoding apparatus of FIGS. 12A to 12C, the check node computation and the variable node computation are alternately performed, and one decoding can be performed at two clocks. Therefore, for example, in order to perform 50 decodings, the decoding apparatus needs to operate at 2×50=100 clocks while received data in which codes having a code length of 90 are one frame is received, and thus, approximately the same operating frequency as the receiving frequency may be used. In general, since the code length of the LDPC codes is as great as several thousands to several tens of thousands, if the decoding apparatus of FIGS. 12A to 12C is used, the number of decodings can be greatly increased, and the improvement in the error correction performance can be expected.

However, in the decoding apparatus of FIGS. 12A to 12C, since computations of messages corresponding to all the edges of a Tanner graph are performed in parallel, the circuit scale increases in proportion to the code length. When the decoding apparatus of FIGS. 12A to 12C is configured as an apparatus for performing the decoding of LDPC codes having a particular check matrix, of a particular code length and a particular coding rate, it is difficult for the decoding apparatus to perform the decoding of LDPC codes having another check matrix, of another code length and another coding rate. That is, unlike the decoding apparatus of FIG. 9, it is difficult for the decoding apparatus of FIGS. 12A to 12C to deal with the decoding of various codes even if the control signal is changed only, and the dependence on codes is high.

In addition to the decoding apparatus of FIG. 9 and FIGS. 12A to 12C, the implementation method for simultaneously calculating messages in units of four messages rather than one message or all messages is described in, for example, E. Yeo, P. Pakzad, B. Nikolic and V. Anantharam, "VLSI Architectures for Iterative Decoders in Magnetic Recording Channels", IEEE Transactions on Magnetics, Vol. 37, No. 2, March 2001. In this case, there are problems in that, generally, it is not easy to avoid simultaneous read-out from or simultaneous writing to different addresses of the memory, and memory access control is difficult.

Furthermore, a method of implementation by approximating the sum product algorithm has also been proposed. However, in this method, the deterioration of performance is caused to occur. For implementing the sum product algorithm as hardware, there are, as described above, a method in which computations of messages corresponding to the edges (a check node computation and a bit node computation) are serially performed one-by-one, a method in which all the computations of messages are performed in parallel (full parallel), and a method in which the computations of messages are performed in units of several computations in parallel (parallel).

However, in the method in which computations of messages corresponding to the edges are performed one-by-one, a high operating frequency is required. Accordingly, as a method for increasing throughput, a method for arranging the apparatus in a pipeline structure is known. In this case, the circuit scale, in particular, (the capacity of) the memory, increases.

In the method in which all the computations of messages are performed in parallel, the circuit scale for logic increases, and the dependence on codes is high.

In the method in which the computations of messages are performed in units of several computations in parallel, control of memory access is difficult.

DISCLOSURE OF INVENTION

The present invention has been made in view of such circumstances. An object of the present invention is to suppress the operating frequency to a sufficiently realizable range while suppressing the circuit scale for both logic and memory, and to be capable of easily controlling memory access.

The decoding apparatus of the present invention, when using as a sub-matrix, a (P×P) unit matrix, a quasi-unit matrix in which one or more 1s, which are elements of the unit matrix, are substituted with 0, a shift matrix in which the unit matrix or the quasi-unit matrix is cyclically shifted, a sum matrix, which is the sum of two or more of the unit matrix, the quasi-unit matrix, and the shift matrix, or a (P×P) 0-matrix, a check matrix of the LDPC codes is represented by a combination of a plurality of the sub-matrices, includes: first computation means for simultaneously performing p check node computations for decoding the LDPC codes; and second computation means for simultaneously performing p variable node computations for decoding the LDPC codes.

The first computation means may have p check node calculators for performing check node computations, and the second computation means may have p variable node calculators for performing variable node computations.

The decoding apparatus may further include message storage means for simultaneously reading and writing message data corresponding to p edges, which is obtained as a result of the p check node computations or the p variable node computations.

The message storage means may store message data corresponding to the edges, which is read during the check node computation in such a manner that 1s of the check matrix are packed closer in the row direction.

The message storage means may store message data corresponding to edges, which is read during the variable node computations in such a manner that 1s of the check matrix are packed closer in the column direction.

The message storage means may store, at the same address, messages corresponding to p edges belonging to a unit matrix whose weight is 1, a quasi-unit matrix, or a shift matrix when the sub-matrices whose weight is 2 or more from among the sub-matrices representing the check matrix are represented in the form of the sum of the unit matrix whose weight is 1, the quasi-unit matrix, or the shift matrix.

The message storage means may include number-of-rows/p FIFOs and number-of-columns/p FIFOs, and the number-of-rows/p FIFOs and the number-of-columns/p FIFOs each have a number of words corresponding to the row weight and the column weight of the check matrix, respectively.

The message storage means may include a RAM (Random Access Memory), and the RAM may store the message data in the read-out sequence in such a manner as to be packed closer and reads the message data in the storage position sequence.

The decoding apparatus may further include received information storage means for storing received information of LDPC codes and for simultaneously reading p pieces of the received information.

The received information storage means may store the received information in such a manner that the received information can be read in the sequence necessary for the variable node computation.

The decoding apparatus may further include rearranging means for rearranging messages obtained as a result of the p check node computations or the p variable node computations.

The rearranging means may include a barrel shifter.

The first computation means and the second computation means may determine messages corresponding to p edges.

The first computation means may perform some of the p check node computations and the p variable node computations, and the second computation means may perform some of the others of the p variable node computations.

The first computation means may include p calculators for performing some of the p check node computations and the p variable node computations, and the second computation means may include p calculators for performing some of the others of the p variable node computations.

The decoding apparatus may further include first decoding in-progress result storage means for simultaneously reading and writing first decoding in-progress results corresponding to p edges, which are obtained by the first computation means by performing some of the p check node computations and the p variable node computations.

The first decoding in-progress result storage means may store the first decoding in-progress results corresponding to the edges, which are read when some of the others of the p variable node computations are performed, in such a manner that 1s of the check matrix are packed closer in the row direction.

The first decoding in-progress result storage means may be two single-port RAMs (Random Access Memories).

The two single-port RAMs may alternately store the first decoding in-progress results in units of p of the first decoding in-progress results.

The two single-port RAMs (Random Access Memories) each may read the first decoding in-progress results stored at the same address.

The first decoding in-progress result storage means may store, at the same address, the first decoding in-progress results corresponding to p edges belonging to a unit matrix whose weight is 1, a quasi-unit matrix, or a shift matrix when the sub-matrices whose weight is 2 or more from among the sub-matrices representing the check matrix are represented in the form of the sum of the unit matrix whose weight is 1, the quasi-unit matrix, or the shift matrix.

The decoding apparatus may further include second decoding in-progress result storage means for simultaneously reading and writing the second decoding in-progress results corresponding to p edges, which are obtained by the second computation means by performing some of the others of the p variable node computations.

The decoding apparatus may further include received information storage means for storing received information of LDPC codes and simultaneously reading p pieces of the received information.

The received information storage means may store the received information in such a manner that the received information can be read in the sequence necessary for some of the others of the p variable node computations.

The decoding apparatus may further include rearranging means for rearranging first decoding in-progress results obtained by the first computation means by performing some of the p check node computations and the p variable node computations, or second decoding in-progress results obtained by the second computation means by performing some of the others of the p variable node computations.

The rearranging means may include a barrel shifter.

The first computation means may perform some of the p check node computations, and the second computation means may perform some of the others of the p check node computations, and the p variable node computations.

The first computation means may include p calculators for performing some of the p check node computations, and the second computation means may include p calculators for performing some of the others of the p check node computations, and the p variable node computations.

The decoding apparatus may further include first decoding in-progress result storage means for simultaneously reading and writing first decoding in-progress results corresponding to p edges, which are obtained by the first computation means by performing some of the p check node computations.

The decoding apparatus may further include second decoding in-progress result storage means for simultaneously reading and writing second decoding in-progress results corresponding to p edges, which are obtained by the second computation means by performing some of the others of the p check node computations, and the p variable node computations.

The second decoding in-progress result storage means may store the second decoding in-progress results corresponding to edges, which are read when some of the others of the p check node computations, and the p variable node computations are performed, in such a manner that 1s of the check matrix are packed closer in the column direction.

The second decoding in-progress result storage means may be two single-port RAMs (Random Access Memories).

The two single-port RAMs may alternately store the second decoding in-progress results in units of p of the second decoding in-progress results.

The two single-port RAMs (Random Access Memories) each may read the second decoding in-progress results stored at the same address.

The second decoding in-progress result storage means may store, at the same address, the second decoding in-progress results corresponding to p edges belonging to a unit matrix whose weight is 1, a quasi-unit matrix, or a shift matrix when the sub-matrices whose weight is 2 or more from among the sub-matrices representing the check matrix are represented in the form of the sum of the unit matrix whose weight is 1, the quasi-unit matrix, or the shift matrix.

The decoding apparatus may further include received information storage means for storing received information of LDPC codes and for simultaneously reading p pieces of the received information.

In the decoding apparatus according to claim 36, the received information storage means may store the received information in such a manner that the received information can be read in the sequence necessary for some of the others of the p check node computations, and the p variable node computations.

The decoding apparatus may further include rearranging means for rearranging first decoding in-progress results obtained by the first computation means by performing some of the p check node computations, or second decoding in-progress results obtained by the second computation means by performing some of the others of the p check node computations, and the p variable node computations.

The rearranging means may include a barrel shifter.

The decoding method of the present invention, when using as a sub-matrix, a (P×P) unit matrix, a quasi-unit matrix in which one or more 1s, which are elements of the unit matrix, are substituted with 0, a shift matrix in which the unit matrix or the quasi-unit matrix is cyclically shifted, a sum matrix, which is the sum of two or more of the unit matrix, the quasi-unit matrix, and the shift matrix, or a (P×P) 0-matrix, a check matrix of LDPC codes is represented by a combination of a plurality of the sub-matrices, includes a first computation step of simultaneously performing p check node computations for decoding the LDPC codes; and a second computation step of simultaneously performing p variable node computations for decoding the LDPC codes.

The program of the present invention includes a first computation step of simultaneously performing p check node computations for decoding LDPC codes; and a second computation step of simultaneously performing p variable node computations for decoding the LDPC codes.

In the present invention, when using as a sub-matrix, a (P×P) unit matrix, a quasi-unit matrix in which one or more 1s, which are elements of the unit matrix, are substituted with 0, a shift matrix in which the unit matrix or the quasi-unit matrix is cyclically shifted, a sum matrix, which is the sum of two or more of the unit matrix, the quasi-unit matrix, and the shift matrix, or a (P×P) 0-matrix, a check matrix of the LDPC codes is represented by a combination of a plurality of the sub-matrices, p check node computations for decoding the LDPC codes are simultaneously performed, and p variable node computations for decoding the LDPC codes are simultaneously performed.

BRIEF DESCRIPTION OF THE DRAWINGS

FIG. 1 illustrates a check matrix H of LDPC codes.

FIG. 2 is a flowchart illustrating a procedure for decoding LDPC codes.

FIG. 3 illustrates the flow of messages.

FIG. 4 shows an example of a check matrix of LDPC codes.

FIG. 5 shows a Tanner graph of the check matrix.

FIG. 6 shows a variable node.

FIG. 7 shows a check node.

FIG. 8 shows an example of a check matrix of LDPC codes.

FIG. 9 is a block diagram showing an example of the configuration of an LDPC code decoding apparatus for performing node computations one-by-one.

FIG. 10 is a block diagram showing an example of the configuration of a check node calculator for calculating messages one-by-one.

FIG. 11 is a block diagram showing an example of the configuration of a variable node calculator for calculating messages one-by-one.

FIG. 12A is a block diagram showing an example of the configuration of an LDPC code decoding apparatus for simultaneously performing all node computations.

FIG. 12B is a block diagram showing an example of the configuration of the LDPC code decoding apparatus for simultaneously performing all node computations.

FIG. 12C is a block diagram showing an example of the configuration of the LDPC code decoding apparatus for simultaneously performing all node computations.

FIG. 13 is a block diagram showing an example of the configuration of a check node calculator for simultaneously calculating messages.

FIG. 14 is a block diagram showing an example of the configuration of a variable node calculator for simultaneously calculating messages.

BEST MODE FOR CARRYING OUT THE INVENTION

Specific embodiments to which the present invention is applied will be described below in detail with reference to the drawings.

Figure 15:
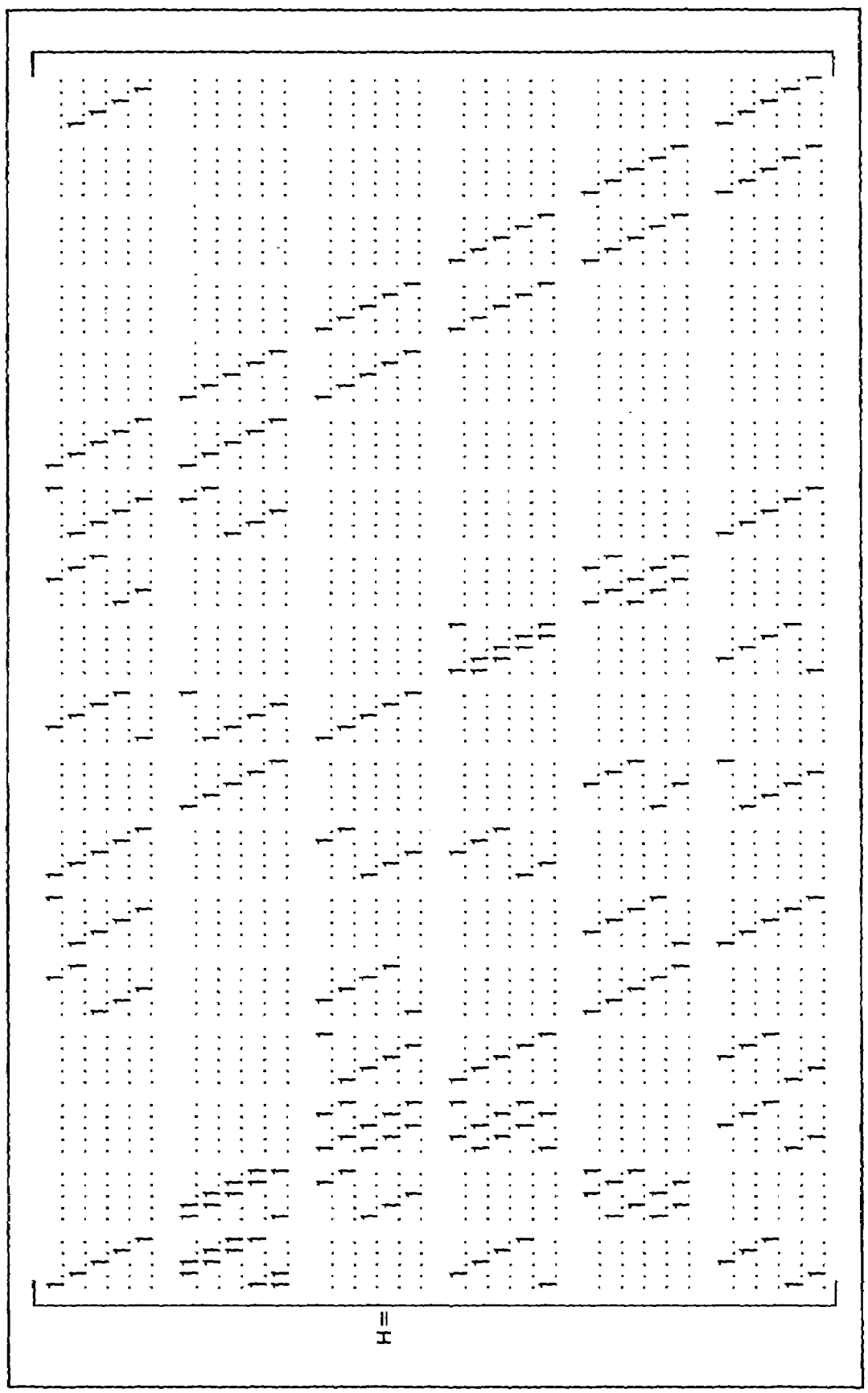
FIG. 15 shows a matrix, which is divided into 5×5 units.

FIG. 15 shows an example of a 30×9 check matrix, which are divided in units of 5×5 matrices. The check matrix of FIG. 15 is the same as the check matrix shown in FIG. 8.

In FIG. 15, the check matrix is represented by a combination of a 5×5 unit matrix, a matrix in which one or more 1s, which are elements of the unit matrix, are substituted with 0 (hereinafter referred to as a "quasi-unit matrix" where appropriate), a matrix in which the unit matrix or the quasi-unit matrix is cyclically shifted (hereinafter referred to as a "shift matrix" where appropriate), a sum of two or more (plural) of the unit matrix, the quasi-unit matrix, and the shift matrix (hereinafter referred to as a "sum matrix" where appropriate), and a 5×5 0-matrix. The LDPC codes represented by the check matrix of FIG. 15 have a coding rate of ⅔ and a code length of 9.

It may be said that the check matrix of FIG. 15 is formed of a 5×5 matrix, a quasi-unit matrix, a shift matrix, a sum matrix, and a 0-matrix. Therefore, these 5×5 matrices, which form the check matrix, will be hereinafter referred to as "sub-matrices" where appropriate.

Figure 16A:
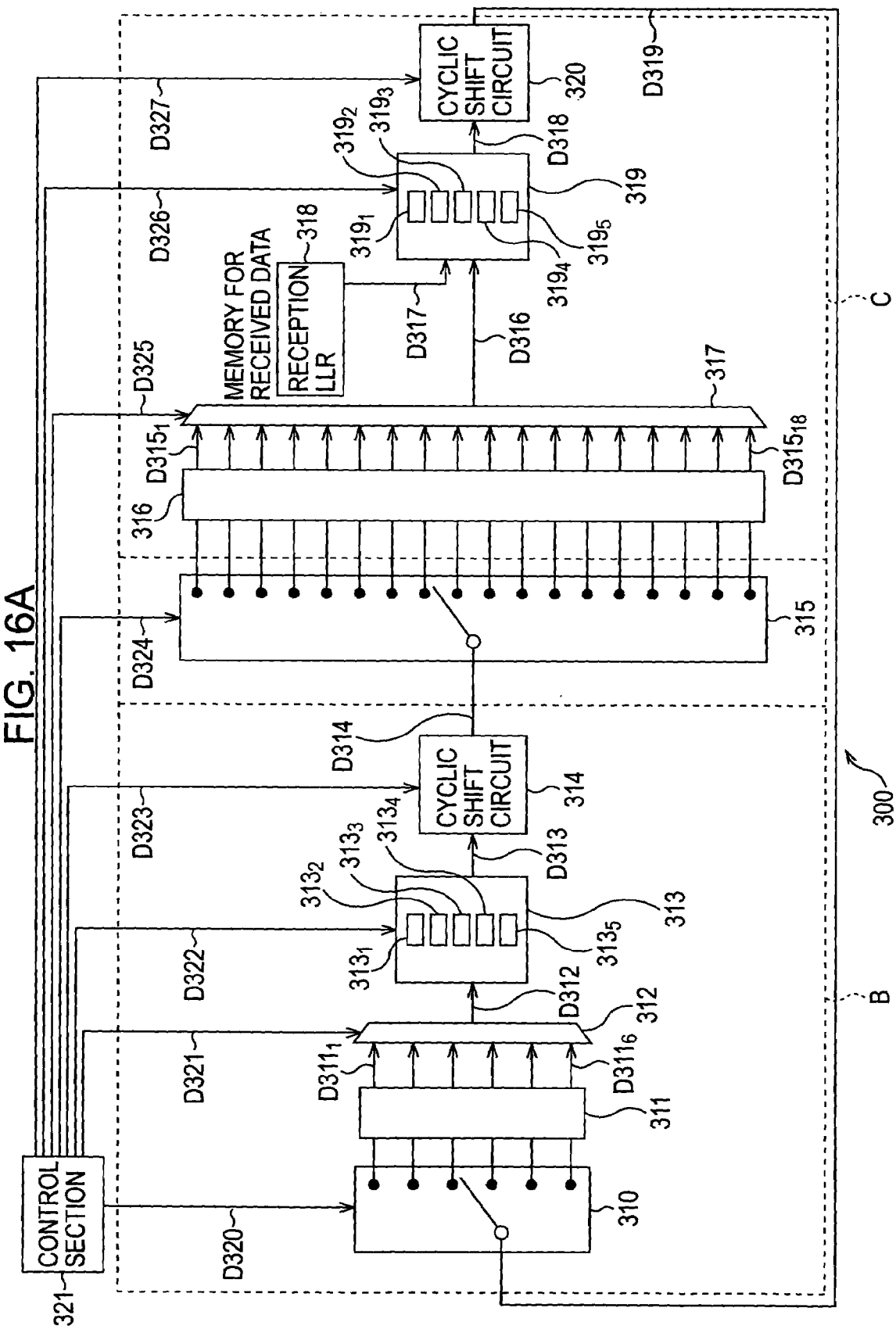
FIG. 16A is a block diagram showing an example of the configuration of an embodiment of a decoding apparatus to which the present invention is applied.
Figure 16B:
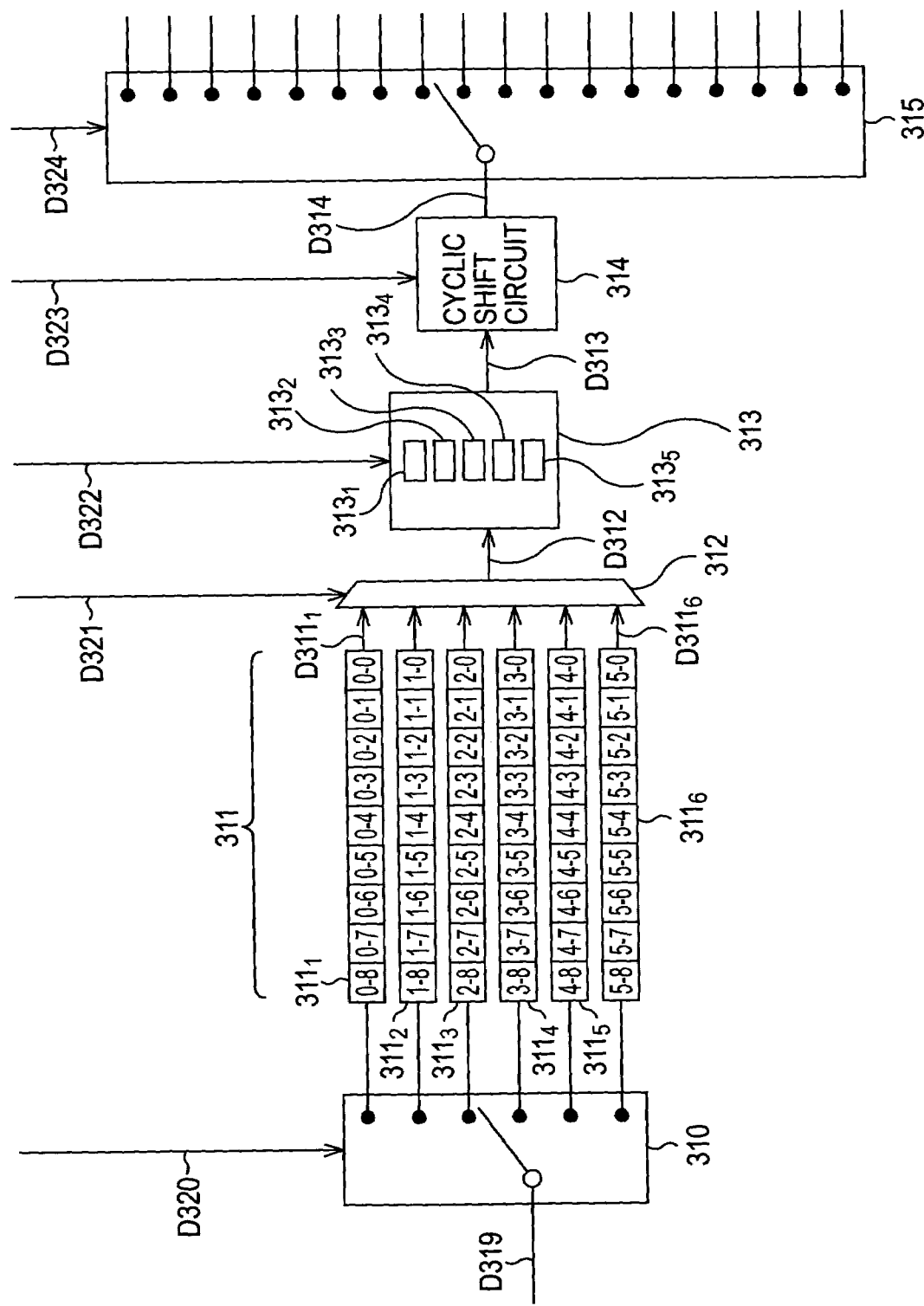
FIG. 16B is a block diagram showing an example of the configuration of the embodiment of the decoding apparatus to which the present invention is applied.
Figure 16C:
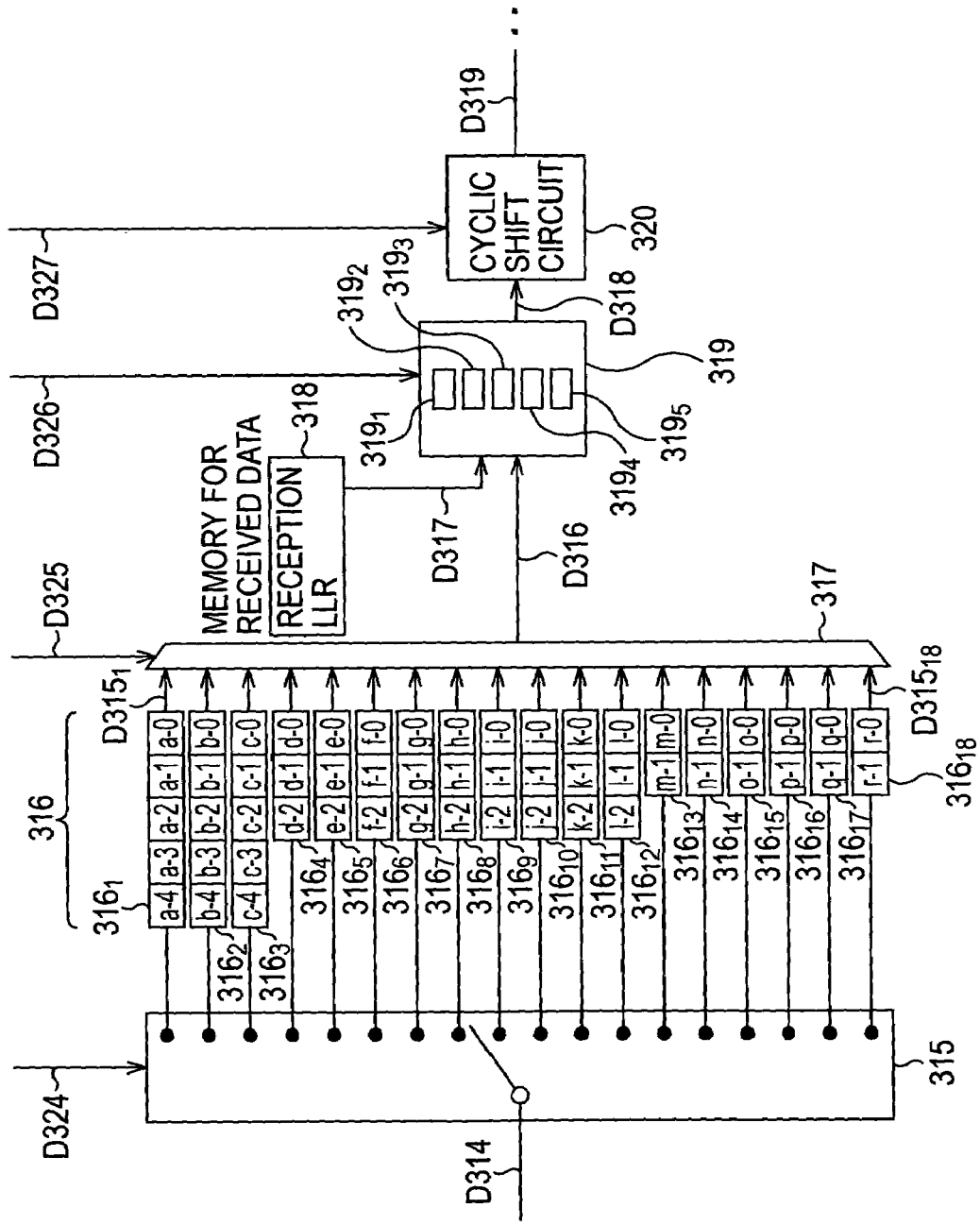
FIG. 16C is a block diagram showing an example of the configuration of the embodiment of the decoding apparatus to which the present invention is applied.

FIGS. 16A to 16C show an example of the configuration of an embodiment of a decoding apparatus for decoding LDPC codes represented by the check matrix of FIG. 15. FIGS. 16A to 16C are block diagrams showing an example of the configuration of an embodiment of such a decoding apparatus. FIG. 16A shows the overall configuration of the decoding apparatus. FIG. 16B shows the detailed configuration of the left portion in the figure surrounded by the dotted line B, of the decoding apparatus of FIG. 16A. FIG. 16C shows the detailed configuration of the right portion in the FIG. 5 surrounded by the dotted line C, of the decoding apparatus of FIG. 16A.

A decoding apparatus 300 of FIGS. 16A to 16C includes switches 310 and 315, an edge data storage memory 311 made up of six FIFOs $311_1$ to $311_6$, a selector 312, a check node calculator 313 made up of five check node calculators $313_1$ to $313_5$, two cyclic shift circuit 314 and 320, an edge data storage memory 316 made up of 18 FIFOs $316_1$ to $316_{18}$, a selector 317, a received data memory 318 for storing received information, a variable node calculator 319, and a control section 321.

Before describing in detail each section of the decoding apparatus 300, the method of storing data in the edge data storage memories 311 and 316 will be described first.

The edge data storage memory 311 includes six FIFOs $311_1$ to $311_6$, the number being such that 30, the number of rows, of the check matrix is divided by 5, the number of rows. The FIFO $311_y$ (y=1, 2, ..., 6) is formed in such a manner that messages corresponding to five edges, which is the number of the rows and the columns of the sub-matrix, can be read or written simultaneously. The length (the number of stages) thereof is 9, which is the maximum number of 1s (Hamming weight) in the row direction of the check matrix.

In the FIFO $311_1$, the data corresponding to the positions of 1s from the first row up to the fifth row of the check matrix of FIG. 15 is stored in such a manner that 1s are packed closer (in a manner in which 0s are ignored) in the horizontal direction (in the column direction) for each row. That is, if the j-th row and the i-th column is denoted as (j, i), in the first element (the first stage) of the FIFO $311_1$, data corresponding to the positions of 1s of the 5×5 unit matrix from (1, 1) to (5, 5) of the check matrix is stored. In the second element, the data corresponding to the positions of 1s of the shift matrix (shift matrix in which the 5×5 unit matrix is cyclically shifted by three to the right) from (1, 21) to (5, 25) of the check matrix, which is the sub-matrix of the check matrix, is stored. Also, in the third to eighth elements, similarly, data is stored in such a manner as to correspond to the sub-matrix of the check matrix. In the nine element, data corresponding to the positions of 1s of the shift matrix (the shift matrix in which 1s of the first row within the 5×5 unit matrix are substituted with 0, and the unit matrix is cyclically shifted by one to the left) from (1, 86) to (5, 90) of the check matrix is stored. Here, in the shift matrix from (1, 86) to (5, 90) of the check matrix, since there are no is in the first row, the number of elements becomes 8 only for the first row of the FIFO $311_1$, and the number of elements becomes 9 for the remaining rows.

In the FIFO $311_2$, the data corresponding to the positions of 1s from the sixth row up to the tenth row of the check matrix of FIG. 15 is stored. That is, in the first element of the FIFO $311_2$, data corresponding to the positions of 1s of the first shift matrix forming the sum matrix from (6, 1) to (10, 5) of the check matrix (the sum matrix which is the sum of a first shift matrix in which the 5×5 unit matrix is cyclically shifted by one to the right and a second shift matrix in which the 5×5 unit matrix is cyclically shifted by two to the right) is stored. In the second element, data corresponding to the positions of 1s of the second shift matrix forming the sum matrix from (6, 1) to (10, 5) of the check matrix is stored.

More specifically, for the sub-matrix whose weight is 2 or more, the data (the message corresponding to the edges belonging to the unit matrix, the sum matrix, or the shift matrix) corresponding to the positions of 1s of the unit matrix whose weight is 1, the quasi-unit matrix, or the shift matrix, when the sub-matrix is represented in the form of the sum of two or more of the (P×P) unit matrix whose weight is 1, the quasi-unit matrix in which one or more 1s, which are elements of the unit matrix, are substituted with 0, and the shift matrix in which the unit matrix or the quasi-unit matrix is cyclically shifted, is stored at the same address (the same FIFOs among the FIFOs $311_1$ to $311_6$).

Hereafter, for the third to the ninth elements, the data is stored in such a manner as to correspond to the check matrix. The number of the elements of the FIFO $311_2$ is 9 for all the rows.

For the FIFOs $311_3$ to $311_6$, similarly, data is stored in such a manner as to correspond to the check matrix, and the length of each of the FIFOs $311_3$ to $311_6$ is 9.

The memory 316 for storing edge data is formed of 18 FIFOs $316_1$ to $316_{18}$, the number being such that 90, the number of rows of the check matrix, is divided by 5, the number of the rows of the sub-matrix. The FIFO $316_x$ (x=1, 2, ..., 18) is formed in such a manner that messages corresponding to five edges, the number being the number of the rows and the number of the columns of the sub-matrix, can be read or written simultaneously.

In the FIFO $316_1$, data corresponding to the positions of 1s from the first column up to the fifth column of the check matrix of FIG. 15 is stored in such a manner as to be packed closer in the vertical direction (in the row direction) for each column (in a manner in which 0s are ignored). That is, in the first element (the first stage) of the FIFO $316_1$, data corresponding to the positions of 1s of the 5×5 unit matrix from (1, 1) to (5, 5) of the check matrix is stored. In the second element, data corresponding to the positions of 1s of the first shift matrix forming the sum matrix of (6, 1) to (10, 5) of the check matrix (the sum matrix, which is the sum of a first shift matrix in which the 5×5 unit matrix is cyclically shifted by one to the right and a second shift matrix in which the 5×5 unit matrix is cyclically shifted by two to the right) is stored. In the third element, data corresponding to the positions of 1s of the second shift matrix forming the sum matrix of (6, 1) to (10, 5) of the check matrix is stored.

More specifically, for the sub-matrix whose weight is 2 or more, data (messages corresponding to the edges belonging to the unit matrix, the quasi-unit matrix, or the shift matrix) corresponding to the position of 1s of the unit matrix whose weight is 1, the quasi-unit matrix, or the shift matrix when the sub-matrix is represented in the form of the sum of two or more of the (P×P) unit matrix whose weight is 1, the quasi-unit matrix in which is, which are elements of the unit matrix, are substituted with 0, and the shift matrix in which the unit matrix or the quasi-unit matrix is cyclically shifted, is stored at the same address (the same FIFO from among the FIFOs $316_1$ to $316_{18}$).

Hereafter, for the fourth and fifth elements, also, data is stored in such a manner as to correspond to the check matrix. The number of elements (the number of stages) of the FIFO $316_1$ is 5, which is the maximum number of 1s (Hamming weight) in the row direction from the first column up to the fifth column of the check matrix.

Also, for the FIFOs $316_2$ and $316_3$, similarly, data is stored in such a manner as to correspond to the check matrix, and each of the length (the number of stages) thereof is 5. Also, for the FIFOs $316_4$ to $316_{12}$, similarly, data is stored in such a manner as to correspond to the check matrix, and each of the lengths thereof is 3. Also, for the FIFOs $316_{13}$ to $316_{18}$, similarly, data is stored in such a manner as to correspond to the check matrix, and each of the lengths thereof is 2. However, since the first element of the FIFO $316_{18}$ corresponds to (1, 86) to (5, 90) of the check matrix, and there are no is in the fifth column ((1, 90) to (5, 90) of the check matrix), data is not stored.

A description will now be given below in detail of the operation of each section of the decoding apparatus 300 of FIGS. 16A to 16C. Five messages (data) D319 is supplied to a switch 310 from a cyclic shift circuit 320. Also, a control signal D320 indicating information (matrix data) as to which row of the check matrix it belongs to 1s supplied to the switch 310 from the control section 321. Based on the control signal D320, an FIFO for storing five messages (data) D319 is selected from among the FIFOs $311_1$ to $311_6$, and the five pieces of message data D319 are collectively stored in the selected FIFO in sequence.

The edge data storage memory 311 includes six FIFOs $311_1$ to $311_6$. In the FIFOs $311_1$ to $311_6$ of the edge data storage memory 311, five messages D319 are collectively supplied from the switch 310 in sequence, and the FIFOs $311_1$ to $311_6$ collectively store the five messages D319 in sequence (simultaneously). Furthermore, when data is to be read, the edge data storage memory 311 sequentially reads the five messages (data) $D311_1$ from the FIFO $311_1$, and supplies them to the selector 312 at the subsequent stage. After the reading of the messages $D311_1$ from the FIFO $311_1$ is completed, the edge data storage memory 311 also sequentially reads messages $D311_1$ to $D311_6$ from the FIFOs $311_2$ to $311_6$, respectively, and supplies them to the selector 312.

A selection signal D321 indicating the selection of the FIFO from which message data is read (the FIFO from which data has been read currently) from among the FIFOs $311_1$ to $311_6$ is supplied to the selector 312 from the control section 321, and also, five messages (data) $D311_1$ to $D311_6$ are supplied to the selector 312 from the edge data storage memory 311. The selector 312 selects the FIFO from which data has been read currently from among the FIFOs $311_1$ to $311_6$ in accordance with a selection signal D321, and supplies the five pieces of message data supplied from the selected FIFO, as messages D312, to the check node calculation section 313.

The check node calculation section 313 includes five check node calculators $313_1$ to $313_5$. Five messages D312 are supplied to the check node calculation section 313 via the selector 312, and the messages D312 are supplied individually to each of the check node calculators $313_1$ to $313_5$. Furthermore, a control signal D322 is supplied to the check node calculator 313 from the control section 321, and the control signal D322 is supplied to the check node calculators $313_1$ to $313_5$. The check node calculators $313_1$ to $313_5$ simultaneously perform computations in accordance with equation (7) by using the messages D312, and determine messages D313 corresponding to five edges as a result of the computations. The check node calculation section 313 supplies the five messages D313 obtained as a result of the computations by the check node calculators $313_1$ to $313_5$ to the cyclic shift circuit 314.

A control signal D322 supplied from the control section 321 to the check node calculator 313 corresponds to the control signal D106 of FIG. 10. The check node calculation sections $313_1$ to $313_5$ are each configured in the same way as the check node calculator 101 shown in FIG. 10.

The five messages D313 calculated in the check node calculation section 313 are supplied to the cyclic shift circuit 314. Also, a control signal D323 indicating information (matrix data) as to the fact that the edge corresponding to the message D313 is connected as a result of how many times, for example, the unit matrix forming the basis in the check matrix is cyclically shifted, is supplied to the cyclic shift circuit 314 from the control section 321. The cyclic shift circuit 314 cyclically shifts the five messages D313 on the basis of the control signal D323, and supplies the result as a message D314 to the switch 315.

A control signal D324 indicating information as to which column of the check matrix the five messages (data) D314 supplied from the cyclic shift circuit 314 belong to 1s supplied to the switch 315, and also the message D314 is supplied thereto from the cyclic shift circuit 314. Based on the control signal D324, the switch 315 selects the FIFO for storing the message D314 from among the FIFOs $316_1$ to $316_{18}$, and collectively supplies the five messages D314 in sequence.

An edge data storage memory 316 includes 18 FIFOs $316_1$ to $316_{18}$. The five messages D314 are collectively supplied in sequence (simultaneously) from the switch 315 to the FIFOs $316_1$ to $316_{18}$ of the edge data storage memory 316, and the FIFOs $316_1$ to $316_{18}$ collectively store the five messages D314 in sequence. Furthermore, when the data is to be read, the memory 316 for storing edge data sequentially reads five messages $D315_1$ from the FIFO $316_1$ and supplies them to the selector 317 at the subsequent stage. After the reading of the data from the FIFO $316_1$ is completed, the memory 316 for storing edge data sequentially reads the messages $D315_2$ to $D31318$ also from the FIFOs $316_1$ to $316_{18}$ and supplies them to the selector 317.

A selection signal D325 indicating the selection of the FIFO for reading message data (the FIFO from which data has been read currently) from among the FIFOs $316_1$ to $316_{18}$ is supplied from the control section 321 to the selector 317, and also, message data $D315_1$ to $D31318$ are supplied thereto from the edge data storage memory 316. Based on the selection signal D325, the selector 317 selects the FIFO from which data has been read currently from among the FIFOs $316_1$ to $316_{18}$, and supplies the five pieces of the message data supplied from the selected FIFO, as messages D316, to the variable node calculation section 319 and the above-described block (not shown) for performing the computation of equation (5).

On the other hand, the memory 318 for received data has calculated the reception LLR (log likelihood ratio) from the received information through the communication channel.

Five pieces of the calculated reception LLR are supplied collectively (simultaneously) as received data D317 (LDPC codes) to the variable node calculation section 319 and the block (not shown) for receiving the computation of equation (5). The memory 318 for received data reads the received data D317 in the sequence necessary for the variable node computation of the variable node calculation section 319.

The variable node calculation section 319 includes five variable node calculator $319_1$ to $319_5$. Five messages D316 are supplied to the variable node calculation section 319 via the selector 317, and the messages D316 are supplied individually to each of the variable node calculators $319_1$ to $319_5$. Furthermore, the five pieces of the received data D317 are supplied to the variable node calculation section 319 from the memory 318 for received data, and the pieces of the received data D317 are supplied individually to each of the variable node calculators $319_1$ to $319_5$. Furthermore, a control signal D326 is supplied from the control section 321 to the variable node calculation section 319, and the control signal D326 is supplied to the variable node calculators $319_1$ to $319_5$.

The variable node calculators $319_1$ to $319_5$ perform computations in accordance with equation (1) by using the messages D316 and the received data D317, and determine messages D318 corresponding to five edges as a result of the computations. The variable node calculation section 319 supplies the five messages D318 obtained as a result of the variable node calculators $319_1$ to $319_5$ to the cyclic shift circuit 320.

Here, the control signal D326 supplied from a control section 521 to the variable node calculation section 319 corresponds to the control signal D107 of FIG. 11, and the variable node calculators $319_1$ to $319_5$ are each configured in the same way as the variable node calculator 103 of FIG. 11.

Five messages D318 are supplied to the cyclic shift circuit 320 from the variable node calculation section 319. Also, a control signal D327 indicating information (matrix data) as to the fact that the edge corresponding to the message D318 is connected as a result of how many times, for example, the unit matrix forming the basis in the check matrix is cyclically shifted, is supplied to the cyclic shift circuit 320 from the control section 321. Based on the control signal D327, the cyclic shift circuit 320 performs a cyclic shifting of rearranging the messages D327, and supplies the results as messages D319 to the switch 310.

The control section 321 supplies a selection signal D320 to the switch 310 and supplies a selection signal D321 to the selector 312 in order to control them, respectively. The control section 321 supplies a control signal D322 to the check node calculation section 313, supplies a control signal D323 to the cyclic shift circuit 314, and supplies a control signal D324 to the switch 315 in order to control them, respectively. Furthermore, the control section 321 supplies a selection signal D325 to the selector 317, supplies a control signal D326 to the variable node calculation section 319, and supplies a control signal D327 to the cyclic shift circuit 320 in order to control them, respectively.

As a result of the above operation being circulated once, one decoding of the LDPC codes can be performed. After the decoding apparatus 300 of FIGS. 16A to 16C decodes the LDPC codes a predetermined number of times, the decoding apparatus 300 determines a final decoded result (not shown) in accordance with equation (5) and outputs it.

For the portions in which edge data (messages corresponding to the edges) lacks, during the storage in the memory (when data is stored in the edge data storage memories 311 and 316), no message is stored. During node computation (during the check node computation at the check node calculation section 313 and during the variable node computation at the variable node calculation section 319), no computation is performed.

Figure 17:
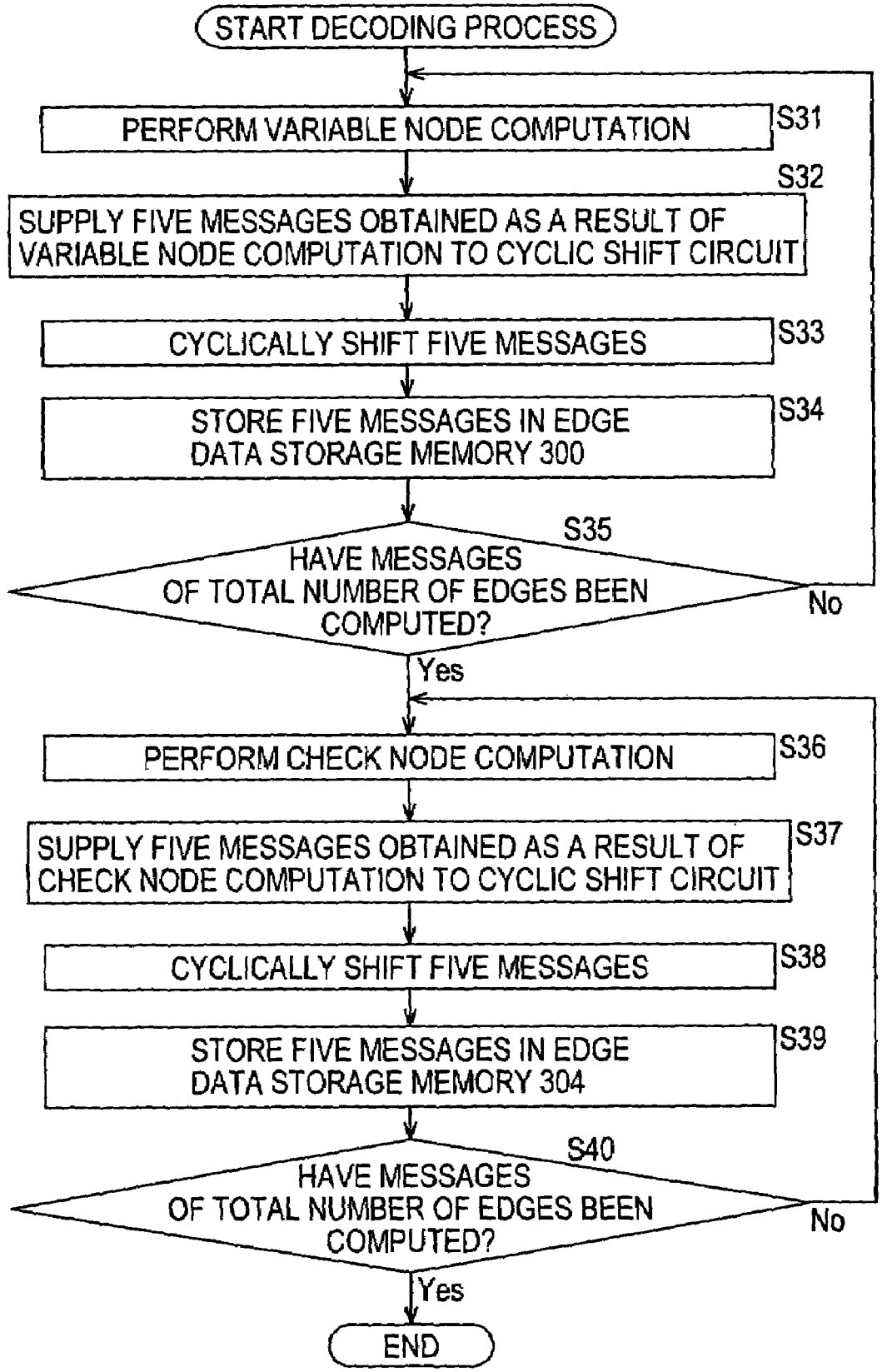
FIG. 17 is a flowchart illustrating the decoding process of the decoding apparatus of FIGS. 16A to 16C.

FIG. 17 is a flowchart illustrating the decoding process of the decoding apparatus 300 of FIGS. 16A to 16C. This process is started when received data to be decoded is stored in the memory 318 for received data.

In step S31, the variable node calculation section 319 performs a variable node computation.

More specifically, five messages D316 (messages $u_j$) are supplied to the variable node calculation section 319 via the selector 317. That is, the edge data storage memory 316 sequentially reads the five messages $D316_1$ stored in step S39 (to be described later) from the FIFO $316_1$, and thereafter, sequentially reads messages $D316_2$ to $D316_{18}$ also from the FIFOs $316_2$ to $316_{18}$, and supplies them to the selector 317.

A selection signal D307 indicating the selection of the FIFO (the FIFO from which data has been read currently) from which message (data) is to be read from among the FIFOs $316_1$ to $316_{18}$ is supplied to the selector 317 from the control section 321, and also, message data $D316_1$ to $D316_{18}$ are supplied to the selector 317 from the edge data storage memory 316. Based on the selection signal D307, the selector 317 selects the FIFO from which data has been read currently from among the FIFOs $316_1$ to $316_{18}$, and supplies the five pieces of the message data supplied from the selected FIFO, as the messages D316, to the variable node calculation section 319.

When a check node computation has not yet been performed on the received data D309 supplied from the memory 306 and a message D304 is not stored in the edge data storage memory 316, the variable node calculation section 319 sets the message $u_j$ to an initial value used for a variable node computation.

The five pieces of the received data D309 (received value $u_{0i}$) are supplied to the variable node calculation section 319 from the memory 318 for received data, and the pieces of the received data D309 are supplied individually to each of the variable node calculators $319_1$ to $319_5$. Furthermore, a control signal D315 is supplied to the variable node calculation section 319 from the control section 321, and the control signal D315 is supplied to the variable node calculators $319_1$ to $319_5$.

Based on the control signal D315, the variable node calculators $319_1$ to $319_5$ simultaneously perform computations in accordance with equation (1) by using the messages D316 and the received data D309, and determine five messages D319 as a result of the computations.

That is, the control signal D315 supplied to the variable node calculation section 319 by the control section 321 corresponds to the control signal D107 described with reference to FIG. 11 described above. Each of the variable node calculators $319_1$ to $319_5$ reads one necessary message D314 (D316) from the edge data storage memory 316 via the selector 317 in accordance with the control signal D309, and also, reads the five pieces of received data D309 supplied from the memory 318 for received data, respectively, perform a variable node computation, and simultaneously determine five messages D319 as a result of the computations.

After the processing of step S31, the process proceeds to step S32, where the variable node calculation section 319 supplies the five messages D319 (messages $v_i$) obtained as a result of the variable node computations of the variable node calculators $319_1$ to $319_5$ to the cyclic shift circuit 320. The process then proceeds to step S33.

In step S33, the cyclic shift circuit 320 cyclically shifts (rearranges) the five messages D318 supplied from the variable node calculation section 319.

More specifically, a message D318 is supplied to the cyclic shift circuit 320 from the variable node calculation section 319. Also, a control signal D327 indicating information (matrix data) as to the fact that the edge corresponding to the message D318 is connected as a result of how many times, for example, the unit matrix forming the basis in the check matrix is cyclically shifted, is supplied to the cyclic shift circuit 320 from the control section 321. Based on the control signal D327, the cyclic shift circuit 320 cyclically shifts five messages D327, and supplies the results as the message sD319 to the switch 310.

After the processing of step S33, the process proceeds to step S34, where the switch 310 supplies the five messages D319 supplied from the cyclic shift circuit 320 to the edge data storage memory 311.

More specifically, a message (data) D304 is supplied to the switch 310 from the cyclic shift circuit 320, and also, a control signal D312 indicating information as to which row of the check matrix the message D304 belongs to 1s supplied to the switch 310. Based on the control signal D312, the switch 310 selects the FIFO for storing the messages D304 from among the FIFO $300_1$ to $300_6$, and sequentially supplies the five pieces of the message data D304 collectively in the selected FIFO.

Then, the FIFO $300_1$ to $300_{18}$ of the edge data storage memory 311 collectively store the five pieces of the message data D304 supplied from the switch 310 in sequence.

After the processing of step S34, the process proceeds to step S35, where the control section 321 determines whether or not the messages of the total number of edges have been computed by the variable node calculation section 319. When it is determined that the messages of the total number of edges have not been computed, the process returns to step S31, and the above-described processing is performed again.

On the other hand, when it is determined in step S35 that the variable node calculation section 319 has computed the messages of the total number of edges, the process proceeds to step S36, where the check node calculation section 313 performs a check node computation.

More specifically, five message D302 are supplied to the check node calculation section 313 via the selector 312. That is, the edge data storage memory 311 sequentially reads, from the FIFO $311_1$, five messages $D311_1$ (messages $v_i$) stored in step S34, and thereafter, sequentially reads the message data $D311_2$ to $D311_6$ also from the FIFOs $311_2$ to $311_6$, and supplies it to the selector 312.

A selection signal D321 indicating the selection of the FIFO for reading message data (the FIFO from which data has been read currently) from among the FIFOs $311_1$ to $311_6$ is supplied to the selector 312 from the control section 321, and also, message data $D311_1$ to $D311_6$ is supplied to the selector 312 from the edge data storage memory 311. Based on the selection signal D321, the selector 301 selects the FIFO from which data has been read currently, and supplies five pieces of the message data supplied from the selected FIFO, as messages D311, to the check node calculation section 313.

Furthermore, a control signal D322 is supplied to the check node calculation section 313 from the control section 321. Based on the control signal D322, the check node calculators $313_1$ to $313_5$ of the check node calculation section 313 simultaneously perform check node computations in accordance with equation (7) by using the messages D302, and determine five messages D303 (messages $u_j$) as a result of the computations.

More specifically, the control signal D322 supplied to the check node calculation section 313 by the control section 321 corresponds to the control signal D106 in FIG. 10 described above. Based on the control signal D322, the check node calculators $313_1$ to $313_5$ each perform a check node computation while they read one necessary message D311 (D312) from the edge data storage memory 311 via the selector 312, and simultaneously determine five messages D313 as a result of the computations.

After the processing of step S37, the process proceeds to step S38, where the check node calculation section 313 outputs five messages D313 obtained as a result of the check node computation to the cyclic shift circuit 314. The process then proceeds to step S38.

In step S38, the cyclic shift circuit 314 cyclically shifts the five messages D313 supplied from the check node calculation section 313.

More specifically, the messages D313 are supplied to the cyclic shift circuit 314 from the check node calculation section 313. Also, a control signal D314 indicating information (matrix data) as to the fact that the edge corresponding to the message D313 is connected as a result of how many times, for example, the unit matrix forming the basis in the check matrix is cyclically shifted, is supplied to the cyclic shift circuit 314 from the control section 321. Based on the control signal D314, the cyclic shift circuit 314 cyclically shifts the five messages D313, and supplies the results as the messages D304 to the switch 315.

After the processing of step S38, the process proceeds to step S39, where the switch 315 stores the five messages D304 supplied from the cyclic shift circuit 314 in the edge data storage memory 316.

More specifically, the five messages (data) D304 are supplied from the cyclic shift circuit 314 to the switch 316, and also, a control signal D324 indicating information as to which row of the check matrix the messages (data) D304 belong to 1s supplied to the switch 316 from the cyclic shift circuit 314. Based on the control signal D324, the switch 316 selects the FIFO for storing the message D304 from among the FIFOs $316_1$ to $316_{18}$ of the edge data storage memory 316, and collectively supplies the five pieces of the message data D304 to the selected FIFO in sequence.

Then, the FIFOs $316_1$ to $316_{18}$ of the edge data storage memory 316 collectively store the five pieces of the message data D304 supplied from the switch 316 in sequence.

After the processing of step S39, the process proceeds to step S40, where the control section 321 determines whether or not the messages of the total number of the edges have been computed by the check node calculation section 313. When it is determined that the messages of the total number of the edges have not been computed, the process returns to step S36, and the above-described processing is performed again.

On the other hand, when the control section 321 determines in step S40 that the messages of the total number of the edges have been computed by the check node calculation section 313, the processing is completed.

When the decoding apparatus 300 repeatedly performs the decoding process of FIG. 17 for the number of decodings and the check node calculation section 313 performs the final check node computation, the message D304 obtained as a result of the check node computation is supplied from the edge data storage memory 316 via the selector 317 to a block (not shown) for performing the computation of equation (5) described above. The received data D309 is further supplied to the block (not shown) from the memory 306 for received data. The block (not shown) performs the computation of equation (5) by using the messages D304 and the received data D309, and outputs the computation result as a final decoded result.

In the above description, although an FIFO is used to store edge data (although the edge data storage memory 311 and 316 are formed by FIFOs, a RAM may be used instead of the FIFO. In that case, for the RAM, a bit width at which p pieces of edge information (messages corresponding to edges) can be simultaneously read, and the total-number-of-edges/p words are required. For writing into the RAM, at which position the data to be written is read when it is read next is determined on the basis of the information of the check matrix, and the data is written at that position. For reading from the RAM, data is sequentially read from the beginning of the address. That is, in the RAM, the message data is stored in the sequence in which it is read in such a manner as to be packed closer, and the message data is read in the storage position sequence. If the RAM is used in place of the FIFO, the selectors 312 and 317 are not necessary.

When the physical bit width of the FIFO and the RAM is not sufficient, by providing the same control signal by using a plurality of RAMs, these can be logically assumed as one RAM.

In the decoding apparatus 300 of FIGS. 16A to 16C, a variable node computation is performed by using the message $u_j$ obtained as a result of the check node computation, and a check node computation is performed by using the message $v_i$ obtained as a result of that computation. Therefore, the edge data storage memory 311 and the edge data storage memory 316 for storing all the messages $u_j$ corresponding to the edges obtained as a result of the check node computation and all the messages $v_i$ corresponding to the edges obtained as a result of the variable node computation are required. That is, in the decoding apparatus, a memory of the capacity required to store messages twice as large as the number of 1s of the check matrix H is required.

Accordingly, in order to further reduce the circuit scale of the decoding apparatus, a decoding apparatus in which the capacity of the memory is reduced further when compared to the decoding apparatus 300 of FIGS. 16A to 16C is described below.

Figure 18:
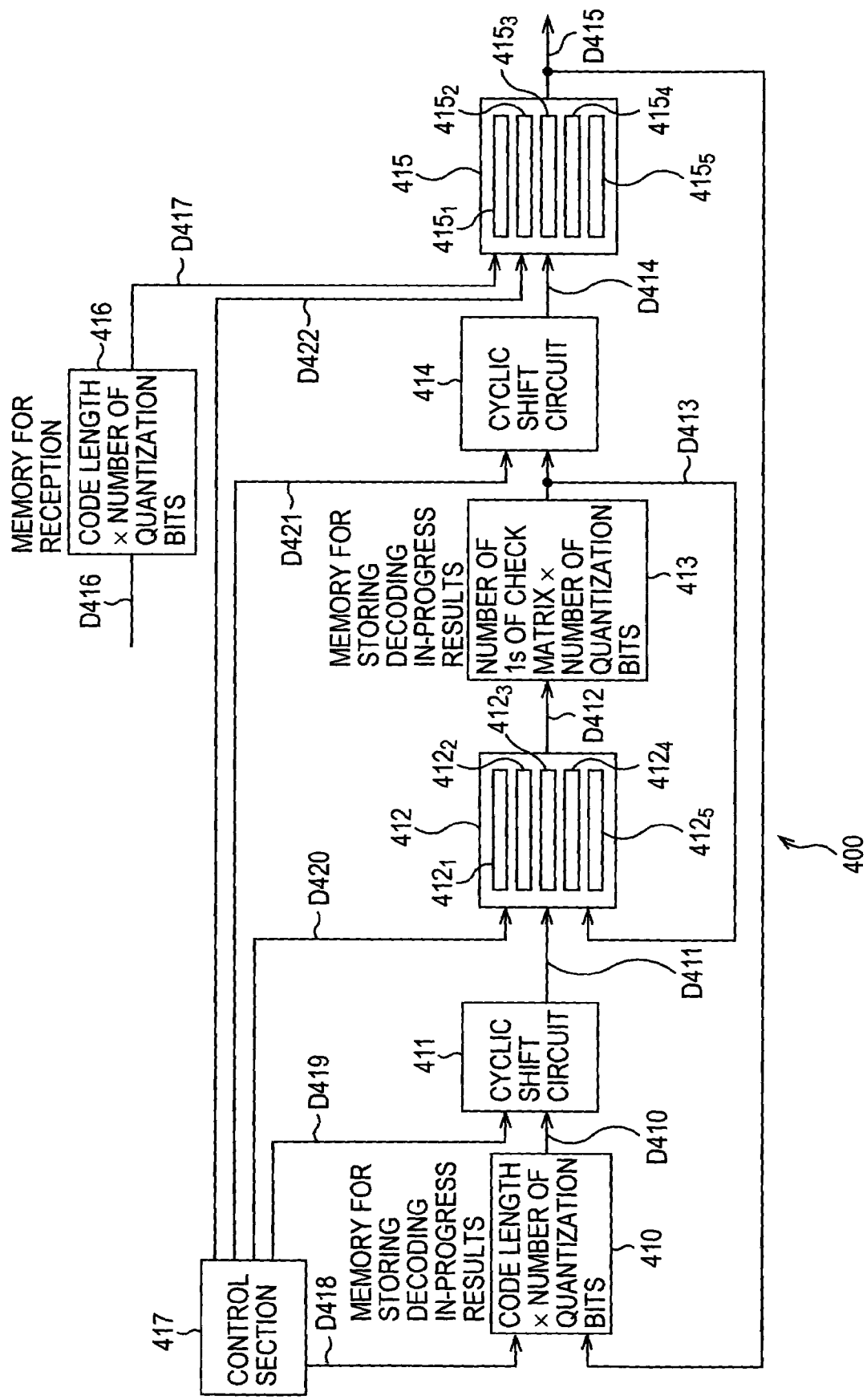
FIG. 18 is a block diagram showing an example of the configuration of an embodiment of the decoding apparatus to which the present invention is applied.

FIG. 18 is a block diagram showing an example of the configuration of another embodiment of the decoding apparatus for decoding LDPC codes represented by the check matrix of FIG. 15, to which the present invention is applied.

In a decoding apparatus 400 of FIG. 18, the edge data storage memory 311 of FIGS. 16A and 16B is formed as a memory 410 for storing decoding in-progress results having a capacity smaller than that of the edge data storage memory 311.

The decoding apparatus 400 includes a memory 410 for storing decoding in-progress results, a cyclic shift circuit 411, a calculation section 412 made up of five calculators $412_1$ to $412_5$, a memory 413 for storing decoding in-progress results, a cyclic shift circuit 414, a calculation section 415 made up of five calculators $415_1$ to $415_5$, a memory 416 for reception, and a control section 417.

A description will now be given, with reference to FIG. 19 to FIG. 22, of the relationship among the calculators $412_1$ to $412_5$ of the calculation section 412 and the calculators $415_1$ to $415_5$ of the calculation section 415 of FIG. 18, the check node calculator 101 of FIG. 10, and the variable node calculator 103 of FIG. 11.

Figure 19:
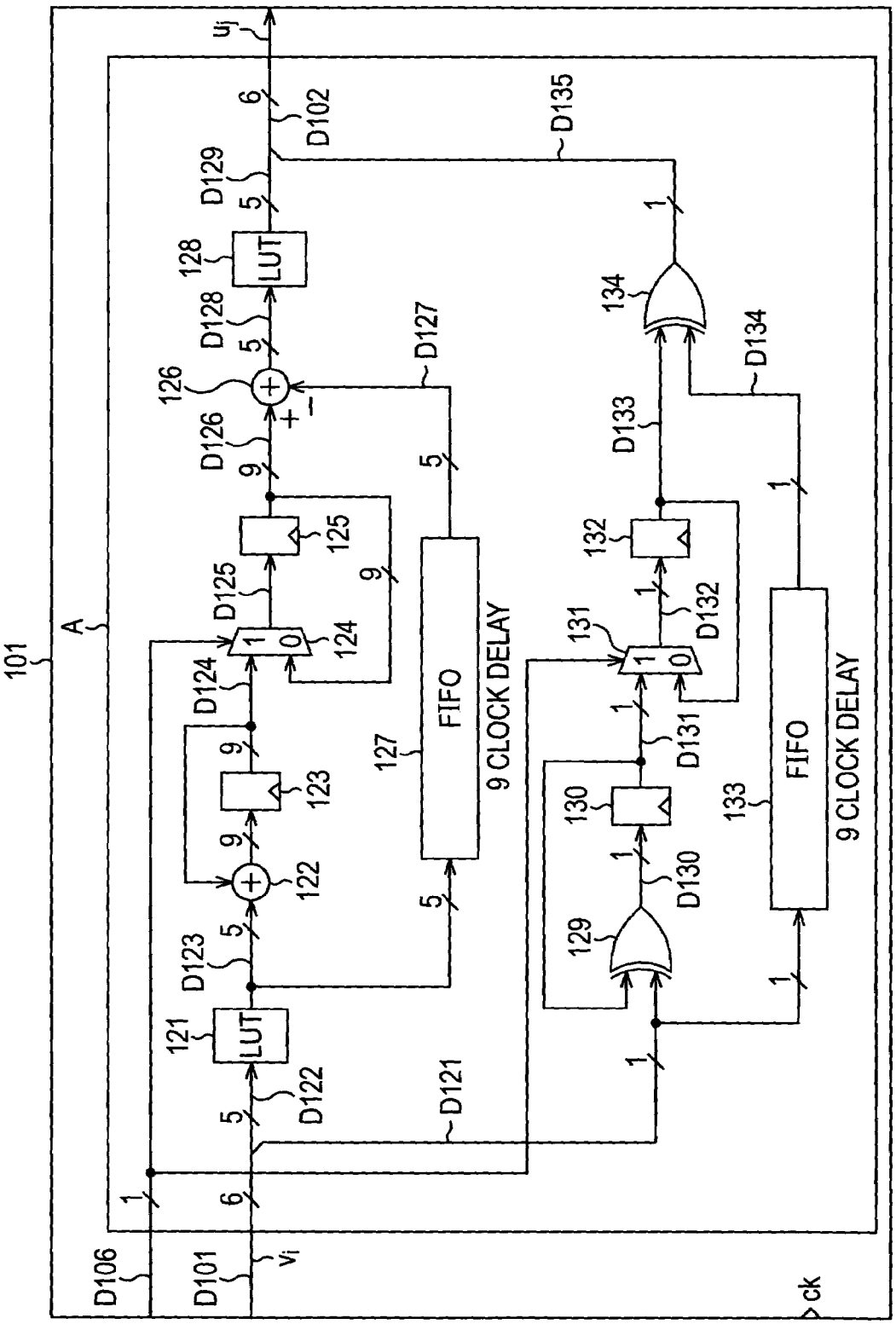
FIG. 19 is a block diagram showing an example of the configuration of a check node calculator.
Figure 20:
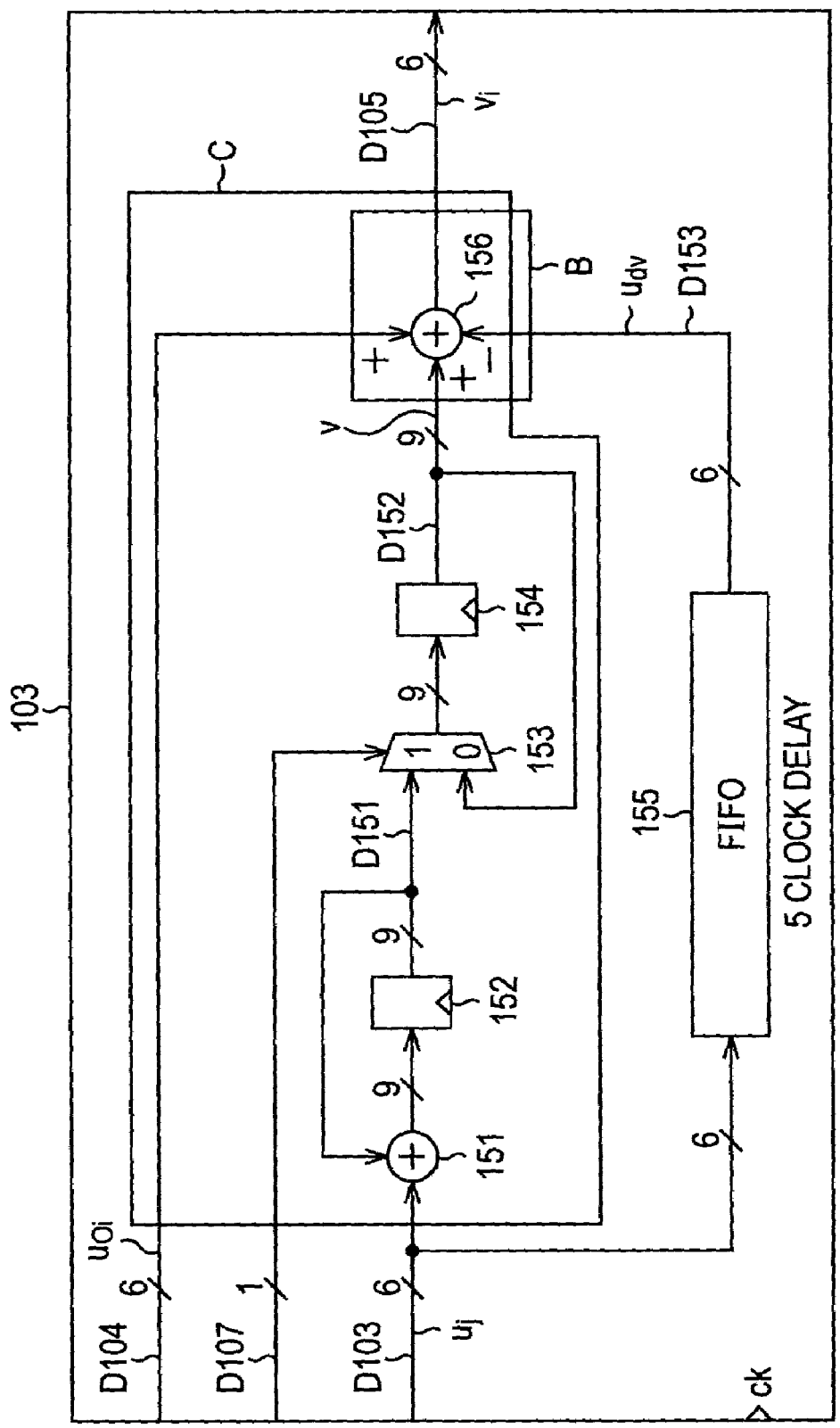
FIG. 20 is a block diagram showing an example of the configuration of a variable node calculator.
Figure 21:
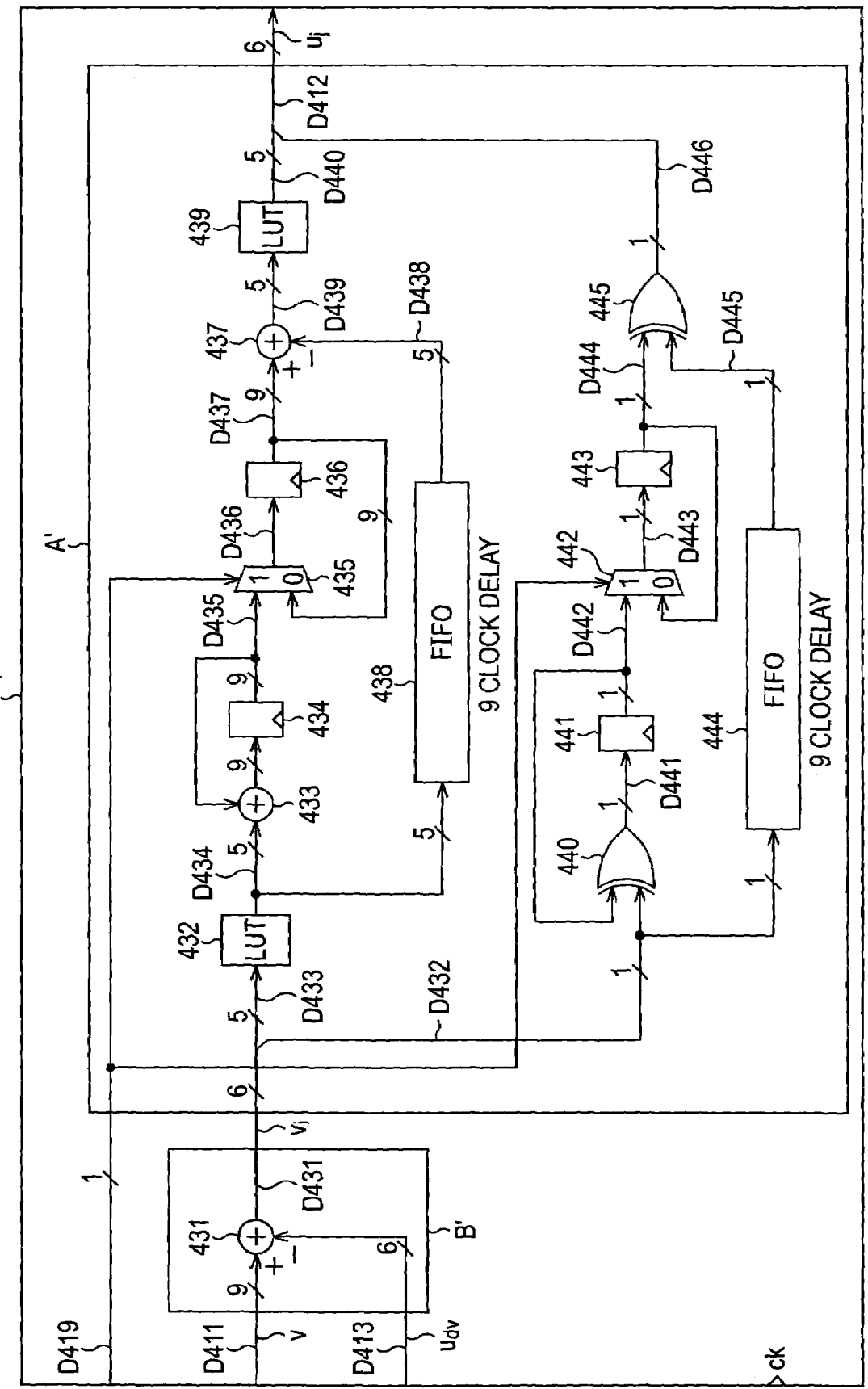
FIG. 21 is a block diagram showing an example of the configuration of a calculator of FIG. 18.
Figure 22:
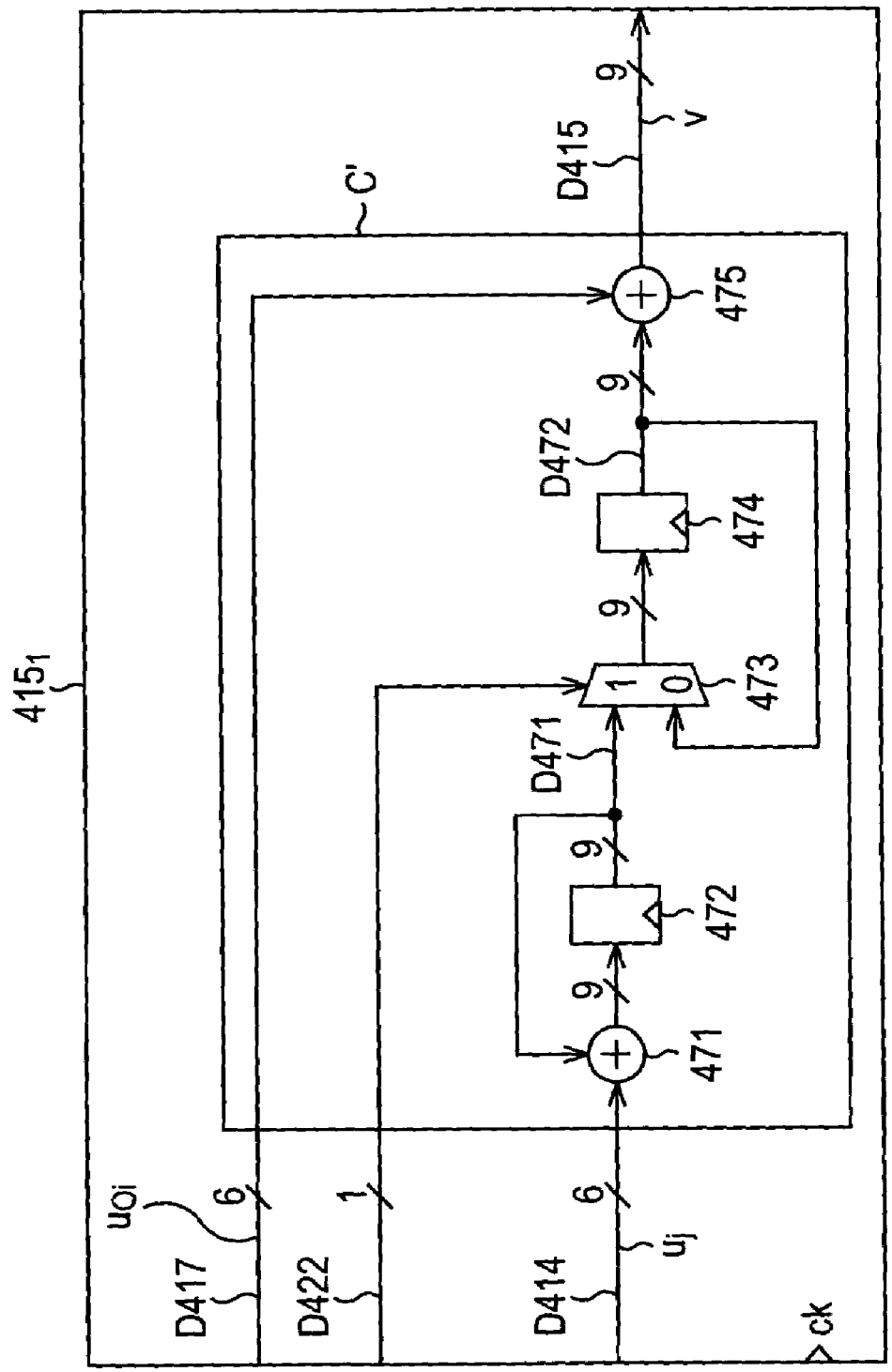
FIG. 22 is a block diagram showing an example of the configuration of the calculator of FIG. 18.

FIG. 19 and FIG. 20 are the same as FIG. 10 which shows the check node calculator 101 and FIG. 11 which shows the variable node calculator 103, respectively. FIG. 21 shows an example of the configuration of a calculation section $412_k$ (k=1, 2, . . . , 5). FIG. 22 shows an example of the configuration of a calculation section $415_k$ (k=1, 2, . . . , 5).

In the decoding apparatus 400 of FIG. 18, rather than the calculator $412_k$ performs a check node computation and the calculation section $415_k$ performs a variable node computation, the calculator $412_k$ performs some of the check node computation and the variable node computation, and the calculator $415_k$ performs some of the others of the variable node computation.

More specifically, the calculator $412_k$ of FIG. 21 is formed of a block A' and a block B'. The block A' is configured in the same way as the block for performing the check node computation of the check node calculator 101 of FIG. 19. The block B' is configured in the same way as the block B, which is part of the variable node calculator 103 of FIG. 20, for subtracting the message $u_j$ corresponding to the edge to be determined, from the integrated value of the messages $u_j$ corresponding to all the edges of each column of the check matrix. On the other hand, the calculator $415_k$ of FIG. 22 is formed from a block C'. The block C' is configured in the same way as the block C, which is another part of the variable node calculator 103 of FIG. 20, for integrating the messages $u_j$ corresponding to the edges of each column of the check matrix and adding the received value $u_{0i}$ to the integrated value.

The calculator $412_k$ of FIG. 21 supplies the results of the computations by the block A and the block B, that is, decoding in-progress results $u_j$ such that some of the check node computation and the variable node computation are performed, to the memory 413 for storing decoding in-progress results. The calculator $415_k$ of FIG. 22 supplies the decoding in-progress results v such that some of the others of the variable node computation are performed to the memory 410 for storing decoding in-progress results.

Therefore, it is possible for the decoding apparatus 400 of FIG. 18 to perform the check node computation and the variable node computation by alternately performing the computation of the calculator $412_k$ and the computation of the calculator $415_k$ in order to perform decoding.

In the calculator $412_k$ of FIG. 22, since the decoding in-progress results $u_j$ corresponding to the edges to be determined are subtracted from the decoding in-progress results v obtained as a result of the computation of the calculator $415_k$ in the block B by using the decoding in-progress results $u_j$ corresponding to the edges to be determined, which are stored in the memory 413 for storing decoding in-progress results, the FIFO memory 155 of FIG. 20 is not required.

Next, a description is given of the computation performed by the calculator 412$_k$ and the computation performed by the calculator 415$_k$ by using equations.

More specifically, the calculation section 412 performs a first computation in accordance with equation (7) described above and equation (8) described below, and supplies the decoding in-progress results u$_j$, which are the results of the first computation, to the memory 410 for storing decoding in-progress results, whereby they are stored. The calculation section 415 performs a second computation in accordance with equation (5) described above, and supplies the decoding in-progress results v, which are the results of the second computation, to the memory 410 for storing decoding in-progress results, whereby they are stored.

$$v_i = v - u_{d_v} \quad (8)$$

u$_{d_v}$ of equation (8) represents the in-progress results (here, the check node computation results themselves) of the check node computation from the edge for which the message of the i-th column of the check matrix H is to be determined. That is, u$_{d_v}$ is the decoding in-progress results corresponding to the edge to be determined.

More specifically, the decoding in-progress results v obtained as a result of the second computation in accordance with equation (5) described above are such that the received value u$_{0i}$ and the decoding in-progress results u$_j$ of the check node computation from all the edges corresponding to 1s of each row of the i-th column of the check matrix H are multiplied together. The value v$_i$ used for equation (7) described above becomes such that the decoding in-progress results u$_{d_v}$ of the check node computation from the edges for which messages are to be determined from among the decoding in-progress results u$_j$ of the check node computation from the edges corresponding to 1s of each row, of the i-th column of the check matrix H, are subtracted from the decoding in-progress results v obtained as a result of the second computation in accordance with equation (5). That is, the computation of equation (1) for determining the value v$_i$ used for the computation of equation (7) is a computation in which the above-described equation (5) and equation (8) are combined.

Therefore, in the decoding apparatus 400, the first computation in accordance with equation (7) and equation (8) by the calculation section 412, and the second computation in accordance with equation (5) by the calculation section 415 are alternately performed, and the calculation section 415 outputs the result of the final second computation as the decoded results, making it possible to perform repeated decoding of LDPC codes.

Here, the first computation results in accordance with equation (7) and equation (8) are described as the decoding in-progress results u$_j$, and these decoding in-progress results u$_j$ are equal to the check node computation results u$_j$ of equation (7).

Since v of equation (5), which is determined from the second computation, is such that the check node computation results u$_j$ from the edges from which messages are to be determined are added to the variable node computation results v$_i$ of equation (1), only one of v is determined with respect to one column (one variable node) of the check matrix H.

In the decoding apparatus 400, the calculation section 412 performs the first computation by using the decoding in-progress results v (the second decoding in-progress results) corresponding to the column of the check matrix H, which are the results of the second computation by the calculation section 415, and stores, in the memory 413 for storing decoding in-progress results, the decoding in-progress results u$_j$ (the first decoding in-progress results) of the check node computation from the edges of the messages (the messages output to each edge by each check node) of the edges corresponding to 1s of each row, of the i-th column of the check matrix H obtained as a result of the computation. Therefore, the capacity of the memory 413 for storing decoding in-progress results becomes a value such that, similarly to the number of 1s (the total number of edges) of the check matrix and the number of quantization bits are multiplied together. On the other hand, the calculation section 415 performs a second computation by using the decoding in-progress results u$_j$ corresponding to 1s of each row, of the i-th column of the check matrix H, which are the results of the first computation by the calculation section 412 and the received value u$_{0i}$, and stores the decoding in-progress results v corresponding to the i-th column obtained as a result of the computation in the memory 410 for storing decoding in-progress results. Therefore, the capacity necessary for the memory 410 for storing decoding in-progress results becomes a value such that the number of columns of the check matrix, which is smaller than the number of 1s of the check matrix, that is, the code length of the LDPC codes, and the number of quantization bits of the number of quantization bits are multiplied together.

Therefore, in the decoding apparatus 400 for decoding LDPC codes, in which is in the check matrix H are sparse, the capacity of the memory of the memory 410 for storing decoding in-progress results can be reduced when compared to the edge data storage memory 311 of FIGS. 16A and 16B. As a result, the circuit scale of the decoding apparatus 400 can be reduced.

Furthermore, in the decoding apparatus 400, since the calculation section 415 performs a second computation in accordance with equation (5), the decoding apparatus 400 does not need to have the block (not shown) for performing the computation of equation (5) for computing the final decoded results in the decoding apparatus 300 of FIGS. 16A to 16C. Thus, when compared to the decoding apparatus 300 of FIGS. 16A to 16C, the circuit scale of the decoding apparatus of FIG. 18 can be reduced.

A description will now be given in detail of the operation of each section of the decoding apparatus 400 of FIG. 18.

Five decoding in-progress results D415 corresponding to five columns of the check matrix, which are the results of the second computation by the calculation section 415, are supplied to the memory 410 for storing decoding in-progress results from the calculation section 415. The memory 410 for storing decoding in-progress results stores the five decoding in-progress results D415 supplied from the calculation section 415 in sequence starting from the first address.

More specifically, at the first address of the memory 410 for storing decoding in-progress results, the decoding in-progress results v from the first column up to the fifth column from among the decoding in-progress results corresponding to the column of the check matrix are stored. Similarly, at the second address, the decoding in-progress results v from the sixth column up to the tenth column are stored, and at the third address, the decoding in-progress results from the 11th column up to the 15th column are stored. Hereafter, similarly, the decoding in-progress results v from the 16th column up to the 90th column are stored at the fourth address up to the 18th address in units of five results, and a total of 90 decoding in-progress results v are stored in the memory 410 for storing decoding in-progress results. Therefore, the number of words of the memory 410 for storing decoding in-progress results becomes 18 such that 90, the number of columns of the check matrix H (the code length of the LDPC codes) of FIG. 15, is divided by 5, the number of decoding in-progress results that are read and written simultaneously.

The memory 410 for storing decoding in-progress results simultaneously reads, from the decoding in-progress results D415 which have already been stored, five decoding in-progress results v, which are "1" in the corresponding row of the check matrix H, of the decoding in-progress results $u_j$ to be determined by the calculation section 412 at the subsequent stage, and supplies them as decoding in-progress results D410 to the cyclic shift circuit 411.

The memory 410 for storing decoding in-progress results is formed by, for example, a single-port RAM capable of simultaneously reading and writing five decoding in-progress results. Since, in the memory 410 for storing decoding in-progress results, the decoding in-progress results v corresponding to the column at which the computation is performed by the second computation of the calculation section 415 are stored, the amount of data stored in the memory 410 for storing decoding in-progress results, that is, the storage capacity necessary for the memory 410 for storing decoding in-progress results, is a multiplication value of the number of quantization bits of the decoding in-progress results and the number of columns of the check matrix H (the code length of the LDPC codes).

Five decoding in-progress results D410 are supplied to the cyclic shift circuit 411 from the memory 410 for storing decoding in-progress results. Also, a control signal D619 indicating information (matrix data) as to the fact that is of the check matrix, which corresponds to the decoding in-progress results D410, are arranged as a result of how many times, for example, the unit matrix forming the basis in the check matrix is cyclically shifted, is supplied to the cyclic shift circuit 411 from the control section 417. The cyclic shift circuit 611 performs a cyclic shifting of rearranging the five decoded results D410 on the basis of the control signal D619, and supplies the results as decoding in-progress results D411 to the calculation section 412.

The calculation section 412 includes five calculators $412_1$ to $412_5$. The five decoding in-progress results D411 (the second decoding in-progress results) v, which are obtained as a result of the second computation by the calculation section 415, are supplied to the calculation section 412 from the cyclic shift circuit 411. Also, the five decoding in-progress results D413 (the first decoding in-progress results) $u_j$ obtained previously as a result of the first computation by the calculators $412_1$ to $412_5$ are supplied to the calculation section 412 from the memory 413 for storing decoding in-progress results. The five decoding in-progress results D411 and the five decoding in-progress results D413 are supplied to each of the calculator $412_1$ to $412_5$. Furthermore, a control signal D419 is supplied to the calculation section 412 from the control section 417, and the control signal D419 is supplied to the calculators $412_1$ to $412_5$. The control signal D419 is a signal common to the five calculators $412_1$ to $412_5$.

The calculators $412_1$ to $412_5$ perform the first computation in accordance with equation (7) and equation (8) by using the decoding in-progress results D411 and the decoding in-progress results D413, and determine the decoding in-progress results D412 ($v_i$). The calculation section 412 supplies the five decoding in-progress results D412 corresponding to five 1s of the check matrix, which are obtained as a result of the computations by the calculators $412_1$ to $412_5$, to the memory 413 for storing decoding in-progress results.

The memory 413 for storing decoding in-progress results is formed by, for example, two single-port RAMs capable of simultaneously reading and writing five decoding in-progress results. The five decoding in-progress results D412 are supplied to the memory 413 for storing decoding in-progress results from the calculation section 412, and also, a control signal D420 for controlling the reading and writing of the decoding in-progress results 413 is supplied to the memory 413 from the control section 417.

Based on the control signal D420, the memory 413 for storing decoding in-progress results collectively stores the five decoding in-progress results D412 supplied from the calculation section 412, and at the same time, reads the five decoding in-progress results D412, which have already been stored, and supplies them as decoding in-progress results D413 to the calculation section 412 and the cyclic shift circuit 414. That is, the memory 413 for storing decoding in-progress results simultaneously performs the reading of the decoding in-progress results D413 to be supplied to the calculation section 412 and the cyclic shift circuit 414 and the writing of the decoding in-progress results D412 supplied from the calculation section 412.

In the memory 413 for storing decoding in-progress results, the decoding in-progress results $u_j$ of the check node computation from the edges corresponding to 1s of each row, of the i-th column of the check matrix H, which are computed by the first computation of the calculation section 412, are stored. Therefore, the amount of data stored in the memory 413 for storing decoding in-progress results, that is, the storage capacity necessary for the memory 413 for storing decoding in-progress results, becomes the multiplication value of the number of the quantization bits of the decoding in-progress results and the number of 1s of the check matrix.

Five decoding in-progress results D413 (the decoding in-progress results $u_j$) are supplied to the cyclic shift circuit 414 from the memory 413 for storing decoding in-progress results. Also, a control signal D421 indicating information (matrix data) as to the fact that 1s of the check matrix, which corresponds to the decoding in-progress results D413, are arranged as a result of how many times, for example, the unit matrix forming the basis in the check matrix is cyclically shifted, is supplied to the cyclic shift circuit 414 from the control section 417. The cyclic shift circuit 414 performs a cyclic shifting of rearranging the five decoding in-progress results D413 on the basis of the control signal D421, and supplies the results as decoding in-progress results D414 to the calculation section 415.

The calculation section 415 includes five calculators $415_1$ to $415_5$. Five decoding in-progress results D414 are supplied to the calculation section 415 from the cyclic shift circuit 414, and the decoding in-progress results D414 are supplied to the respective calculators $415_1$ to $415_5$. Furthermore, five pieces of received data D417 (LDPC codes) are supplied to the calculation section 415 from the memory 417 for reception, and the pieces of received data D417 are supplied to the respective calculators $415_1$ to $415_5$. Furthermore, a control signal D422 is supplied to the calculation section 417 from the control section 417, and the control signal D422 is supplied to the calculators $415_1$ to $415_5$. The control signal D422 is a signal common to the five calculators $417_1$ to $417_5$.

The calculators $415_1$ to $415_5$ each perform the second computation in accordance with equation (5) by using the decoding in-progress results D414 and the received data D417, and determine decoding in-progress results D415. The calculation section 415 supplies the five decoding in-progress results D415 (v) obtained as a result of the second computation by the calculators $415_1$ to $415_5$ to the memory 410 for storing decoding in-progress results. Furthermore, when the computation that is being performed currently is the final second computation, the calculation section 415 outputs the five decoding in-progress results D415, which are obtained as a result of the computation, as the final decoded results.

The memory 416 for reception stores, as received data D417, the reception LLR (log likelihood ratio), which is the 0-likeness value of the sign bit, which is calculated from the received value (the sign bit) received through the communication channel.

That is, at the first address of the memory 416 for reception, the received data D417 corresponding to the first column up to the fifth column of the check matrix from among the received data D417 corresponding to the column of the check matrix is stored. Then, at the second address, the received data D417 corresponding to the sixth column up to the tenth column of the check matrix is stored, and at the third address, the received data D417 corresponding to the 11th column up to the 16th column of the check matrix is stored. Hereafter, similarly, at the fourth address up to the 18th address, the received data D417 corresponding to the 17th column up to the 90th column is stored in units of five pieces of data.

Then, a memory 616 for reception reads the received data D417 which has already been stored in units of five pieces of data in the sequence necessary for the variable node computation, and supplies them to the calculation section 415.

The memory 416 for reception is formed by, for example, a single-port RAM capable of simultaneously reading and writing five pieces of received data. The amount of data stored in the memory 416 for reception, that is, the storage capacity necessary for the memory 315 for reception, is the multiplication value of the code length of the LDPC codes and the number of quantization bits of the received data. The number of words of the memory 416 for reception is 18, which is the value such that the code length of the LDPC codes, that is, 90, the number of columns of the check matrix, is divided by 5, the number of pieces of the received data D417 to be read simultaneously.

The control section 417 supplies a control signal D418 to the cyclic shift circuit 411 and supplies a control signal D419 to the calculation section 412 in order to control them, respectively. The control section 417 supplies a control signal D420 to the memory 413 for storing decoding in-progress results, supplies a control signal D421 to the cyclic shift circuit 414, and supplies a control signal D421 to the calculation section 415 so as to control them, respectively.

As a result of the data being circulated in the order of the memory 410 for storing decoding in-progress results, the cyclic shift circuit 411, the calculation section 412, the memory 413 for storing decoding in-progress results, the cyclic shift circuit 414, and the calculation section 415, the decoding apparatus 400 can perform one decoding. In the decoding apparatus 400, after decodings are performed repeatedly a predetermined number of times, the decoding in-progress results D415, which are the results of the second computation by the calculation section 415, are output as the final decoded results.

FIG. 21 is a block diagram showing an example of the configuration of a calculator $412_1$ of the calculation section 412 of FIG. 18.

In FIG. 21, a description is given of the calculator $412_1$, and the calculator $412_2$ to the calculator $412_5$ are also configured in the same way.

In FIG. 21, the calculator $412_1$, is shown by assuming that each of the decoding in-progress results ($u_{dv}$) obtained as a result of the first computation by the calculation section 412 at the previous time, together with the sign bit, is quantized to a total of six bits, and each of the decoding in-progress results (v) obtained as a result of the second computation by the calculator 415 is quantized to nine bits. Furthermore, a clock ck is supplied to the calculator $412_1$ of FIG. 21, and this clock ck is supplied to necessary blocks. Then, each block performs processing in synchronization with the clock ck.

Based on the control signal D419 supplied from the control section 417, the calculator $412_1$ of FIG. 21 performs a first computation in accordance with equation (7) and equation (8) by using the decoding in-progress results D413 ($u_{dv}$) obtained as a result of the first computation by the calculation section 412 at the previous time, which are read one-by-one from the memory 413 for storing decoding in-progress results, and decoding in-progress results D411 (v), which are read one-by-one from the cyclic shift circuit 411.

More specifically, one decoding in-progress result D411 from among the five 9-bit decoding in-progress results D411 (v) supplied from the cyclic shift circuit 411 is supplied to the calculator $412_1$. Also, one decoding in-progress result D413, which is the result of the computation by the calculation section 412 at the previous time, from among the five 6-bit decoding in-progress results D413($u_j$), which are the results of the computation by the calculation section 412 at the previous time, which are supplied from the memory 413 for storing decoding in-progress results, is supplied to the calculator $412_1$. The 9-bit decoding in-progress results D411 (v) and the 6-bit decoding in-progress results D413 ($u_{dv}$) are supplied to the subtractor 431. Furthermore, the control signal D419 is supplied to the calculator $412_1$ from the control section 417, and the control signal D419 is supplied to the selector 435 and the selector 442.

The subtractor 431 subtracts the 6-bit decoding in-progress result D413 ($u_j$) from the 9-bit decoding in-progress result D411 (v), and outputs the 6-bit subtracted value D431. That is, the subtractor 431 performs a computation in accordance with equation (8), and outputs the subtracted value D431 ($v_i$), which is the result of the computation.

A sign bit D432 (sign ($v_i$)) indicating the positive or negative sign of the highest-order bit from among the 6-bit subtracted value D431 output from the subtractor 431 is supplied to the EXOR circuit 440, and the absolute value D433 (|$v_i$|) of the five lower-order bits is supplied to the LUT 432.

The LUT 432 reads the 5-bit computation results D434 ($\phi$(|$v_i$|)) such that the computation of $\phi(v_i)$ in equation (7) is performed on the absolute value D433 (|$v_i$|), and supplies it to an adder 433 and an FIFO memory 438.

The adder 433 integrates the computation results D434 by adding together the computation results D434 (|$v_i$(|$v_i$|)) and the 9-bit value D435 stored in the register 434, and stores the 9-bit integrated value obtained as the result in the register 434 again. When the computation results for the absolute value D433 (|$v_i$|) determined from the decoding in-progress results D411 corresponding to all the 1s over one row of the check matrix are integrated, the register 434 is reset.

When the decoding in-progress results D411 over one row of the check matrix are read one-by-one and the integrated value such that the computation results D434 for one row are integrated is stored in the register 434, the control signal D419 supplied from the control section 417 changes from 0 to 1. For example, when the row weight is "9", the control signal D419 is "0" at the first to eighth clocks, and is "1" at the ninth clock.

When the control signal D419 is "1", the selector 435 selects the value stored in the register 434, that is, the 9-bit value D435 ($\Sigma\phi(|v_i|)$) from i=1 to i=$d_c$) such that $\phi(|v_i|)$ determined from the decoding in-progress results D411 (the decoding in-progress results v) corresponding to all the 1s over one row of the check matrix are integrated, and outputs the value as a value D436 to the register 436, whereby it is stored. The register 436 supplies the stored value D436 as a 9-bit value D437 to the selector 435 and the adder 437. When the control signal D419 is "0", the selector 435 selects the value D437 supplied from the register 436, and outputs the value to the register 436, whereby it is stored again. That is, until $\phi(|v_i|)$ determined from the decoding in-progress results D411 (the decoding in-progress results v) corresponding to all the 1s over one row of the check matrix are integrated, the register 436 supplies $\phi(|v_i|)$ integrated at the previous time to the selector 435 and the adder 437.

On the other hand, the FIFO memory 438 delays the computation result D434 ($\phi(|v_i|)$) output by the LUT 432 until a new value D437 ($\Sigma\phi(|v_i|)$) from i=1 to i=$d_c$) is output from the register 436, and supplies it as a 5-bit value D438 to the subtractor 437. The subtractor 437 subtracts the value D438 supplied from the FIFO memory 438, from the value D437 supplied from the register 436, and supplies the subtracted result as a 5-bit subtracted value D439 to the LUT 439. That is, the subtractor 437 subtracts, from the integrated value of $\phi(|v_i|)$ determined from the decoding in-progress results D411 (the decoding in-progress results v) corresponding to all the 1s over one row of the check matrix, the decoding in-progress results corresponding to the edges to be determined, that is, $\phi(|v_i|)$ determined from the decoding in-progress results D411 (the decoding in-progress results v) corresponding to predetermined 1s of the check matrix, and supplies the subtracted value ($\Sigma\phi(|v_i|)$) from (i=1 to i=$d_c$–1) as a subtracted value D439 to the LUT 439.

The LUT 439 outputs the 5-bit computation result D440 ($\phi^{-1}(\Sigma\phi(|v_i|))$) such that the computation of $\phi^{-1}(\Sigma\phi(|v_i|))$ in equation (7) is performed on the subtracted value D439 ($\Sigma\phi(|v_i|)$ from i=1 to i=$d_c$–1).

In parallel with the above processing, the EXOR circuit 440 performs a multiplication of sign bits by computing the exclusive OR of a 1-bit value D442 stored in the register 441 and the sign bit D432, and stores a 1-bit multiplication result D441 in the register 441 again. When the sign bit D432 determined from the decoding in-progress results D411 corresponding to all the 1s over one row of the check matrix is multiplied, the register 441 is reset.

When the multiplication results D441 ($\Pi$sign ($v_i$)) from i=1 to $d_c$) such that the sign bit D432 determined from the decoding in-progress results D411 corresponding to all the 1s over one row of the check matrix are stored in the register 441 is multiplied, the control signal D419 supplied from the control section 417 changes from "0" to "1".

When the control signal D419 is "1", the selector 442 selects the value stored in the register 441, that is, the value D442 ($\Pi$sign ($v_i$)) such that the sign bit D432 determined from the decoding in-progress results D411 corresponding to all the 1s over one row of the check matrix is multiplied, and outputs the value as a 1-bit value D443 to the register 443. The register 443 supplies the stored value D443 as a 1-bit value D444 to a selector 442 and an EXOR circuit 445. When the control signal D419 is "0", the selector 442 selects a value D444 supplied from the register 443, and outputs the value to the register 443, whereby it is stored again. That is, until the sign bit D432 determined from the decoding in-progress results D411 (the decoding in-progress results v) corresponding to all the 1s over one row of the check matrix is multiplied, the register 443 supplies the value stored at the previous time to the selector 442 and the EXOR circuit 445.

On the other hand, the FIFO memory 444 delays the sign bit D432 until a new value D444 ($\Pi$sign ($v_i$)) from i=1 to i=$d_c$) is supplied from the register 443 to the EXOR circuit 445, and supplies it as a 1-bit value D445 to the EXOR circuit 445. The EXOR circuit 445 divides the value D444 by the value D445 by computing the exclusive OR of the value D444 supplied from the register 443 and the value D445 supplied from the FIFO memory 444, and outputs the 1-bit divided result as a divided value D446. That is, the EXOR circuit 445 divides the multiplied value of the sign bit D432 (sign ($v_i$)) determined from the decoding in-progress results D411 corresponding to all the 1s over one row of the check matrix by the sign bit D432 (sign ($v_i$)) determined from the decoding in-progress results D411 corresponding to predetermined 1s of the check matrix, and outputs the divided value ($\Pi$sign ($v_i$)) from i=1 to i=$d_c$–1) as a divided value D446.

In the calculator $412_1$, a total of six bits, in which the 5-bit computation results D440 output from the LUT 439 are the five lower-order bits and the 1-bit divided value D446 output from the EXOR circuit 445 is the highest-order bit, is output as the decoding in-progress results D412 (the decoding in-progress results $u_j$).

As described above, in the calculator $412_1$, the computations of equation (7) and equation (8) are performed, and the decoding in-progress result $u_j$ is determined.

Since the maximum of the row weight of the check matrix of FIG. 15 is 9, that is, since the maximum number of the decoding in-progress results D411 (v) and the decoding in-progress results D413 ($u_{d_v}$) supplied to the calculator $412_1$ is 9, the calculator $412_1$ has an FIFO memory 438 for delaying nine computation results D434 ($\phi(|v_i|)$) determined from the nine decoding in-progress results D411, and an FIFO memory 444 for delaying nine sign bits D432. When the message of the row whose weight is less than 9 is to be calculated, the amount of the delay in the FIFO memory 438 and the FIFO memory 444 is reduced to the value of the weight of the row.

FIG. 22 is a block diagram showing an example of the configuration of a calculator $415_1$ of the calculation section 415.

In FIG. 22, a description is given of the calculator $415_1$, and the calculator $415_2$ to the calculator $415_5$ are also configured in the same way.

In FIG. 22, the calculator $415_1$ is shown by assuming that each decoding in-progress result ($u_j$) obtained as a result of the first computation by the calculator 412, together with the sign bit, is quantized to a total of six bits. Furthermore, a clock ck is supplied to the calculator $415_1$ of FIG. 22, and this clock ck is supplied to necessary blocks. Each block performs processing in synchronization with the clock ck.

Based on the control signal D422 supplied from the control section 417, the calculator $415_1$ of FIG. 22 performs a second computation in accordance with equation (5) by using the received data D417 (the received value $u_{0i}$) read one-by-one from the memory 416 for reception and the decoding in-progress results D414 ($u_j$) read one-by-one from the cyclic shift circuit 414.

More specifically, in the calculator 415$_1$, the 6-bit decoding in-progress results D414 (the decoding in-progress results $u_j$) corresponding to 1s of each row of the check matrix are read one-by-one from the cyclic shift circuit 414, and the decoding in-progress results D414 are supplied to the adder 471. Furthermore, in the calculator 415$_1$, the 6-bit received data D417 is read one-by-one from the memory 416 for reception, and is supplied to the adder 475. Furthermore, a control signal D422 is supplied to the calculator 415$_1$ from the control section 417, and the control signal D422 is supplied to the selector 473.

The adder 471 integrates the decoding in-progress results D414 by adding together the decoding in-progress results D414 (the decoding in-progress results $u_j$) and the 9-bit integrated value D471 stored in the register 472, and stores the 9-bit integrated value in the register 472 again. When the decoding in-progress results D414 corresponding to all the 1s over one row of the check matrix are integrated, the register 472 is reset.

When the decoding in-progress results D414 over one row of the check matrix are read one-by-one and the value such that the decoding in-progress results D414 for one row are integrated is stored in the register 472, the control signal D422 supplied from the control section 417 changes from "0" to "1". For example, when the weight of the column is "5", the control signal D422 is "0" at the first clock up to the fourth clock, and is "1" at the fifth clock.

When the control signal D422 is "1", the selector 473 selects the value stored in the register 472, that is, a 9-bit value 471 ($\Sigma u_j$ from j=1 to $d_v$) such that the decoding in-progress results D414 (the decoding in-progress results $u_j$) from all the edges over one row of the check matrix are integrated, and outputs the value to the register 474, whereby it is stored. The register 474 supplies the stored value D471 as a 9-bit value D472 to the selector 471 and the adder 475. When the control signal D422 is "0", the selector 473 selects the value D472 supplied from the register 474, and outputs the value to the register 474, whereby it is stored again. That is, until the decoding in-progress results D414 (the decoding in-progress results $u_j$) from all the edges over one row of the check matrix are integrated, the register 474 supplies the previously integrated value to the selector 473 and the adder 475.

The adder 475 adds together the 9-bit value D472 and the 6-bit received data D417 supplied from the memory 416 for reception, and outputs the 6-bit value obtained thereby as the decoding in-progress result D415 (the decoding in-progress results v).

As described above, in the calculator 415$_1$, the computation of equation (5) is performed, and the decoding in-progress result v is determined.

Since the maximum of the weights of the columns of the check matrix of FIG. 8 is 5, that is, since the maximum number of the decoding in-progress results $u_j$ supplied to the calculator 415$_1$ is 5, the calculator 415$_1$ adds together a maximum of five 6-bit decoding in-progress results $u_j$. Therefore, the output of the calculator 415$_1$ is a 9-bit value.

Figure 23:
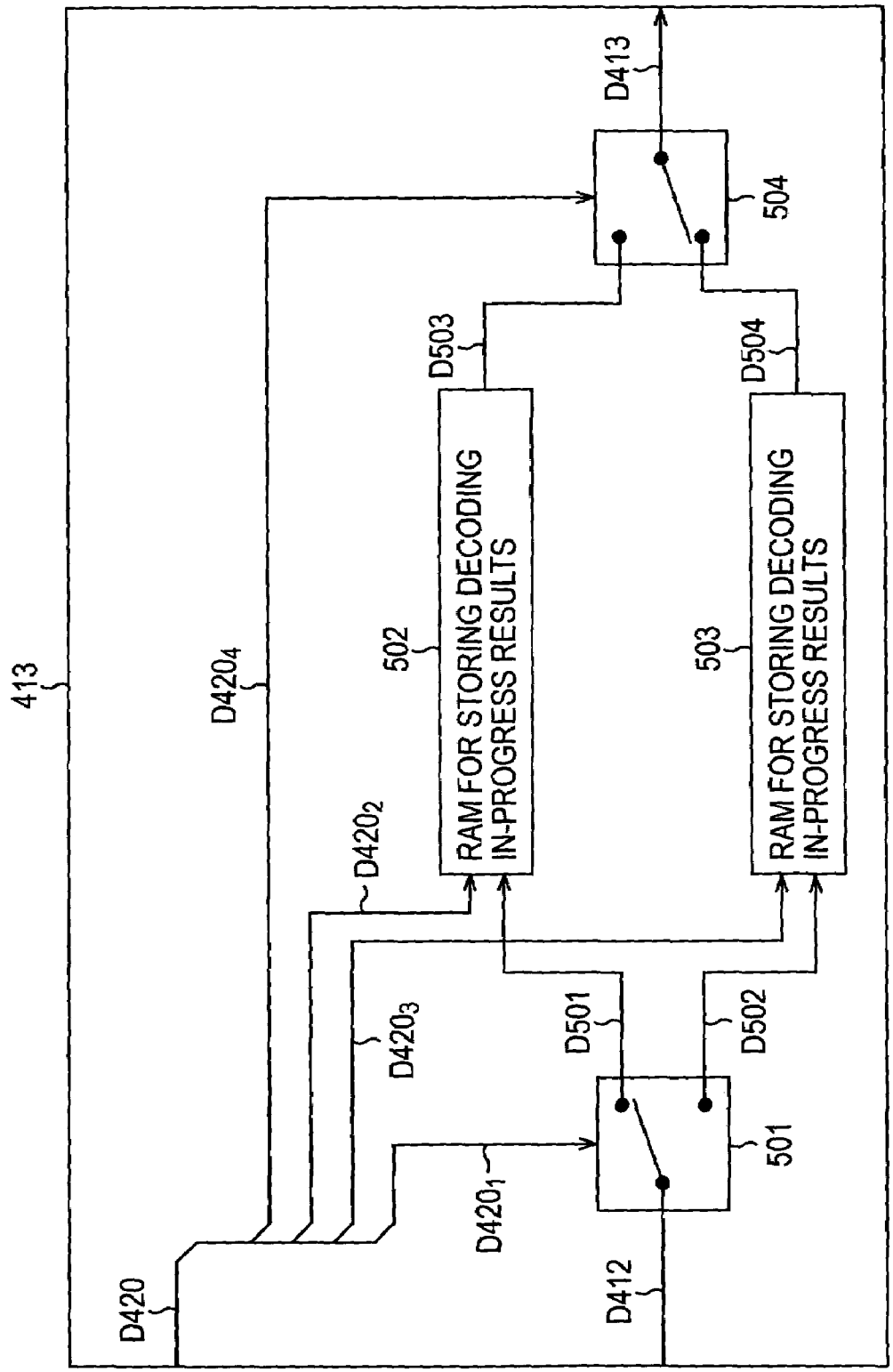
FIG. 23 is a block diagram showing an example of the configuration of a memory for storing decoding in-progress results of FIG. 18.

FIG. 23 is a block diagram showing an example of the configuration of the memory 413 for storing decoding in-progress results of FIG. 18.

The memory 413 for storing decoding in-progress results includes switches 501 and 504, and two RAMs 502 and 503 for storing decoding in-progress results, which are single-port RAMs.

Before describing in detail each section of the memory 413 for storing decoding in-progress results, the method of storing data in the RAMs 502 and 503 for storing decoding in-progress results will be described first.

The RAMs 502 and 503 for storing decoding in-progress results store the decoding in-progress results D412 that are obtained as a result of the first computation and that are supplied via a switch 501.

More specifically, at the first address up to the ninth address of the RAM 502 for storing decoding in-progress results, the decoding in-progress results D412 (D501) corresponding to 1s from the first row up to the fifth row of the check matrix H of FIG. 15 are stored in such a manner that they are packed closer (in a manner in which 0s are ignored) in the horizontal direction (in the column direction) for each row.

More specifically, when the j-th row and the i-th column is denoted as (j, i), at the first address of the RAM 502 for storing decoding in-progress results, data corresponding to 1s of the 5×5 unit matrix from (1, 1) to (5, 5), which is a sub-matrix of the check matrix of FIG. 15, is stored. At the second address, data corresponding to 1s of the shift matrix from (1, 21) to (5, 25) (a shift matrix in which the 5×5 unit matrix is cyclically shifted by three to the right), which is a sub-matrix of the check matrix of FIG. 15, is stored. Similarly, at the third address up to the eighth address, also, data is stored in such a manner as to correspond to the sub-matrix of the check matrix of FIG. 15. Then, at the ninth address, data corresponding to 1s of the shift matrix from (1, 86) to (5, 90) of the check matrix (the shift matrix in which 1s of the first row of the 5×5 unit matrix are substituted with 0s, and the unit matrix is cyclically shifted by one to the left) is stored. Here, in the shift matrix from (1, 86) to (5, 90) of the check matrix of FIG. 15, since is do not exist in the first row, data is not stored at the ninth address.

At the 10th address up to the 18th address of the RAM 502 for storing decoding in-progress, data corresponding to 1s from the 11th row up to the 15th row of the check matrix of FIG. 15 is stored. That is, at the 10th address, data corresponding to 1s of the matrix, in which the 5×5 unit matrix from (11, 6) to (15, 10) of the check matrix is cyclically shifted by three to the right, is stored. At the 11th address, data corresponding to 1s of the shift matrix making up the sum matrix (the sum matrix, which is the sum of the 5×5 unit matrix and the shift matrix in which the 5×5 unit matrix is cyclically shifted by three to the right) from (11, 11) to (15, 15) of the check matrix is stored. At the 12th address, data corresponding to 1s of the unit matrix making up the sum matrix from (11, 6) to (15, 10) of the check matrix is stored. Hereafter, also, at the 13th address up to the 18th address, data is stored in such a manner as to correspond to the check matrix.

More specifically, for the sub-matrix whose weight is 2 or more, data (the decoding in-progress results of the messages corresponding to the edges belonging to the unit matrix, the quasi-unit matrix, or the shift matrix) corresponding to the positions of 1s of the unit matrix whose weight is 1, the quasi-unit matrix, or the shift matrix when the sub-matrix is represented in the form of the sum of two or more of the (P×P) unit matrix whose weight is 1, the quasi-unit matrix in which one or more 1s, which are the elements of the unit matrix, are substituted with 0, and a shift matrix in which the unit matrix or the quasi-unit matrix is cyclically shifted is stored at the same address.

Similarly, at the 19th address up to the 27th address of the RAM 502 for storing decoding in-progress, data corresponding to 1s from the 21th row up to the 25th row is stored in such a manner as to correspond to the check matrix of FIG. 15. That is, the number of words of the RAM 502 for storing decoding in-progress results is 27.

At the first address up to the ninth address of a RAM 503 for storing decoding in-progress results, decoding in-progress results D412 (D502) corresponding to 1s from the sixth row up to the 10th row of the check matrix H of FIG. 15 are stored in such a manner that they are packed closer in the horizontal direction (in the column direction) for each row (in a manner in which 0s are ignored).

More specifically, at the first address of the RAM 503 for storing decoding in-progress results, data corresponding to 1s of the first shift matrix making up the sum matrix from (6, 1) to (10, 5) (the sum matrix, which is the sum of a first shift matrix in which the 5×5 unit matrix is cyclically shifted by one to the right and a second shift matrix in which the unit matrix is cyclically shifted by two to the right), which is a sub-matrix of the check matrix is stored. At the second address, data corresponding to 1s of the second shift matrix making up the sum matrix from (6, 1) to (10, 5), which is a sub-matrix of the check matrix, is stored. Hereafter, also, at the third address up to the ninth address, data is stored in such a manner as to correspond to the sub-matrix of the check matrix.

Similarly, at the 10th address up to the 18th address of the RAM 503 for storing decoding in-progress, data corresponding to 1s from the 16th row up to the 20th row of the check matrix of FIG. 15 is stored in such a manner as to correspond to the check matrix of FIG. 15. At the 19th address up to the 27th address, data corresponding to 1s from the 26th row up to the 30th row of the check matrix of FIG. 15 is stored in such a manner as to correspond to the check matrix of FIG. 15. That is, the number of words of the RAM 503 for storing decoding in-progress results is 27.

In the manner described above, the number of words of the RAMs 502 and 503 for storing decoding in-progress results is 27. That is, the number of words becomes a value such that 9, which is the row weight of the check matrix, is multiplied by 30, the number of rows, the multiplied result (the number of 1s of the check matrix) is divided by 5, the number of decoding in-progress results D501, which are read simultaneously, and further, the result is divided by 2, the number of RAM 502 for storing decoding in-progress results possessed by the memory 413 for storing decoding in-progress results.

A description will now be given in detail of the operation of each section of the memory 413 for storing decoding in-progress results of FIG. 23.

When the first computation is performed by the calculation section 412, the decoding in-progress results D412 ($u_j$) obtained as a result of the first computation are supplied from the calculation section 412 to the memory 413 for storing decoding in-progress results, and the decoding in-progress results D412 are written at a predetermined address of one of the RAM 502 for storing decoding in-progress results and the RAM 503 for storing decoding in-progress results. At the same time, the decoding in-progress results D412 ($u_j$) obtained as a result of the first computation by the calculation section 412 at the previous time is read from the other RAM, and are output to the calculation section 412. On the other hand, when the second computation is performed by the calculation section 415, the memory 413 for storing decoding in-progress results does not perform writing into the RAM 502 for storing decoding in-progress results or the RAM 503 for storing decoding in-progress results, reads the decoding in-progress results from a predetermined address of one of the RAMs, and supplies them to the cyclic shift circuit 414.

The five decoding in-progress results D412 are supplied from the calculation section 412 to the switch 501, and also, a control signal D420$_1$ indicating the selection of one of the RAM 502 for storing decoding in-progress results and the RAM 503 for storing decoding in-progress results as a memory for writing the decoding in-progress results D412 is supplied to the switch 501 from the control section 417. Based on the control signal D420$_1$, the switch 501 selects one of the RAM 502 for storing decoding in-progress results and the RAM 503 for storing decoding in-progress results, and supplies the five decoding in-progress results D412 to the selected RAM.

The five decoding in-progress results D412 are supplied as decoding in-progress results D501 to the RAM 502 for storing decoding in-progress results from the switch 501, and also, a control signal D420$_2$ indicating the address is supplied thereto from the control section 417. The RAM 502 for storing decoding in-progress results reads the five decoding in-progress results D501 obtained as a result of the first computation by the calculation section 412 at the previous time, which are already stored at the address indicated by the control signal D402$_2$, and supplies them as decoding in-progress results D503 to the switch 504. Furthermore, the RAM 502 for storing decoding in-progress results stores (writes) the five decoding in-progress results D501 supplied from the switch 501 at the address indicated by the control signal D402$_2$.

The five decoding in-progress results D412 are supplied as decoding in-progress results D502 to the RAM 503 for storing decoding in-progress results from the switch 501, and also, a control signal D420$_3$ indicating the address is supplied to the RAM 503 from the control section 417. The RAM 503 for storing decoding in-progress results reads the five decoding in-progress results D502 obtained as a result of the first computation by the calculation section 412 at the previous time, which have already been stored at the address indicated by the control signal D420$_3$, and supplies them as decoding in-progress results D504 to the switch 504. Furthermore, the RAM 502 for storing decoding in-progress results stores (writes) the five decoding in-progress results D502 supplied from the switch 501 at the address indicated by the control signal D420$_3$.

The decoding in-progress results D503 are supplied to the switch 504 from the RAM 502 for storing decoding in-progress results or the decoding in-progress results D504 are supplied to the switch 504 from the RAM 503 for storing decoding in-progress results. Furthermore, a control signal D420$_4$ indicating the selection one of the RAM 502 for storing decoding in-progress results and the RAM 503 for storing decoding in-progress results is supplied to the switch 504 from the control section 417. Based on the control signal D420$_1$, the switch 504 selects one of the RAM 502 for storing decoding in-progress results and the RAM 503 for storing decoding in-progress results, and supplies the five decoding in-progress results supplied from the selected RAM, as the five decoding in-progress results D413, to the calculation section 412 and the cyclic shift circuit 414.

Figure 24:
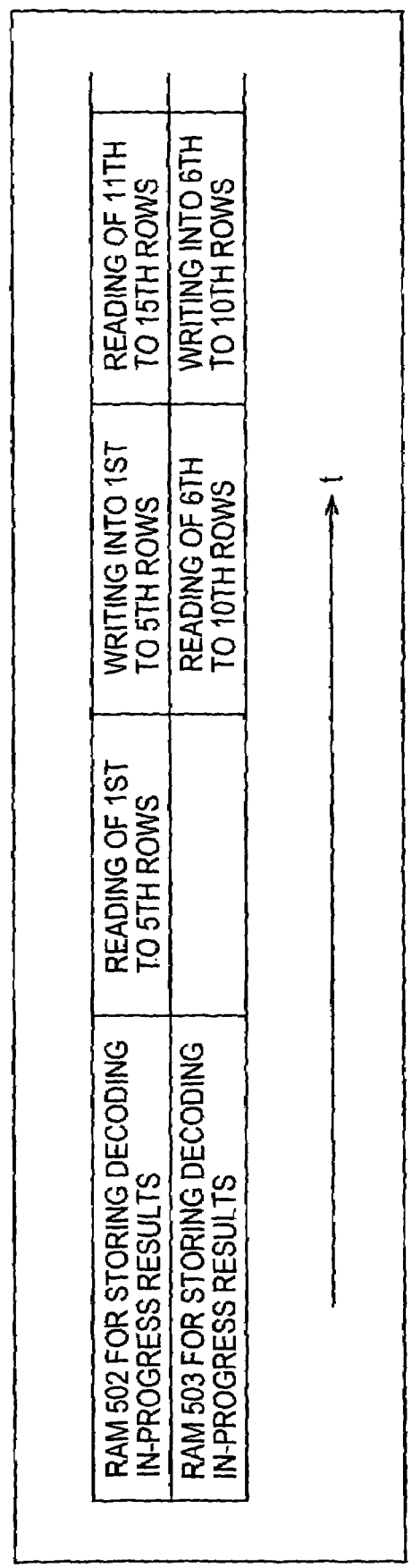
FIG. 24 is a timing chart illustrating the operation of a RAM for storing decoding in-progress results of FIG. 18.

FIG. 24 is a timing chart illustrating reading and writing operations of the RAM 502 for storing decoding in-progress results and the RAM 503 for storing decoding in-progress results of the memory 413 for storing decoding in-progress results.

In FIG. 24, the horizontal axis indicates time (t).

In the memory 413 for storing decoding in-progress results, when the first computation is to be performed by the calculation section 412, based on the control signal D420$_2$, the RAM 502 for storing decoding in-progress results reads nine times decoding in-progress results D501 corresponding to 1s from the first row up to the fifth row of the check matrix, which are stored at the same address, from among the decoding in-progress results D501 obtained as a result of the first computation by the calculation section 412 at the previous time, which are already stored, in units of five results, and supplies them to the calculation section 412 via the switch 504. That is, since the row weight of the check matrix H of FIG. 15 is 9, there are nine decoding in-progress results corresponding to 1s of each row of the check matrix H, and the RAM 502 for storing decoding in-progress results reads nine times the five decoding in-progress results D501 corresponding to 1s from the first row to the fifth row in units of five results.

Next, based on the control signal D420$_3$, the RAM 503 for storing decoding in-progress results reads continuously nine times the decoding in-progress results D502 corresponding to 1s from the sixth row to the 10th row, which are stored at the same address, from among the decoding in-progress results D502 obtained as a result of the first computation by the calculation section 412 at the previous time, which are already stored, in units of five results, and supplies them to the calculation section 412 via the switch 504. At the same time, the five decoding in-progress results D412 corresponding to 1s from the first row to the fifth row of the check matrix, which are obtained as a result of the first computation that is being performed currently by the calculation section 412 are supplied as the decoding in-progress results D501 to the RAM 502 for storing decoding in-progress results via the switch 501. Based on the control signal D420$_2$, the RAM 502 for storing decoding in-progress results continuously stores nine times the decoding in-progress results D501 at the address at which the already read decoding in-progress results D503 are stored.

Thereafter, based on the control signal D420$_2$, the RAM 502 for storing decoding in-progress results continuously reads nine times the decoding in-progress results D501 corresponding to 1s from the 11th row up to the 15th row of the check matrix, which are stored at the same address, from among the already stored decoding in-progress results D501 obtained as a result of the first computation by the calculation section 412 at the previous time, in units of five results, and supplies them to the calculation section 412 via the switch 504. At the same time, five decoding in-progress results D412 corresponding to 1s from the sixth row up to the 10th row of the check matrix, which are obtained as a result of the first computation that is being currently performed by the calculation section 412, are supplied as the decoding in-progress results D502 to the RAM 503 for storing decoding in-progress results via the switch 501. Based on the control signal D420$_3$, the RAM 503 for storing decoding in-progress results continuously stores nine times the decoding in-progress results D502 at the address at which the already read decoding in-progress results D504, are stored.

Hereafter, similarly, until the decoding in-progress results corresponding to all the 1s of the check matrix, which are obtained as a result of the first computation by the calculation section 412, are stored in the RAM 502 for storing decoding in-progress results or the RAM 503 for storing decoding in-progress results, the RAM 502 for storing decoding in-progress results and the RAM 503 for storing decoding in-progress results alternately perform the reading or writing in units of nine times.

In the memory 413 for storing decoding in-progress results, when the second computation is performed by the calculation section 415, based on the control signal D420$_2$, the already stored decoding in-progress results D503, which are obtained as a result of the first computation, from the RAM 502 for storing decoding in-progress results, or based on the control signal D420$_3$, the already stored decoding in-progress results D504 obtained as a result of the first computation, are read from the RAM 503 for storing decoding in-progress results, and the read-out decoding in-progress results are supplied to the cyclic shift circuit 414 via the switch 504.

Figure 25:
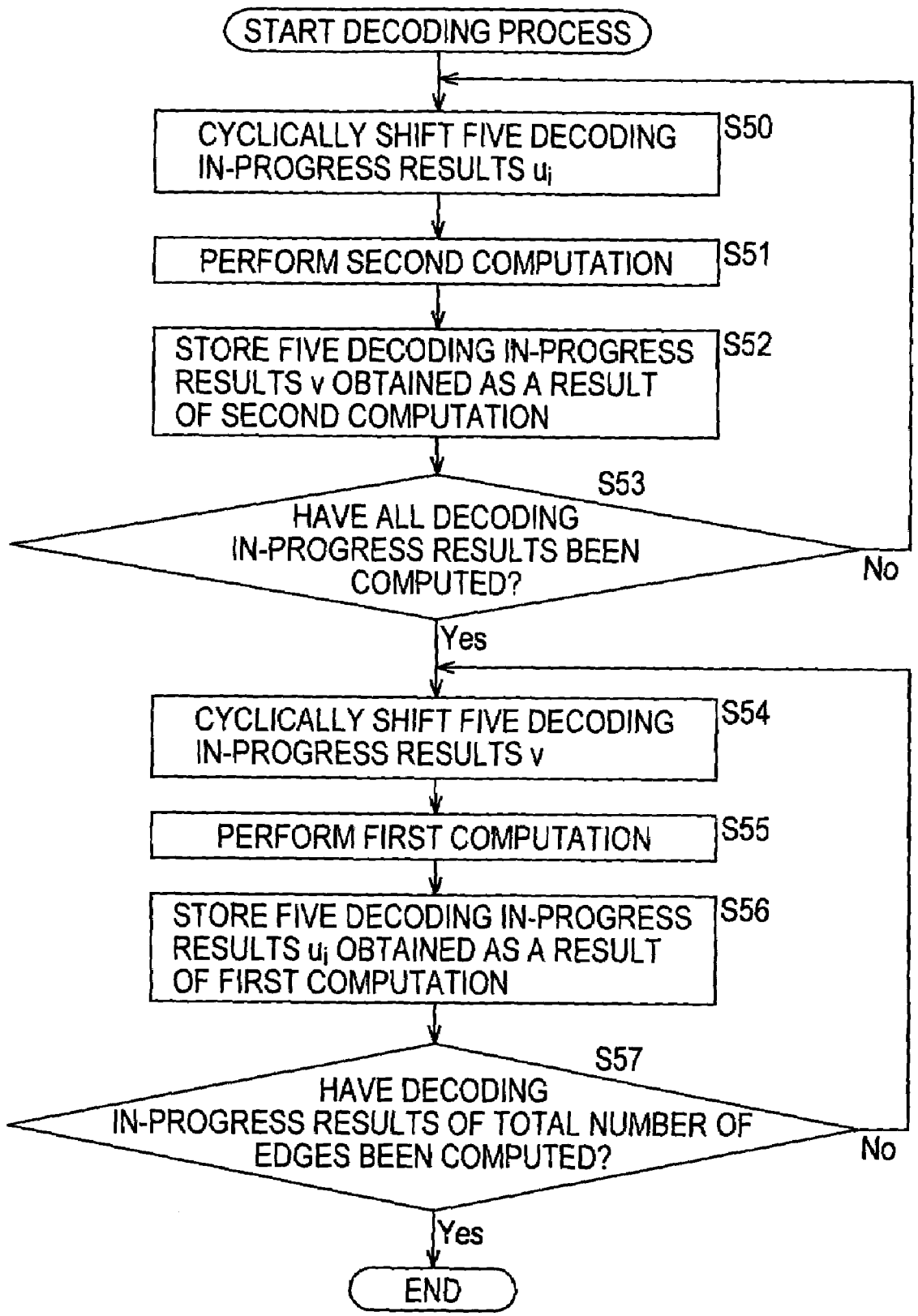
FIG. 25 is a flowchart illustrating the decoding process of the decoding apparatus of FIG. 18.

FIG. 25 is a flowchart illustrating the decoding process of the decoding apparatus 400 of FIG. 18. This process is started, for example, when received data to be decoded is stored in the memory 416 for reception.

In step S50, the cyclic shift circuit 414 cyclically shifts the five decoding in-progress results D413 to be stored in step S56 (to be described later), which are supplied from the memory 413 for storing decoding in-progress results, and supplies them to the calculation section 415.

More specifically, five decoding in-progress results D413 are supplied to the cyclic shift circuit 414 from the memory 413 for storing decoding in-progress results, and also, a control signal D421 indicating information (matrix data) as to the fact that 1s of the check matrix, which corresponds to the decoding in-progress results D413, are arranged as a result of how many times, for example, the unit matrix forming the basis in the check matrix is cyclically shifted, is supplied to the cyclic shift circuit 414 from the control section 417. Based on the control signal D421, the cyclic shift circuit 414 cyclically shifts (rearranges) the five decoding in-progress results D413, and supplies the results as decoding in-progress results D414 to the calculation section 415.

When the first computation has not yet been performed on the received data D417 supplied to the memory 416 for reception and the decoding in-progress results D413 are not stored in the memory 413 for storing decoding in-progress results, the calculation section 415 sets the decoding in-progress results $u_j$ to an initial value.

In step S51, the calculation section 415 performs the second computation, and supplies the decoding in-progress results D415, which are the results of the computation, to the memory 410 for storing decoding in-progress results.

More specifically, in step S50, the five decoding in-progress results D414 are supplied to the calculation section 415 from the cyclic shift circuit 414, and also, five received data D417 are supplied to the calculation section 415 from the memory 416 for received data. The decoding in-progress results D415 and the received data D417 are supplied individually to each of the calculators 415$_1$ to 415$_5$ of the calculation section 415. Furthermore, a control signal D422 is supplied to the calculation section 415 from the control section 417, and the control signal D422 is supplied to the calculator 415$_1$ to 415$_5$.

Based on the control signal D422, the calculators 415$_1$ to 415$_5$ each perform a computation in accordance with equation (5) by using the decoding in-progress results D414 and the received data D417, and supply the decoding in-progress results D415 (v) corresponding to the column of the check matrix, which are obtained as a result of the computation, to the memory 410 for storing decoding in-progress results.

After the processing of step S51, the process proceeds to step S52, where the memory 410 for storing decoding in-progress results stores the decoding in-progress results D415 supplied from the calculation section 415 in step S51 at the same address, and the process then proceeds to step S53.

In step S53, the control section 417 determines whether or not all the decoding in-progress results D415 corresponding to the columns of the check matrix have been computed by the calculation section 415. When it is determined that all the decoding in-progress results D415 have not been computed, the process returns to step S50, and the above-described processing is performed again.

On the other hand, when the control section 417 determines in step S53 that all the decoding in-progress results D415 corresponding to the column of the check matrix have been computed by the calculation section 415, the process proceeds to step S54, where the cyclic shift circuit 411 cyclically shifts the decoding in-progress results D410 (v) supplied from the memory 410 for storing decoding in-progress results.

More specifically, five decoding in-progress results D410 are supplied to the cyclic shift circuit 411 from the memory 410 for storing decoding in-progress results. Also, a control signal D418 indicating information (matrix data) as to the fact that 1s of the check matrix, which corresponds to the decoding in-progress results D410, are arranged as a result of how many times, for example, the unit matrix forming the basis in the check matrix is cyclically shifted, is supplied to the cyclic shift circuit 411 from the control section 417. Based on the control signal D418, the cyclic shift circuit 411 cyclically shifts (rearranges) the five decoding in-progress results D410, and supplies them as the decoding in-progress results D411 to the calculation section 412.

After the processing of step S54, the process proceeds to step S55, where the calculation section 412 performs the first computation, and supplies the decoding in-progress results D412, which are the computation results, to the cyclic shift circuit 414.

More specifically, the five decoding in-progress results D411 (v) are supplied to the calculation section 412 from the cyclic shift circuit 411 in step S54. Also, the five decoding in-progress results D412 (D413) ($u_j$) obtained as a result of the first computation by the calculation section 412 at the previous time, which are already stored in step S56 (to be described later), are supplied to the calculation section 412. The decoding in-progress results D411 and the decoding in-progress results D413 are supplied individually to each of the calculators $412_1$ to $412_5$ of the calculation section 412. Furthermore, a control signal D419 is supplied to the calculation section 412 from the control section 417, and the control signal D419 is supplied to the calculator $412_1$ to $412_5$.

Based on the control signal D419, the calculators $412_1$ to $412_5$ each perform computations in accordance with equation (7) and equation (8) by using the decoding in-progress results D411 and the decoding in-progress results D413, and supply the decoding in-progress results D412 ($u_j$) obtained as a result of the computation to the memory 413 for storing decoding in-progress results.

After the processing of step S55, the process proceeds to step S56, where the memory 413 for storing decoding in-progress results stores at the same address the five decoding in-progress results D412 supplied from the calculation section 412 in step S55, and the process then proceeds to step S57.

In step S57, the control section 417 determines whether or not the decoding in-progress results D412 corresponding to all the 1s of the check matrix have been computed by the calculation section 412. When it is determined that all the 1s of the check matrix have not been computed, the process returns to step S54, and the above-described processing is performed again.

On the other hand, when the control section 417 determines in step S57 that the decoding in-progress results D412 corresponding to all the 1s have been computed by the calculation section 412, the processing is completed.

The decoding apparatus 400 repeatedly performs the decoding process of FIG. 25 for the number of decodings, and the message D415 obtained as a result of the final second computation is output as the final decoded results.

In the above description, although the memory 413 for storing decoding in-progress results is formed from two single-port RAMs, it may be formed from three or more RAMs if reading and writing do not occur simultaneously from and to one RAM. When the physical bit width of the RAM is not sufficient, by providing the same control signal by using a plurality of RAMs, these can be logically assumed as one RAM.

For the portions in which edge data (messages corresponding to edges) lacks, during the storage in the memory (when data is stored in the memories 410 and 413 for storing decoding in-progress results), no message is stored, and during the computation (during the first computation at the calculation section 412 and during the second computation at the calculation section 415), no computation is performed.

Figure 26:
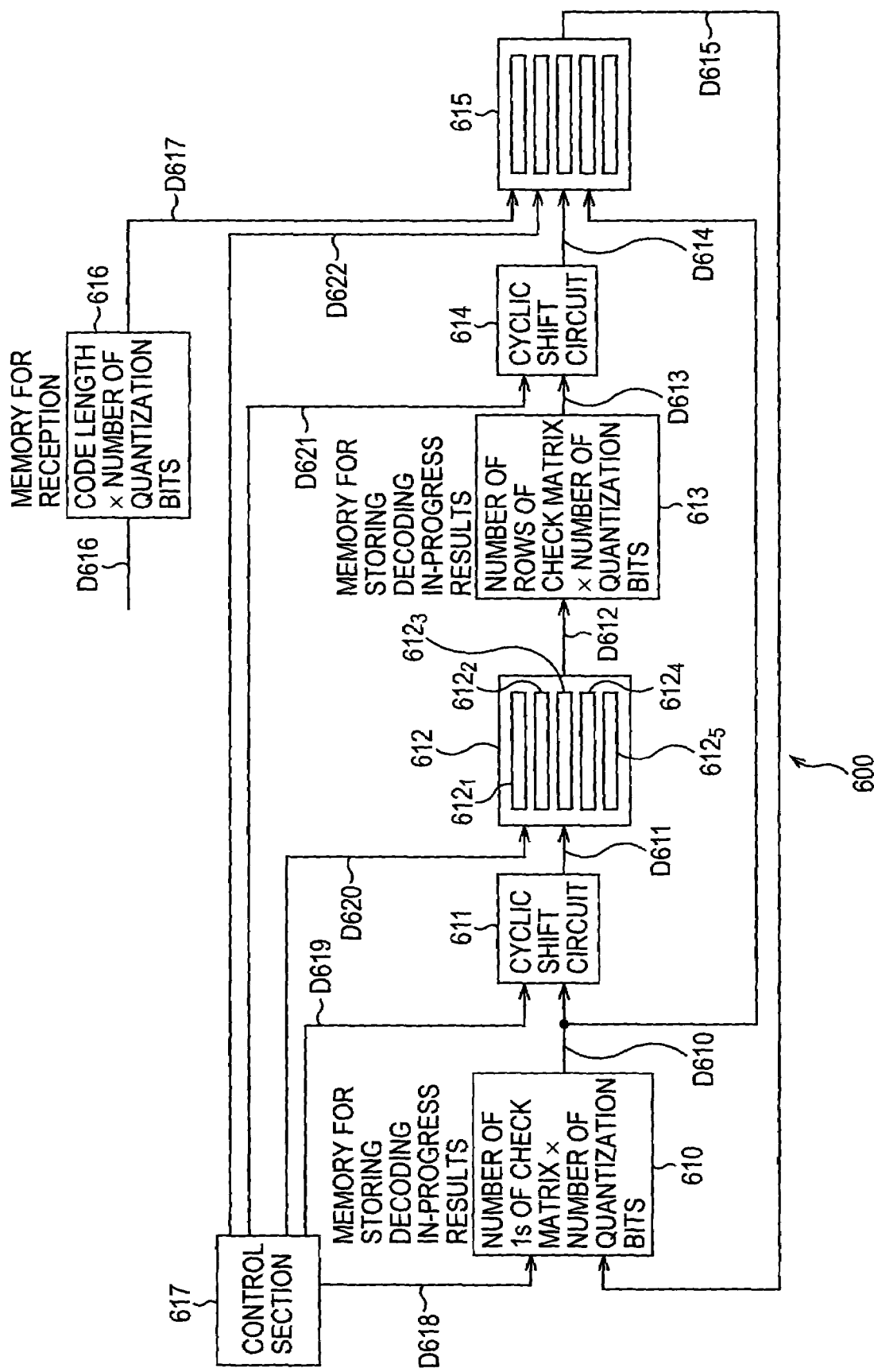
FIG. 26 is a block diagram showing an example of the configuration of an embodiment of the decoding apparatus to which the present invention is applied.

FIG. 26 is a block diagram showing an example of the configuration of another embodiment of the decoding apparatus for decoding LDPC CODES represented by the check matrix of FIG. 15, to which the present invention is applied.

In a decoding apparatus 600 of FIG. 26, the edge data storage memory 316 of FIGS. 16A and 16C is formed as a memory 613 for storing decoding in-progress results having a capacity smaller than that of the edge data storage memory 316.

The decoding apparatus 600 includes a memory 610 for storing decoding in-progress results, a cyclic shift circuit 611, a calculation section 612 made up of five calculators $612_1$ to $612_5$, a memory 613 for storing decoding in-progress results, a cyclic shift circuit 614, a calculation section 615 made up of five calculators $615_1$ to $615_5$, a memory 616 for reception, and a control section 617.

Figure 28:
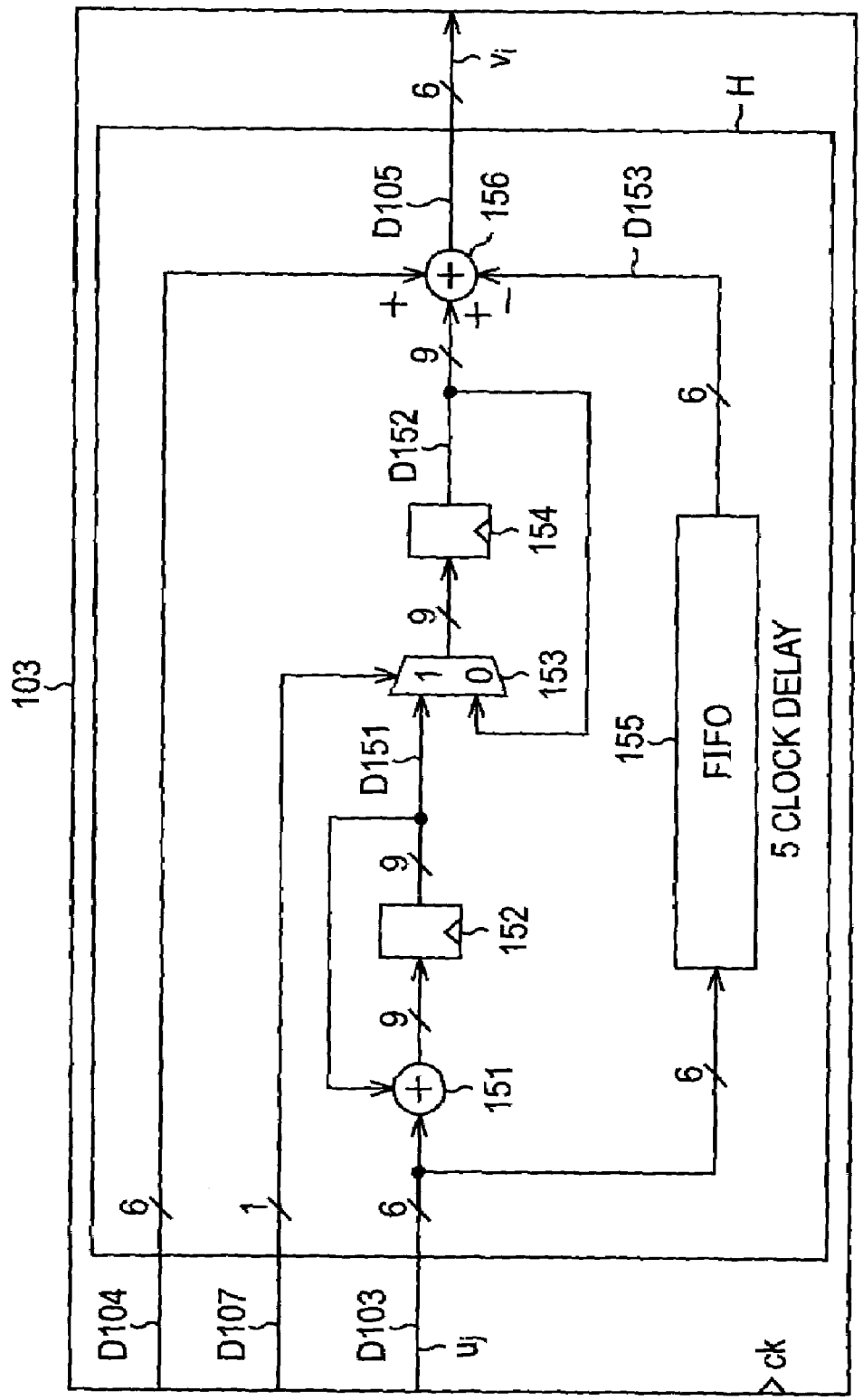
FIG. 28 is a block diagram showing an example of the configuration of a variable node calculator.
Figure 29:
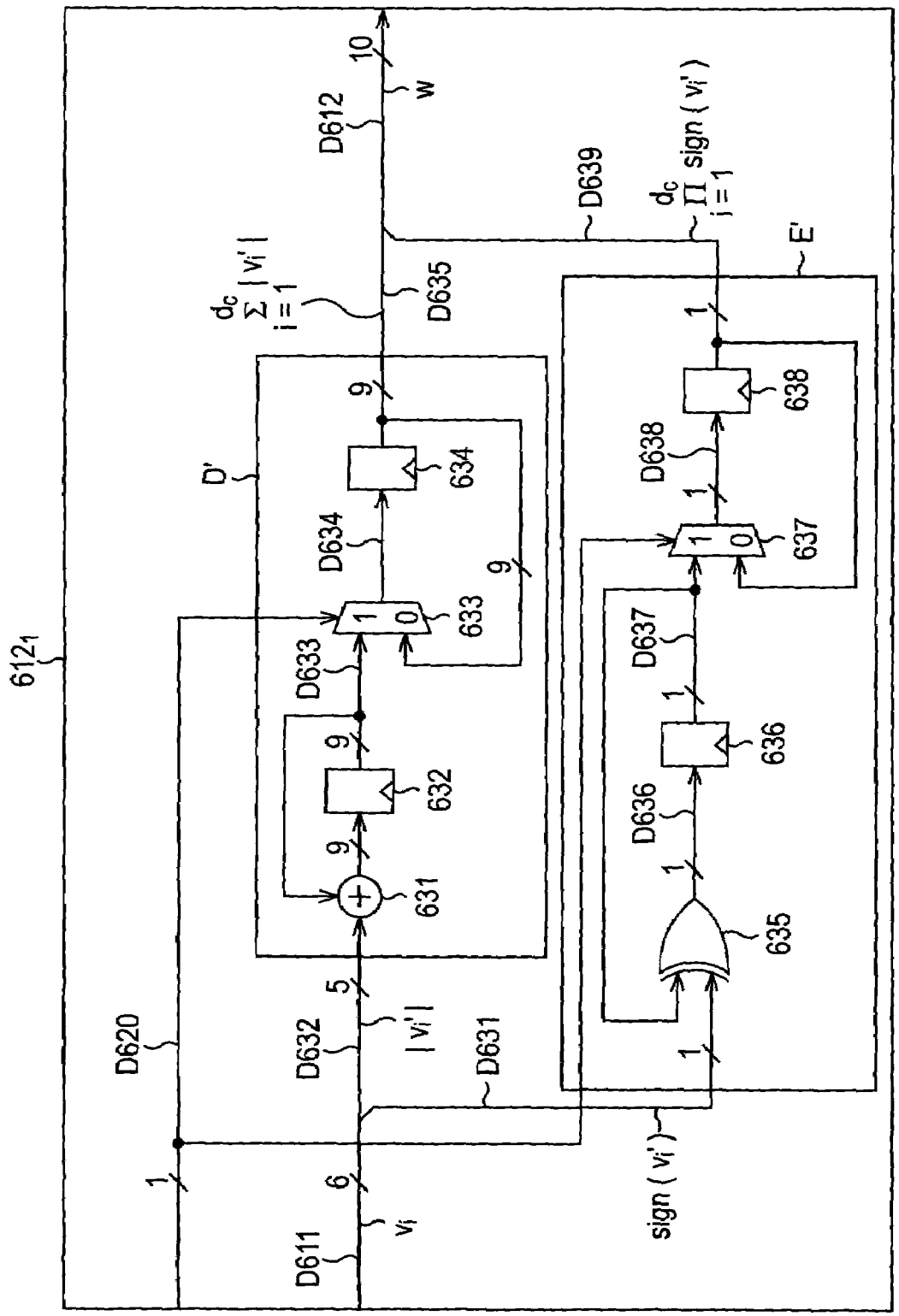
FIG. 29 is a block diagram showing an example of the configuration of a calculator of FIG. 26.
Figure 30:
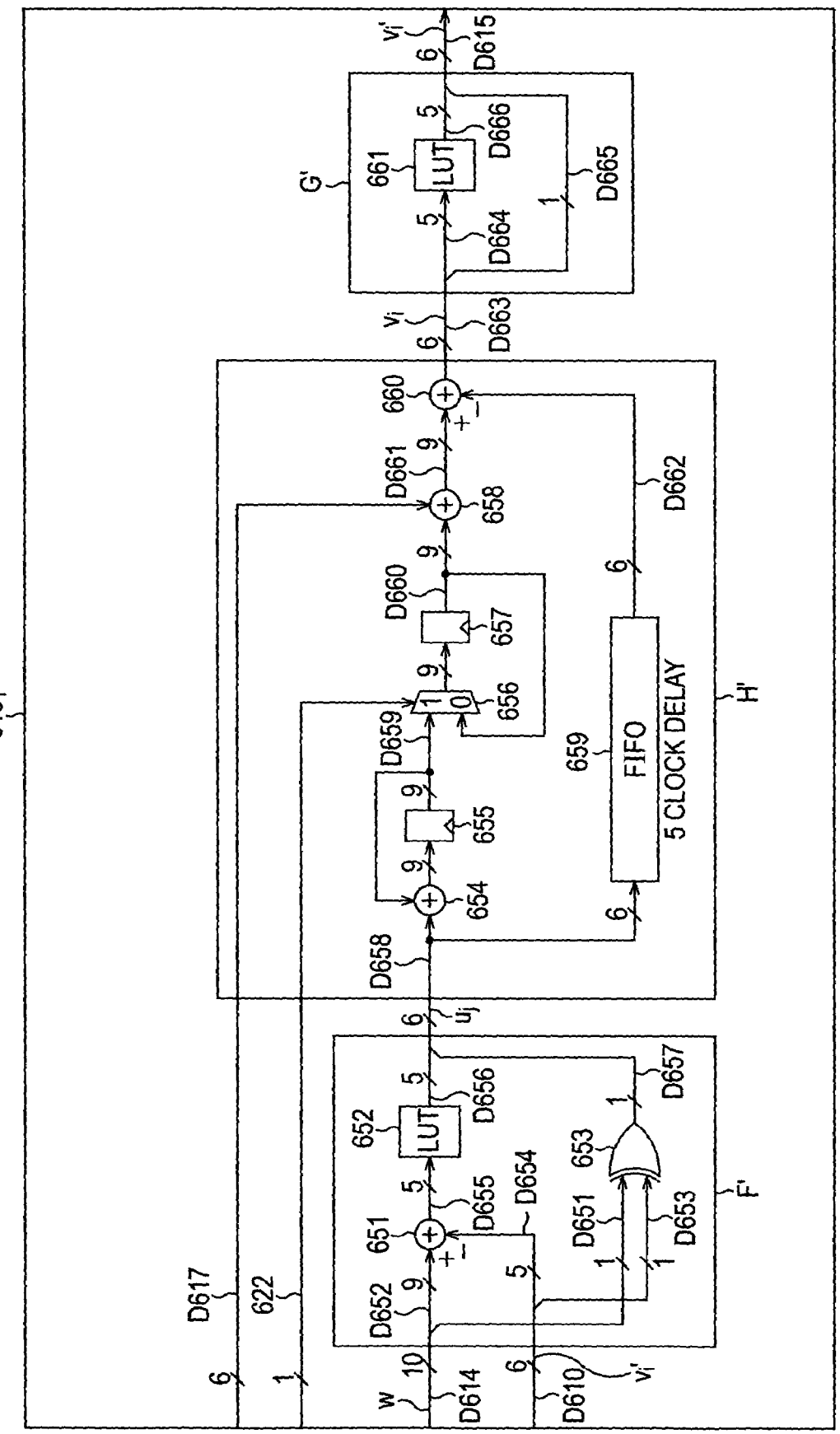
FIG. 30 is a block diagram showing an example of the configuration of the calculator of FIG. 26.

Referring to FIG. 27 to FIG. 30, a description is given of the relationship among the calculator $612_1$ to the calculator $612_5$ of the calculation section 612 of FIG. 26, the calculator $615_1$ to calculator $615_5$ of the calculation section 615 of FIG. 30, the check node calculator 101 of FIG. 10, and the variable node calculator 103 of FIG. 11.

Figure 27:
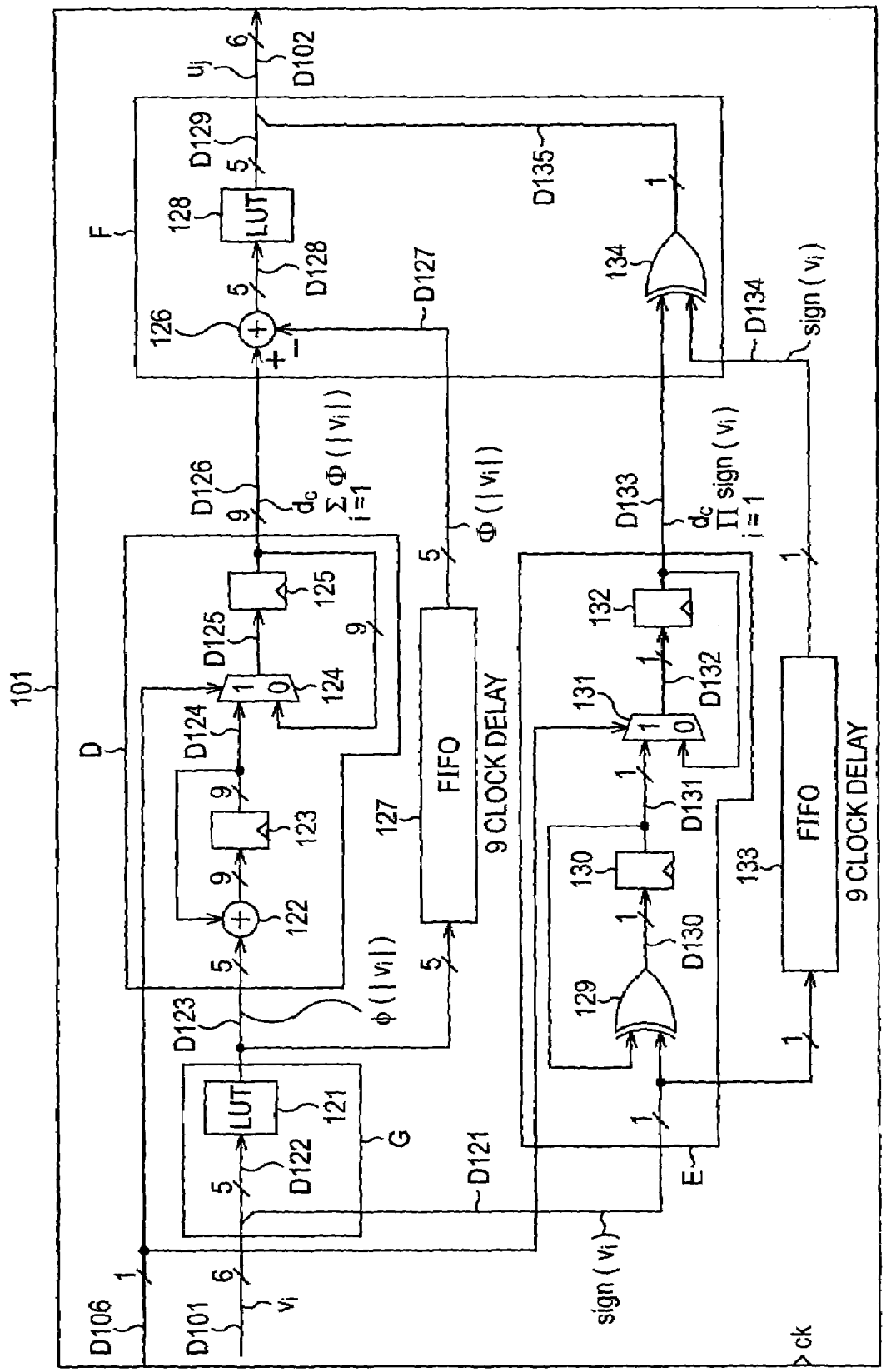
FIG. 27 is a block diagram showing an example of the configuration of a check node calculator.

FIG. 27 and FIG. 28 are the same as FIG. 10 described above showing the check node calculator 101 and FIG. 11 described above showing the variable node calculator 103, respectively. FIG. 29 shows an example of the configuration of a calculator $612_k$ (k=1, 2, . . . , 5). FIG. 30 shows an example of the configuration of a calculator $615_k$ (k=1, 2, . . . , 5).

In the decoding apparatus 600 of FIG. 26, rather than the calculator $612_k$ performs the check node computation and the calculation section $615_k$ performs the variable node computation, the calculator $612_k$ performs some of the check node computation, and the calculator $615_k$ performs some of the others of the check node computation and some of the variable node computation.

More specifically, the calculator $612_k$ of FIG. 29 is formed of blocks D' and E'. The block D' is configured in the same way as the block D for integrating values such that the computations of $\phi$ are performed on the absolute values of the messages $v_i$ corresponding to all the edges of each column of the check matrix, the block D being a part of the check node calculator 101 of FIG. 27. The block E' is configured in the same way as the block E for multiplying the sign bits of the messages $v_i$ corresponding to all the edges of each column of the check matrix.

On the other hand, the calculator $615_k$ of FIG. 30 is formed of blocks F', G', and H'. The block F' is configured in the same way as the block F for dividing the multiplied value of the sign bits of the messages $v_i$ corresponding to all the edges of each column of the check matrix by the sign bit of the message $v_i$ corresponding to the edge to be determined and for performing the computation of $\phi^{-1}$ on the value obtained by subtracting the value such that the computation of $\phi$ is performed on the absolute value of the message $v_i$ corresponding to the each to be determined from the integrated value of the values such that the computation $\phi$ is performed on the absolute values of the message $v_i$ corresponding to all the edges of each column of the check matrix, the block F' being another part of the check node calculator 101 of FIG. 19. The block G' is configured in the same way as the block G for performing the computation of $\phi$ on the absolute value of the message $v_i$. The block H' is configured in the same way as the block H for performing the variable node computation of the variable node calculator 103 of FIG. 20.

The calculator $612_k$ of FIG. 29 supplies the computation results by the block A and the block B, that is, decoding in-progress results w such that some of the check node computation are performed, to the memory 613 for storing decoding in-progress results. The calculator $615_k$ of FIG. 30 supplies decoding in-progress results $v_i'$ such that some of the others of the check node computation and the variable node computation are performed to the memory 610 for storing decoding in-progress results.

Therefore, it is possible for the decoding apparatus 600 of FIG. 26 to perform the check node computation and the variable node computation by alternately performing the computation of the calculator $612_k$ and the computation of the calculator $615_k$ in order to perform decoding.

In the calculator $615_k$ of FIG. 30, by using the decoding in-progress results $v_i'$ corresponding to the edge to be determined, which are stored in the memory 610 for storing decoding in-progress results, the block C subtracts the decoding in-progress results $v_i'$ corresponding to the edge to be determined, from the absolute value of the decoding in-progress results w obtained as a result of the computation of the calculator $612_k$, and multiplies the sign bit of the decoding in-progress results w by the sign bit of the decoding in-progress results $v_i'$ corresponding to the edge to be determined. Therefore, the memory 127 and the FIFO memory 133 of FIG. 27 are not required.

Next, by using equations, a description is given of the computations performed by the calculator $612_1$ to the calculator $612_5$ of the calculation section 612 and the computations performed by the calculator $615_1$ to the calculator $615_5$ of the calculation section 615.

The calculation section 612 performs a first computation in accordance with equation (9), and supplies the decoding in-progress results w, which are the results of the first computation, to the memory 613 for storing decoding in-progress results, whereby they are stored. The calculation section 615 performs the above-described equation (1) and the second computation in accordance with equations (10) and (11), and supplies decoding in-progress results $v_i'$, which are the results of the second computation, to the memory 610 for storing decoding in-progress results, whereby they are stored.

$$w = \sum_{i=1}^{d_c} |v_i'| \times \prod_{i=1}^{d_c} \text{sign}(v_i') \quad (9)$$

$$u_j = \phi^{-1}(|w|-|v_i'|) \times \text{sign}(v_i') \times \text{sign}(w) \quad (10)$$

$$v_i' = \phi(|v_i|) \times \text{sign}(v_i) \quad (11)$$

More specifically, the decoding in-progress results w obtained as a result of the first computation in accordance with equation (9) are such that the total sum of the absolute values $|v_i'|$ of the decoding in-progress results $v_i'$ of the check node computation, corresponding to all the 1s of the j-th row of the check matrix H, which are obtained as a result of the second computation in accordance with equation (1), equation (10), and equation (11), and the sign bit sign ($v_i'$) are multiplied together. Therefore, as shown in equation (10), $u_j$ obtained by the check node computation in accordance with equation (7) can be expressed by using a value such that the absolute value $|v_i'|$ of the decoding in-progress results $v_i'$, corresponding to the edge to be determined, from among (a plurality of) decoding in-progress results $v_i'$ corresponding to "1s" (edges) of each column, of the j-th row of the check matrix H, is subtracted from the absolute values $|w|$ of the decoding in-progress results w, which are obtained as a result of the first computation in accordance with equation (9).

In the decoding apparatus 600, the first computation in accordance with the equation (9) by the calculation section 612, and the second computation in accordance with equation (1), equation (10), and equation (11) are alternately performed, and the calculation section 615 performs a computation in accordance with equation (5) by using the results of the final first computation, and outputs the computation results as the decoded results, thereby performing iterative decodings of LDPC codes.

More specifically, in the decoding apparatus 600, the calculation section 612 performs the first computation by using the decoding in-progress results $v_i'$ corresponding to all the 1s of the j-th row of the check matrix H, which are the results of the second computation by the calculation section 615, and stores the decoding in-progress results w corresponding to each row of the check matrix, which are obtained as a result of the computation, in the memory 613 for storing decoding in-progress results. Therefore, the capacity of the memory 613 for storing decoding in-progress results becomes a value such that the number of rows of the check matrix, which is smaller than the number of "1s" of the check matrix, and the number of quantization bits of the decoding in-progress results w are multiplied together. The calculation section 615 performs the second computation by using the decoding in-progress results w corresponding to each row of the i-th column of the check matrix H, which are the results of the first computation by the calculation section 612, and the received value $u_{0i}$, and stores the decoding in-progress results $v_i'$ of the check node computation corresponding to 1s (edges) of the i-th column of the check matrix, which are obtained as a result of the computation, in the memory 610 for storing decoding in-progress results. Therefore, the capacity necessary for the memory 610 for storing decoding in-progress results becomes a value such that the number of 1s of the check matrix and the number of quantization bits of the decoding in-progress results $v_i'$ are multiplied together similarly to the edge data storage memory 311 of FIGS. 16A and 16B for storing the results of the variable node computation.

Therefore, in the decoding method 600, when compared to the edge data storage memory 311 of FIGS. 16A and 16B, the capacity of the memory of the memory 610 for storing decoding in-progress results can be reduced. This makes it possible to reduce the circuit scale of the decoding apparatus 600.

The operation of each section of the decoding apparatus 600 of FIG. 26 is described below in detail.

Based on a control signal D618, the memory 610 for storing decoding in-progress results collectively stores the five decoding in-progress results D615 supplied from the calculation section 615, and at the same time, reads the five already stored decoding in-progress results D615, and supplies them as decoding in-progress results D610 to the cyclic shift circuit 611 and the calculation section 615. That is, the memory 610 for storing decoding in-progress results simultaneously performs the reading of the decoding in-progress results D610 to be supplied to the cyclic shift circuit 611 and the writing of the decoding in-progress results D615 supplied from the calculation section 615.

In the memory 610 for storing decoding in-progress results, the decoding in-progress results $v_i'$ (the second decoding in-progress results) corresponding to 1s (edges) of the check matrix, which are computed by the second computation by the calculation section 615, are stored. Therefore, the amount of data stored in the memory 610 for storing decoding in-progress results, that is, the storage capacity required for the memory 610 for storing decoding in-progress results, becomes the multiplied value of the number of quantization bits of the decoding in-progress results and the number of 1s (the total number of the edges).

The memory 610 for storing decoding in-progress results includes, for example, two single-port RAMs capable of simultaneously reading and writing five decoding in-progress results. Five decoding in-progress results D615 are supplied to the memory 610 for storing decoding in-progress results from the calculation section 615, and also, a control signal D618 for controlling the reading and writing of the decoding in-progress results D615 is supplied to the memory 610 from the control section 617.

Five decoding in-progress results D610 are supplied to the cyclic shift circuit 611 from the memory 610 for storing decoding in-progress results. Also, a control signal D619 indicating information (matrix data) as to the fact that 1s of the check matrix, which corresponds to the decoding in-progress results D610, are arranged as a result of how many times, for example, the unit matrix forming the basis in the check matrix is cyclically shifted, is supplied to the cyclic shift circuit 611 from the control section 617. Based on the control signal D619, the cyclic shift circuit 611 performs a cyclic shifting of rearranging the five decoded results D610, and supplies the results as decoding in-progress results D611 to the calculation section 612.

The calculation section 612 includes five calculators $612_1$ to $612_5$. The five decoding in-progress results D611 (second decoding in-progress results) ($v_i'$) are supplied to the calculation section 612 from the cyclic shift circuit 611, and the five decoding in-progress results D611 (the first decoding in-progress results) (w) are supplied to the calculators $612_1$ to $612_5$, respectively. A control signal D620 is supplied to the calculation section 612 from the control section 617, and the control signal D620 is supplied to the calculators $612_1$ to $612_5$. The control signal D620 is a signal common to the five calculators $612_1$ to $612_5$.

The calculators $612_1$ to $612_5$ each perform the first computation by using the decoding in-progress results D611 in accordance with equation (9) in order to determine decoding in-progress results D612 (w). The calculation section 612 supplies the five decoding in-progress results D612, which are obtained as a result of the computations by the calculators $612_1$ to $612_5$, to the memory 613 for storing decoding in-progress results.

The five decoding in-progress results D612 corresponding to the row of the check matrix, which are the results of the first computation by the calculation section 612, are supplied to the memory 613 for storing decoding in-progress results from the calculation section 612. The memory 613 for storing decoding in-progress results stores the five decoding in-progress results D612 supplied from the calculation section 612 in sequence starting from the first address.

More specifically, at the first address of the memory 613 for storing decoding in-progress results, the decoding in-progress results w from the first row up to the fifth row from among the decoding in-progress results corresponding to the row of the check matrix are stored. Similarly, at the second address, the decoding in-progress results w from the sixth row up to the 10th row are stored, and at the third address, the decoding in-progress results w from the 11th row up to the 15th row are stored. Hereafter, similarly, the decoding in-progress results w from the 16th row up to the 30th row are stored at the fourth address up to the sixth address in units of five results, and a total of 60 decoding in-progress results w are stored in the memory 613 for storing decoding in-progress results. Therefore, the number of words of the memory 610 for storing decoding in-progress results becomes 6 such that 30, the number of rows of the check matrix H of FIG. 15 is divided by 5, the number of the decoding in-progress results, which are simultaneously read and written.

The memory 613 for storing decoding in-progress results simultaneously reads five decoding in-progress results w, which are "1s" in the column of the check matrix H, to which the decoding in-progress results $v_i'$ to be determined by the calculation section 615 correspond, from the five already stored decoding in-progress results D613, and supplies them as decoding in-progress results D613 to the cyclic shift circuit 614.

The memory 613 for storing decoding in-progress results includes, for example, a single-port RAM capable of simultaneously reading and writing five decoding in-progress results. Since the decoding in-progress results w corresponding to the row, which are computed by the first computation of the calculation section 612, are stored in the memory 613 for storing decoding in-progress results, the amount of data stored in the memory 613 for storing decoding in-progress results, that is, the storage capacity required for the memory 613 for storing decoding in-progress results, becomes the multiplied value of the number of quantization bits of the decoding in-progress results and the number of rows of the check matrix H.

The five decoding in-progress results D613 (the decoding in-progress results w) are supplied to the cyclic shift circuit 614 from the memory 613 for storing decoding in-progress results. Also, a control signal D621 indicating information (matrix data) as to the fact that 1s of the check matrix, which corresponds to the decoding in-progress results D613, are arranged as a result of how many times, for example, the unit matrix forming the basis in the check matrix is cyclically shifted, is supplied to the cyclic shift circuit 614 from the control section 617. Based on the control signal D621, the cyclic shift circuit 614 performs a cyclic shifting of rearranging the five decoding in-progress results D613, and supplies the results as the decoding in-progress results D614 to the calculation section 615.

The calculation section 615 includes five calculators $615_1$ to $615_5$. Five decoding in-progress results D614 (w) are supplied to the variable node calculation section 615 from the cyclic shift circuit 614, and also, five decoding in-progress results D610 ($v_i'$) are supplied to the variable node calculation section 615 from the memory 610 for storing decoding in-progress results. The decoding in-progress results D614 and the decoding in-progress results D610 are supplied to each of the calculators $615_1$ to $615_5$. Five pieces of received data D617 are supplied to the calculation section 615 from the memory 617 for reception, and the pieces of received data D617 are supplied individually to each of the calculators $615_1$ to $615_5$. Furthermore, a control signal D622 is supplied to the calculation section 617 from the control section 617, and the control signal D622 is supplied to the calculators $615_1$ to $615_5$. The control signal D622 is a signal common to the five calculator $617_1$ to $617_5$.

The calculators $615_1$ to $615_5$ each perform the second computation in accordance with equation (1), equation (10), and equation (11) by using the decoding in-progress results D614 and D611, and the received data D617 (LDPC CODES) in order to determine five decoding in-progress results D615 ($v_i'$) corresponding to 1s of each column of the check matrix. The calculation section 615 supplies the five decoding in-progress results D615, which are obtained as a result of the second computation by the calculators $615_1$ to $615_5$, to the memory 610 for storing decoding in-progress results.

The memory 616 for reception stores, as the received data D617, the reception LLR (log likelihood ratio) that is the 0-likeness value of the sign bit, which is calculated from the received value (sign bit) received through the communication channel.

More specifically, at the first address of the memory 616 for reception, the received data D617 corresponding to the first column up to the fifth column of the check matrix from among the received data D617 corresponding to the column of the check matrix is stored. At the second address, the received data D617 from the sixth column up to the 10th column of the check matrix is stored, and at the third address, the received data D617 from the 11th column up to the 16th of the check matrix is stored. Hereafter, similarly, at the fourth address up to the 18th address, the received data D617 corresponding to the 17th column up to the 90th column is stored in units of five pieces of the data.

Then, the memory 616 for reception simultaneously reads the already stored received data D617, in the sequence necessary for the second computation by the calculation section 615 in units of five pieces of the data, and supplies them to the calculation section 615.

The memory 616 for reception includes, for example, a single-port RAM. The amount of data stored in the memory 616 for reception, that is, the storage capacity necessary for the memory 616 for reception, is the multiplied value of the code length of the LDPC codes and the number of quantization bits of the received data. Furthermore, the number of words of the memory 616 for reception is 18 such that the code length of the LDPC codes, that is, 90, the number of columns of the check matrix, is divided by 5, the number of pieces of the received data D617, which are simultaneously read.

The control section 617 supplies the control signal D618 to the memory 610 for storing decoding in-progress results and supplies the control signal D619 to the cyclic shift circuit 611 in order to control them, respectively. Furthermore, the control section 617 supplies the control signal D620 to the calculation section 612 and supplies the control signal D621 to the cyclic shift circuit 614 in order to control them, respectively.

As a result of the data being circulated in the order of the memory 610 for storing decoding in-progress results, the cyclic shift circuit 611, the calculation section 612, the memory 613 for storing decoding in-progress results, the cyclic shift circuit 614, and the calculation section 615, the decoding apparatus 600 can perform one decoding. In the decoding apparatus 600, after decodings are performed repeatedly a predetermined number of times, the calculation section 615 performs a computation in accordance with equation (5), and the computation results are output as the final decoded results.

FIG. 29 is a block diagram showing an example of the configuration of a calculator $612_1$ of the calculation section 612 of FIG. 26.

In FIG. 29, the calculator $612_1$ is described, and the calculator $612_2$ to the calculator $612_5$ are also configured in the same way.

Furthermore, in FIG. 29, the calculator $612_1$ is shown by assuming that each decoding in-progress result ($v_i'$) obtained as a result of the second computation by the calculator 615 is quantized into six bits. A clock ck is supplied to the calculator $612_1$ of FIG. 29, and the clock ck is supplied to necessary blocks. Each block performs processing in synchronization with the clock ck.

Based on the control signal D620 supplied from the control section 617, the calculator $612_1$ of FIG. 29 performs a first computation in accordance with equation (9) by using the decoding in-progress results D611 ($v_i'$), which are read one-by-one from the cyclic shift circuit 611.

More specifically, one decoding in-progress result D611 from among the five 6-bit decoding in-progress results D611 ($v_i'$) supplied from the cyclic shift circuit 611 is supplied to the calculator $612_1$, the sign bit D631, which is the highest-order bit, is supplied to the EXOR circuit 635, and the absolute value D632 (|vi'|), which is the five lower-order bits of the 6-bit decoding in-progress results D611 ($v_i'$), are supplied to the adder 631. Furthermore, the control signal D620 is supplied to the calculator $612_1$ from the control section 617, and the control signal D620 is supplied to the selector 633 and the selector 637.

The adder 631 integrates the absolute values D632 (|$v_i'$|) by adding together the absolute value D632 (|$v_i$|) and the 9-bit value D633 stored in the register 632, and stores the 9-bit integrated value obtained as a result in the register 632 again. When the absolute values D632 (|$v_i$|) determined from the decoding in-progress results D611 corresponding to all the 1s over one row of the check matrix are integrated, the register 632 is reset.

When the decoding in-progress results D611 over one row of the check matrix are read one-by-one and the integrated value such that the absolute values D632 for one row are integrated is stored in the register 632, the control signal D620 supplied from the control section 617 changes from 0 to 1. For example, when the row weight is "9", the control signal D620 is "0" at the first to eighth clocks, and is "1" at the ninth clock.

When the control signal D620 is "1", the register 632 selects the value stored in the selector 633, that is, a 9-bit value D633 ($\Sigma|v_i'|$ from i=1 to i=$d_c$) such that the absolute values D632 ($|v_i'|$)) of the decoding in-progress results D611 (the decoding in-progress results $v_i'$) corresponding to all the 1s over one row of the check matrix are integrated, and outputs the value as a value D634 to the register 634, whereby it is stored. The register 634 supplies the stored value D634 as a 9-bit value D635 to the selector 633, and also, outputs it. When the control signal D620 is "0", the selector 633 selects the value D635 supplied from the register 634, and outputs the value to the register 634, whereby it is stored again. That is, until the absolute values D632 ($|v_i'|$) of the decoding in-progress results D611 (the decoding in-progress results $v_i'$) corresponding to all the 1s over one row of the check matrix are integrated, the register 634 supplies the previously integrated $|v_i'|$ to the selector 633, and also, outputs it.

In parallel with the above processing, the EXOR circuit 635 performs a multiplication of the sign bits by computing the exclusive OR of a 1-bit value D637 stored in the register 636 and the sign bit D631, and stores the 1-bit multiplication result D636 in the register 636 again. When the sign bits D631 of the decoding in-progress results D611 corresponding to all the 1s over one row of the check matrix are multiplied, the register 636 is reset.

When the multiplication results D636 ($\Pi$sign ($v_i'$) from i=1 to $d_c$) such that the sign bits D631 determined from the decoding in-progress results D611 corresponding to all the 1s over one row of the check matrix are multiplied are stored in the register 636, the control signal D620 supplied from the control section 617 changes from "0" to "1".

When the control signal D620 is "1", the selector 637 selects the value stored in the register 636, that is, the value D637 ($\Pi$sign ($v_i'$) from i=1 to i=$d_c$) such that the sign bits D631 of the decoding in-progress results D611 corresponding to all the 1s over one row of the check matrix are multiplied, and outputs the value as a 1-bit value D638 to the register 638, whereby it is stored. The register 638 supplies the stored value D638 as a 1-bit value D639 to the selector 637, and outputs it. When the control signal D620 is "0", the selector 637 selects the value D639 supplied from the register 638, and outputs the value to the register 638, whereby it is stored again. That is, until the sign bits D631 of the decoding in-progress results D611 (the decoding in-progress results $v_i'$) corresponding to all the 1s over one row of the check matrix are multiplied, the register 638 supplies the previously stored value to the selector 637 and outputs it.

In the calculator $612_1$, a total of 10 bits, in which the 9-bit value D635 ($\Sigma|v_i'|$ from i=1 to i=$d_c$) output from the register 634 is made to be the nine lower-order bits and the 1-bit value D639 (sign ($v_i'$) output from the register 638 is made to be the highest-order bit, are output as the decoding in-progress results D612 (the decoding in-progress results w).

As described above, in the calculator $612_1$, the computation of equation (9) is performed, and the decoding in-progress result w is determined.

FIG. 30 is a block diagram showing an example of the configuration of the calculator $615_1$ of the calculation section 615 of FIG. 26.

In FIG. 30, the calculator $615_1$ is described, and the calculator $615_2$ to the calculator $615_5$ are also configured in the same way.

Furthermore, in FIG. 30, the calculator $615_1$ is shown by assuming that each decoding in-progress result (w) obtained as a result of the first computation by the calculator 612, together with the sign bit, is quantized to a total of 10 bits and each decoding in-progress result ($u_j$) obtained previously as a result of the second computation, which is supplied from the memory 610 for storing decoding in-progress results, together with the sign bit, is quantized to a total of six bits. Furthermore, a clock ck is supplied to the calculator $615_1$ of FIG. 30, and the clock ck is supplied to necessary blocks. Each block performs processing in synchronization with the clock ck.

Based on the control signal D622 supplied from the control section 617, the calculator $615_1$ of FIG. 30 performs a second computation in accordance with equation (1), equation (10), and equation (11) by using the pieces of received data D617 (the received values $u_{0i}$), which are read one-by-one from the memory 616 for reception, the decoding in-progress results D614 (w), which are read one-by-one from the cyclic shift circuit 614, and the decoding in-progress results D610 ($v_i'$) obtained previously as a result of the second computation by the calculation section 615, which are read one-by-one from the memory 610 for storing decoding in-progress results.

More specifically, in the calculator $615_1$, the 10-bit decoding in-progress results D614 (the decoding in-progress results w) corresponding to the row of the check matrix are read one-by-one from the cyclic shift circuit 614. The 6-bit decoding in-progress results D610 (the decoding in-progress results $v_i'$) obtained previously as a result of the second computation by the calculation section 615 are read one-by-one from the memory 610 for storing decoding in-progress results. The sign bit D651 (sign (w)) of the highest-order bit of the decoding in-progress results D614 and the sign bit D653 (sign ($u_j$)) of the highest-order bit of the decoding in-progress results D610 are supplied to the EXOR circuit 653. An absolute value D652 ($|w|$) of the nine lower-order bits of the decoding in-progress results D614 and the sign bit D653 ($|v_i'|$) of the nine lower-order bits of the decoding in-progress results D610 are supplied to a subtractor 651. Furthermore, in the calculator 6151, the pieces of the 6-bit received data D617 are read one-by-one from the memory 616 for reception, and are supplied to an adder 658. Furthermore, in the calculator 6151, the control signal D622 is supplied from the control section 617, and the control signal D622 is supplied to the selector 656.

The subtractor 651 subtracts the absolute value D654 from the absolute value D652, and supplies a 5-bit subtracted value D655 to an LUT 652. The LUT 652 outputs the 5-bit computation result D656 ($\phi^{-1}(|w|-|v_i'|)$) such that the computation of $\phi^{-1}$ is performed on the subtracted value D655.

On the other hand, the EXOR circuit 653 multiplies together the sign bit D651 and the sign bit D653 by computing the exclusive OR of the sign bit D651 (sign (w)) and the sign bit D653 (sign ($v_i'$)), and outputs a 1-bit multiplication result as a multiplied value D657. Then, a 6-bit value D658, in which the 5-bit computation results D656 supplied from the LUT 652 are made to be the five lower-order bits ($\phi^{-1}(|w|-|v_i'|)$) and the 1-bit value D657 (sign (w)×sign ($v_i'$)) supplied from the EXOR circuit 653 is made to be the highest-order bit, is supplied to an adder 654, and is also supplied to an FIFO memory 659.

In the manner described above, the computation in accordance with equation (10) is performed, and the 6-bit value D658 ($u_j$), which is the result of the computation, is supplied to the adder 654 and is also supplied to the FIFO memory 659.

The adder 654 integrates the values D658 by adding together the 6-bit value D658 ($u_j$) and the 9-bit value D659 stored in the register 655, and stores the 9-bit integrated value obtained as a result in the register 655 again. When the value D658 corresponding to all the 1s over one column of the check matrix are integrated, the register 655 is reset.

When the values D658 over one column of the check matrix are read one-by-one and the value such that the values D658 for one column are integrated is stored in the register 655, the control signal D622 supplied from the control section 617 changes from "0" to "1". For example, when the column weight is "5", the control signal D622 is "0" at the first to fourth clocks, and is "1" at the fifth clock.

When the control signal D622 is "1", the selector 656 selects the value stored in the register 655, that is, a 9-bit value D659 ($\Sigma u_j$ from j=1 to $d_v$) such that the value D658 ($u_j$) corresponding to 1s over one column of the check matrix are integrated, and outputs the value to the register 657, whereby it is stored. The register 657 supplies the stored value D659 as a 9-bit value D660 to a selector 471 and an adder 658. When the control signal D622 is "0", the selector 656 selects the value D660 supplied from the register 657, and outputs the value to the register 657, whereby it is stored again. That is, until the values D658 ($u_j$) corresponding to 1s over one column of the check matrix are integrated, the register 657 supplies the previously integrated value to the selector 656 and the adder 658.

The adder 658 adds together the 9-bit value D660 and the 6-bit received data D617 supplied from the memory 616 for reception, and supplies the 9-bit value D661 obtained as a result.

In the calculator 615, when the final computation is to be performed, the adder 658 outputs the 9-bit value D661 as the final decoded results. That is, the calculation section 615 performs a computation in accordance with equation (5).

On the other hand, until a new value D660 ($\Sigma u_j$ from j=1 to j=$d_v$) is output from the register 665, the FIFO memory 659 delays the 6-bit value D658 ($u_j$), and supplies the value as a 6-bit value D662 to the subtractor 660. The subtractor 660 subtracts the 6-bit value D662 from the 9-bit value D660, and outputs the subtracted value D663. That is, the subtractor 660 subtracts the value corresponding to the edge to be determined, that is, the value D658 ($u_j$) corresponding to predetermined 1s of the check matrix, from the integrated value of the values D658 corresponding to 1s over one column of the check matrix, and outputs the subtracted value ($\Sigma u_j$ from i=1 to i=$d_c$−1) as a 6-bit subtracted value D663.

In the manner described above, the computation in accordance with equation (1) is performed, and the 6-bit subtracted value D663 ($v_i$), which is the result of the computation, is output. Then, the absolute value ($|v_i|$) of the five lower-order bits of the 6-bit subtracted value D663 output from the subtractor 660 is supplied to the LUT 661, and the sign bit (sign ($v_i$)) of the highest-order bit is output as a value D665.

The LUT 661 outputs the 5-bit computation results D666 ($\phi(|v_i|)$) such that the computation of $\phi$ is performed on the absolute value ($|v_i|$). Then, the LUT 661 supplies, as decoding in-progress results ($v_i'$), a total of six bits, in which the 5-bit computation result D666 ($\phi(|v_i|)$) output from the LUT 661 is made to be the five lower-order bits and the value D665 (sign ($v_i$)) is made to be the highest-order bit, to the memory 610 for storing decoding in-progress results.

As described above, in the calculator $615_1$, the computations of equation (1), equation (10), and equation (11) are performed, and the decoding in-progress results $v_i'$ are determined.

The maximum of the column weight of the check matrix of FIG. 15 is 5, that is, the maximum number of the decoding in-progress results D614 (w) and the decoding in-progress results D610 ($v_i'$) supplied to the calculator $615_1$ is 5. Therefore, the calculator $615_1$ has an FIFO memory 659 for delaying the five decoding in-progress results D614 and the five computation results D658 ($u_j$) determined from the decoding in-progress results D610. When a message whose column weight is less than 5 is to be calculated, the amount of delay in the FIFO memory 659 is reduced to the value of the column weight.

Figure 31:
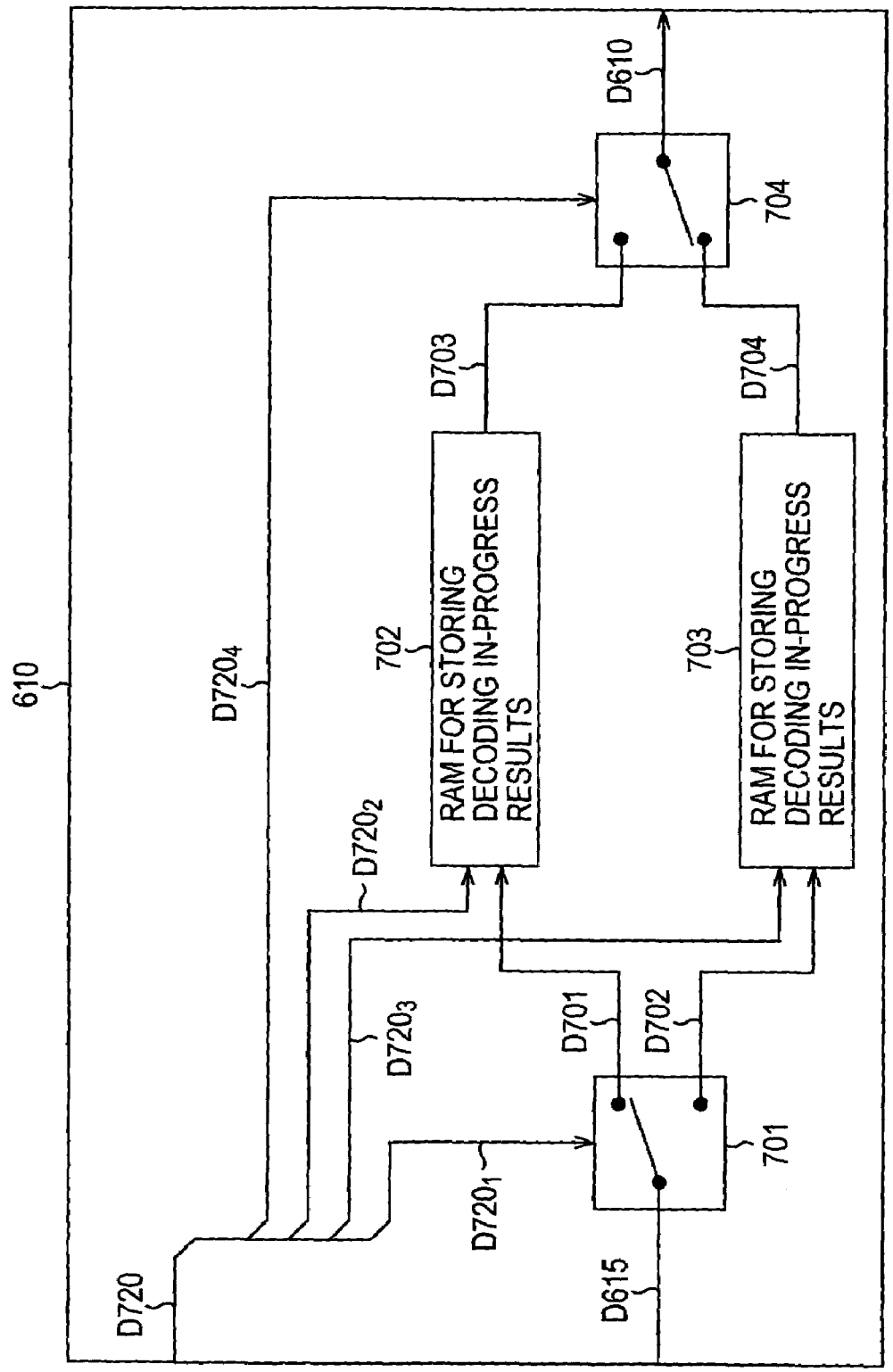
FIG. 31 is a block diagram showing an example of the configuration of a memory for storing decoding in-progress results of FIG. 26.

FIG. 31 is a block diagram showing an example of the configuration of the memory 610 for storing decoding in-progress results of FIG. 26.

The memory 610 for storing decoding in-progress results includes switches 701 and 704, and RAMs 702 and 703 for storing decoding in-progress results, which are two single-port RAMs.

Before each section of the memory 610 for storing decoding in-progress results is described in detail, the method for storing data in the RAMs 702 and 703 for storing decoding in-progress results will be described first.

The RAMs 702 and 703 for storing decoding in-progress results store the decoding in-progress results D615 that are obtained as a result of the first computation by the calculation section 612 and that are supplied via the switch 701.

More specifically, at the first address up to the fifth address of the RAM 702 for storing decoding in-progress results, the decoding in-progress results D615 (D701) corresponding to 1s from the 1st column up to the fifth column of the check matrix H of FIG. 15 are stored in such a manner that they are packed closer in the horizontal direction (in the column direction) for each row (in a manner in which 0s are ignored).

More specifically, when the j-th row and the i-th column is denoted as (j, i), at the first address of the RAM 702 for storing decoding in-progress results, data corresponding to 1s of the 5×5 unit matrix from (1, 1) to (5, 5) of the check matrix of FIG. 15 is stored. At the second address, data corresponding to the positions of 1s of a first shift matrix forming a sum matrix from (6, 1) to (10, 5) of the check matrix of FIG. 15 (a sum matrix, which is the sum of the first shift matrix in which the 5×5 unit matrix is cyclically shifted by one to the right, and a second shift matrix in which the 5×5 unit matrix is cyclically shifted by two to the right) is stored. Furthermore, at the third address, data corresponding to positions of 1s of the second shift matrix forming the sum matrix from (6, 1) to (10, 5) of the check matrix is stored. Hereafter, also, at the fourth address and the fifth address, data is stored in such a manner as to correspond to the check matrix of FIG. 15.

At the sixth address up to the 10th address of the RAM 702 for storing decoding in-progress, data corresponding to 1s from the 11th column up to the 15th column of the check matrix of FIG. 15 is stored. That is, at the sixth address, data corresponding to the positions of 1s of the first shift matrix forming the sum matrix from (11, 11) to (15, 15) of the check matrix (the sum matrix, which is the sum of the 5×5 unit matrix and the first shift matrix in which the 5×5 unit matrix is cyclically shifted by three to the right) is stored, and at the seventh address, data corresponding to 1s of the unit matrix forming the sum matrix (11, 11) to (15, 15) of the check matrix is stored. Hereafter, also, at the eighth address up to the 10th address, data is stored in such a manner as to correspond to the check matrix.

Similarly, at the 10th address up to the 28th address of the RAM 702 for storing decoding in-progress, in such a manner as to correspond to the check matrix of FIG. 15, data corresponding to 1s from the 21th column up to the 25th column, from the 31th column up to the 35th column, from the 41th column up to the 45th column, from the 51th column up to the 55th column, from the 61th column up to the 65th column, from the 71th column up to the 75th column, from the 81th column up to the 85th column, is stored. That is, the number of words of the RAM 702 for storing decoding in-progress results is 28.

At the first address to the fifth address of the RAM 703 for storing decoding in-progress results, the decoding in-progress results D615 (D702) corresponding to 1s from the sixth column up to the 10th column of the check matrix H of FIG. 15 are stored in such a manner that they are packed closer in the horizontal direction (in the column direction) for each row (in a manner in which 0s are ignored).

More specifically, at the first address of the RAM 703 for storing decoding in-progress results, data corresponding to 1s of the first shift matrix forming the sum matrix from (6, 1) to (10, 5) (the sum matrix, which is the sum of the first shift matrix in which the 5×5 unit matrix is cyclically shifted by one to the right, and the second shift matrix in which the unit matrix is cyclically shifted by two to the right), which is the sub-matrix of the check matrix, is stored. At the second address, data corresponding to 1s of the second shift matrix forming the sum matrix from (6, 1) to (10, 5), which is the sub-matrix of the check matrix, is stored. Hereafter, similarly, at the third address to the fifth address, also, data is stored in such a manner as to correspond to the sub-matrix of the check matrix.

Similarly, at the sixth address up to the second 6 address of the RAM 703 for storing decoding in-progress, data corresponding to 1s from the 16th column up to the 20th column of the check matrix of FIG. 15, from the 26th column up to the 30th column, from the 36th column up to the 40th column, from the 46th column up to the 50th column, from the 56th column up to the 60th column, from the 66th column up to the 70th column, from the 76th column up to the 80th column, and from the 86th columns up to the 90th column, is stored. That is, the number of words of the RAM 703 for storing decoding in-progress results is 26.

As described above, the number of words of the RAM 702 for storing decoding in-progress results is 28, and the number of words RAM 703 for storing decoding in-progress results is 26.

Figure 32:
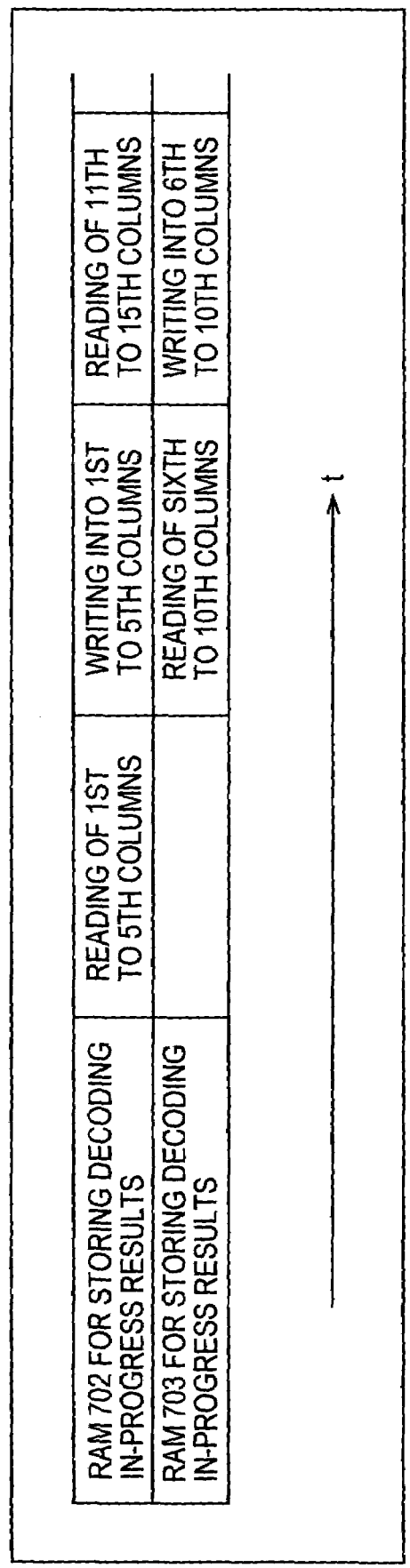
FIG. 32 is a timing chart illustrating the operation of a RAM for storing decoding in-progress results of FIG. 31.

FIG. 32 is a timing chart illustrating the operation of the reading and writing of the RAM 702 for storing decoding in-progress results and the RAM 703 for storing decoding in-progress results of the memory 610 for storing decoding in-progress results.

In FIG. 32, the horizontal axis indicates time (t).

In the memory 610 for storing decoding in-progress results, when the first computation by the calculation section 612 is to be performed, based on a control signal D$720_2$ supplied from the control section 617, the already stored decoding in-progress results D703 obtained as a result of the second computation are read from the RAM 702 for storing decoding in-progress results, or based on the control signal D$720_3$ supplied from the control section 617, the already stored decoding in-progress results D704 obtained as a result of the second computation are read from the RAM 703 for storing decoding in-progress results. The read decoding in-progress results are supplied to the cyclic shift circuit 614 via the switch 704.

When the second computation is to be performed by the calculation section 615, the decoding in-progress results D615 ($v_i'$) obtained as a result of the second computation are supplied to the memory 610 for storing decoding in-progress results from the calculation section 615. At the same time when the decoding in-progress results D615 are written at a predetermined address of one of the RAM 702 for storing decoding in-progress results and the RAM 703 for storing decoding in-progress results, the decoding in-progress results D610 ($v_i'$) obtained previously as a result of the second computation by the calculation section 615 are read from the other RAM, and are output to the calculation section 615 via the cyclic shift circuit 614.

The five decoding in-progress results D615 are supplied to the switch 701 from the calculation section 615, and also, a control signal D$720_1$ indicating the selection one of the RAM 702 for storing decoding in-progress results and the RAM 703 for storing decoding in-progress results as a memory for writing the decoding in-progress results D615 is supplied to the switch 701. Based on the control signal D$720_1$, the switch 701 selects one of the RAM 702 for storing decoding in-progress results and the RAM 703 for storing decoding in-progress results, and supplies the five decoding in-progress results D612 to the selected one of them.

The five decoding in-progress results D612 are supplied as decoding in-progress results D701 to the RAM 702 for storing decoding in-progress results from the switch 701, and also, a control signal D$702_2$ indicating the address is supplied thereto from the control section 617. The RAM 702 for storing decoding in-progress results reads the five decoding in-progress results D701 obtained previously as a result of the second computation by the calculation section 615, which are already stored at the address indicated by the control signal D$720_2$, and supplies them as the decoding in-progress results D703 to the switch 704. Furthermore, the RAM 702 for storing decoding in-progress results stores (writes) the five decoding in-progress results D702 supplied from the switch 701 at the address indicated by the control signal D$720_2$.

The five decoding in-progress results D615 are supplied as decoding in-progress results D702 to the RAM 703 for storing decoding in-progress results from the switch 701, and also, a control signal D$720_3$ indicating the address is supplied thereto from the control section 617. The RAM 703 for storing decoding in-progress results reads the five decoding in-progress results D702 obtained previously as a result of the second computation by the calculation section 615, which are already stored at the address indicated by the control signal D$720_3$, and supplies them as decoding in-progress results D704 to the switch 704. Furthermore, the RAM 702 for storing decoding in-progress results stores (writes) the five decoding in-progress results D702 supplied from the switch 701 at the address indicated by the control signal D$720_3$.

The decoding in-progress results D703 are supplied to the switch 704 from the RAM 702 for storing decoding in-progress results, or the decoding in-progress results D704 are supplied thereto from the RAM 703 for storing decoding in-progress results. Furthermore, a control signal D$720_4$ indicating the selection of one of the RAM 702 for storing decoding in-progress results and the RAM 703 for storing decoding in-progress results is supplied thereto from the control section 617. Based on the control signal D$720_4$, the switch 704 selects one of the RAM 702 for storing decoding in-progress results and the RAM 703 for storing decoding in-progress results, and supplies the five decoding in-progress results supplied from the selected RAM are supplied as the five decoding in-progress results D610 to the calculation section 615.

In the memory 610 for storing decoding in-progress results, when the second computation is to be performed by the calculation section 615, based on the control signal D720$_2$, the RAM 702 for storing decoding in-progress results reads five times the decoding in-progress results D701 corresponding to 1s from the 1st column up to the fifth column of the check matrix, which are stored at the same address, from among the already stored decoding in-progress results D701 obtained previously as a result of the second computation by the calculation section 615 in units of five results, and supplies them to the calculation section 615 via the switch 704. That is, since the column weight of the check matrix H of FIG. 15 is 5, there are five decoding in-progress results corresponding to 1s of each column of the check matrix H, and the RAM 702 for storing decoding in-progress results reads five times the decoding in-progress results D701 corresponding to 1s from the first column to the fifth column in units of five results.

Next, based on the control signal D720$_3$, the RAM 703 for storing decoding in-progress results continuously reads five times the five decoding in-progress results D702 corresponding to 1s from the sixth column to the 10th column of the check matrix, which are stored at the same address, from among the decoding in-progress results D702 obtained previously as a result of the second computation by the calculation section 615, which are already stored, and supplies them to the calculation section 615 via the switch 704 and the cyclic shift circuit 614. At the same time, the five decoding in-progress results D615 corresponding to 1s from the 1st column up to the fifth column of the check matrix obtained as a result of the second computation that is currently being performed by the calculation section 615 are supplied as the decoding in-progress results D701 to the RAM 702 for storing decoding in-progress results via the switch 701. Based on the control signal D720$_2$, the RAM 702 for storing decoding in-progress results continuously stores five times the decoding in-progress results D701 at the address at which the already read decoding in-progress results D703 are stored.

Thereafter, based on the control signal D720$_2$, the RAM 702 for storing decoding in-progress results continuously reads five times the decoding in-progress results D701 corresponding to 1s from the 11th column up to the 15th column of the check matrix, which are stored at the same address, from among the already stored decoding in-progress results D701 obtained previously as a result of the second computation by the calculation section 615 in units of five results, and supplies them to the calculation section 615 via the switch 704. At the same time, the five decoding in-progress results D612 corresponding to 1s from the sixth column up to the 10th column of the check matrix, which are obtained as a result of the second computation that is currently being performed by the calculation section 615, are supplied as the decoding in-progress results D702 to the RAM 703 for storing decoding in-progress results via the switch 701. Based on the control signal D720$_3$, the RAM 703 for storing decoding in-progress results continuously stores five times the already read decoding in-progress results D702 at the address at which the decoding in-progress results D704 are stored.

Hereafter, similarly, until the decoding in-progress results corresponding to all the 1s, which are obtained as a result of the second computation by the calculation section 615, are stored in the RAM 702 for storing decoding in-progress results or the RAM 703 for storing decoding in-progress results, the RAM 702 for storing decoding in-progress results and the RAM 703 for storing decoding in-progress results alternately perform reading and writing of five times.

Figure 33:
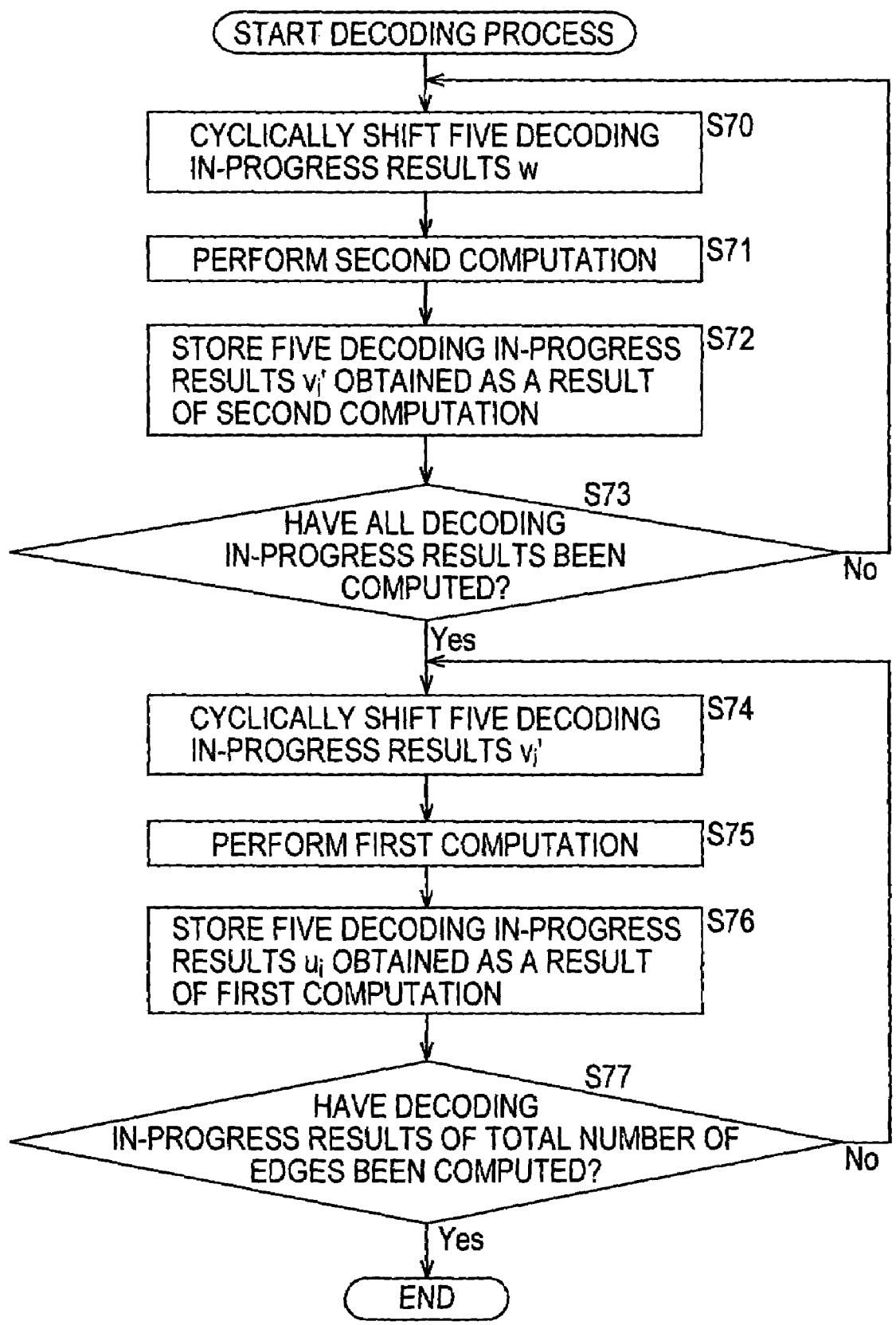
FIG. 33 is a flowchart illustrating the decoding process of the decoding apparatus of FIG. 26.

FIG. 33 is a flowchart illustrating the decoding process of the decoding apparatus 600 of FIG. 26. This process is started when, for example, received data to be decoded is stored in the memory 616 for reception.

In step S70, the cyclic shift circuit 614 performs a cyclic shifting of rearranging the five decoding in-progress results D613 stored in step S76 (to be described later), which are supplied from the memory 613 for storing decoding in-progress results, and supplies them to the calculation section 615.

More specifically, the five decoding in-progress results D613 are supplied to the cyclic shift circuit 614 from the memory 613 for storing decoding in-progress results. Also, a control signal D621 indicating information (matrix data) as to the fact that 1s of the check matrix, which corresponds to the decoding in-progress results D613, are arranged as a result of how many times, for example, the unit matrix forming the basis in the check matrix is cyclically shifted, is supplied to the cyclic shift circuit 614 from the control section 617. Based on the control signal D621, the cyclic shift circuit 614 cyclically shifts (rearranges) the five decoding in-progress results D613, and supplies them as the decoding in-progress results D614 to the calculation section 615.

When the first computation has not been performed on the received data D617 supplied from the memory 616 for reception and the decoding in-progress results D612 have not been stored in the memory 613 for storing decoding in-progress results, the calculation section 615 sets the result to an initial value.

In step S71, the calculation section 615 performs the second computation, and supplies the decoding in-progress results D615, which are the results of the computation, to the memory 610 for storing decoding in-progress results.

More specifically, the five decoding in-progress results D614 are supplied to the calculation section 615 from the cyclic shift circuit 614 in step S70, and the previous decoding in-progress results D610 are supplied thereto from the memory 610 for storing decoding in-progress results in step S72 (to be described later). Five pieces of received data D617 are supplied from the memory 616 for received data, and the five decoding in-progress results D615 and D610, and the received data D617 are supplied individually to each of the calculators 615$_1$ to 615$_5$ of the calculation section 615. Furthermore, the control signal D622 is supplied to the calculation section 615 from the control section 617, and the control signal D622 is supplied to the calculators 615$_1$ to 615$_5$.

Based on the control signal D622, the calculators 615$_1$ to 615$_5$ each perform a computation in accordance with equation (1), equation (10), and equation (11) by using the decoding in-progress results D614 and D610 and the received data D617, and supply the decoding in-progress results D615 ($v_i'$) corresponding to 1s of each column of the check matrix, which are obtained as a result of the computation, to the memory 610 for storing decoding in-progress results.

After the processing of step S71, the process proceeds to step S72, where the memory 610 for storing decoding in-progress results stores the decoding in-progress results D615 supplied from the calculation section 615 in step S71 at the same address, reads the already stored decoding in-progress results D615 (D610), and supplies them to the cyclic shift circuit 611 and the calculation section 615.

After the processing of step S72, the process proceeds to step S73, where the control section 617 determines whether or not all the decoding in-progress results D615 corresponding to 1s of each column of the check matrix have been computed by the calculation section 615. When the control section 617 determines that all the decoding in-progress results D615 have not been computed, the process returns to step S70, and the above-described processing is performed again.

On the other hand, when the control section 617 determines in step S73 that all the decoding in-progress results D615 have been computed by the calculation section 615, the process proceeds to step S74, where the cyclic shift circuit 611 cyclically shifts the decoding in-progress results D610 ($v_i'$) supplied from the memory 610 for storing decoding in-progress results.

More specifically, the five decoding in-progress results D610 are supplied to the cyclic shift circuit 611 from the memory 610 for storing decoding in-progress results. Also, a control signal D619 indicating information (matrix data) as to the fact that 1s of the check matrix, which corresponds to the decoding in-progress results D610, are arranged as a result of how many times, for example, the unit matrix forming the basis in the check matrix is cyclically shifted, is supplied to the cyclic shift circuit 611 from the control section 617. Based on the control signal D619, the cyclic shift circuit 611 cyclically shifts (rearranges) the five decoding in-progress results D610, and supplies them as the decoding in-progress results D611 to the calculation section 612.

After the processing of step S74, the process proceeds to step S75, where the calculation section 612 performs the first computation, and supplies the decoding in-progress results D612, which are the results of the computation, to the cyclic shift circuit 614.

More specifically, the five decoding in-progress results D611 ($v_i'$) are supplied to the calculation section 612 from the cyclic shift circuit 611 in step S74, and the decoding in-progress results D611 are supplied individually to each of the calculators $612_1$ to $612_5$ of the calculation section 612. Furthermore, the control signal D621 is supplied to the calculation section 612 from the control section 617, and the control signal D621 is supplied to the calculators $612_1$ to $612_5$.

Based on the control signal D619, the calculators $612_1$ to $612_5$ each perform a computation in accordance with equation (9) by using the decoding in-progress results D611, and supply the decoding in-progress results D612(w) corresponding to the row of the check matrix, which are obtained as a result of the computation, to the memory 613 for storing decoding in-progress results.

After the processing of step S75, the process proceeds to step S76, where the memory 613 for storing decoding in-progress results stores the decoding in-progress results D612 supplied from the calculation section 612 in step S75 at the same address, and the process then proceeds to step S77.

In step S77, the control section 617 determines whether or not the decoding in-progress results D612 corresponding to all the rows of the check matrix have been computed by the calculation section 612. When the control section 617 determines that all the decoding in-progress results have not been computed, the process returns to step S74, and the above-described processing is performed again.

On the other hand, when the control section 617 determines in step S77 that the decoding in-progress results D612 corresponding to all the rows have been computed by the calculation section 612, the processing is completed.

The decoding apparatus 600 repeatedly performs the decoding process of FIG. 33 for the number of decodings, and the value D661 obtained by the calculation section 621 as a result of the computation in accordance with the above-described equation (5) is output as the final decoded results.

In the above description, although the memory 610 for storing decoding in-progress results is formed from two single-port RAMs, it may be formed from three or more RAMs if reading and writing do not occur simultaneously from and to one RAM. When the physical bit width of the RAM is insufficient, by providing the same control signal by using a plurality of RAMs, these can be logically assumed as one RAM.

For the portions in which edge data (messages corresponding to edges) lacks, during the storage in the memory (when data is stored in the memories 610 and 613 for storing decoding in-progress results), no message is stored, and during the computation (during the first computation at the calculation section 612 and during the second computation at the calculation section 615), no computation is performed.

If a barrel shifter is used for the cyclic shift circuits 314 and 320 of FIGS. 16A and 16B, the cyclic shift circuits 411 and 414 of FIG. 18, and the cyclic shift circuit 611 and 614 of FIG. 26, desired operations can be realized while reducing the circuit scale.

In the above-described case, for the sake of simplification of description, a case, in which p is 5, that is, the number of rows and the number of computation of the sub-matrix forming the check matrix is 5, is used as an example. The number of rows and the number of columns of the sub-matrix need not always to be 5, and can take a different value depending on the check matrix. For example, p may be 360 or 392.

Furthermore, in this embodiment, LDPC codes of a code length of 90 and a coding rate of ⅔ are used. However, the code length and the coding rate may be any value. For example, when the number of rows and the number of columns, p, of the sub-matrix is 5, if the total number of the edges is smaller than or equal to 5, LDPC codes of even any code length and coding rate can be decoded by using the decoding apparatus 300 of FIGS. 16A to 16C, the decoding apparatus 400 of FIG. 18, and the decoding apparatus 600 of FIG. 26 by only changing the control signal.

Furthermore, the decoding apparatus for certain LDPC codes, which satisfy the conditions in which the number of rows and the number of columns, p, of the sub-matrix is a predetermined value, and the total number of the edges is smaller than or equal to a particular value, is able to decode LDPC codes of any desired coding rate at any desired code length, which satisfy the conditions.

When the check matrix is not a multiple of the number p of the rows and columns of the sub-matrix, the present invention may be applied by assuming the check matrix to be a multiple of p by assigning elements of all 0s to the outside of the fractions of the check matrix.

Next, the above-described series of processes can be performed by hardware, and it can also be performed by software. When the series of processes is performed by software, the program forming the software is installed into a general-purpose computer, etc.

Figure 34:
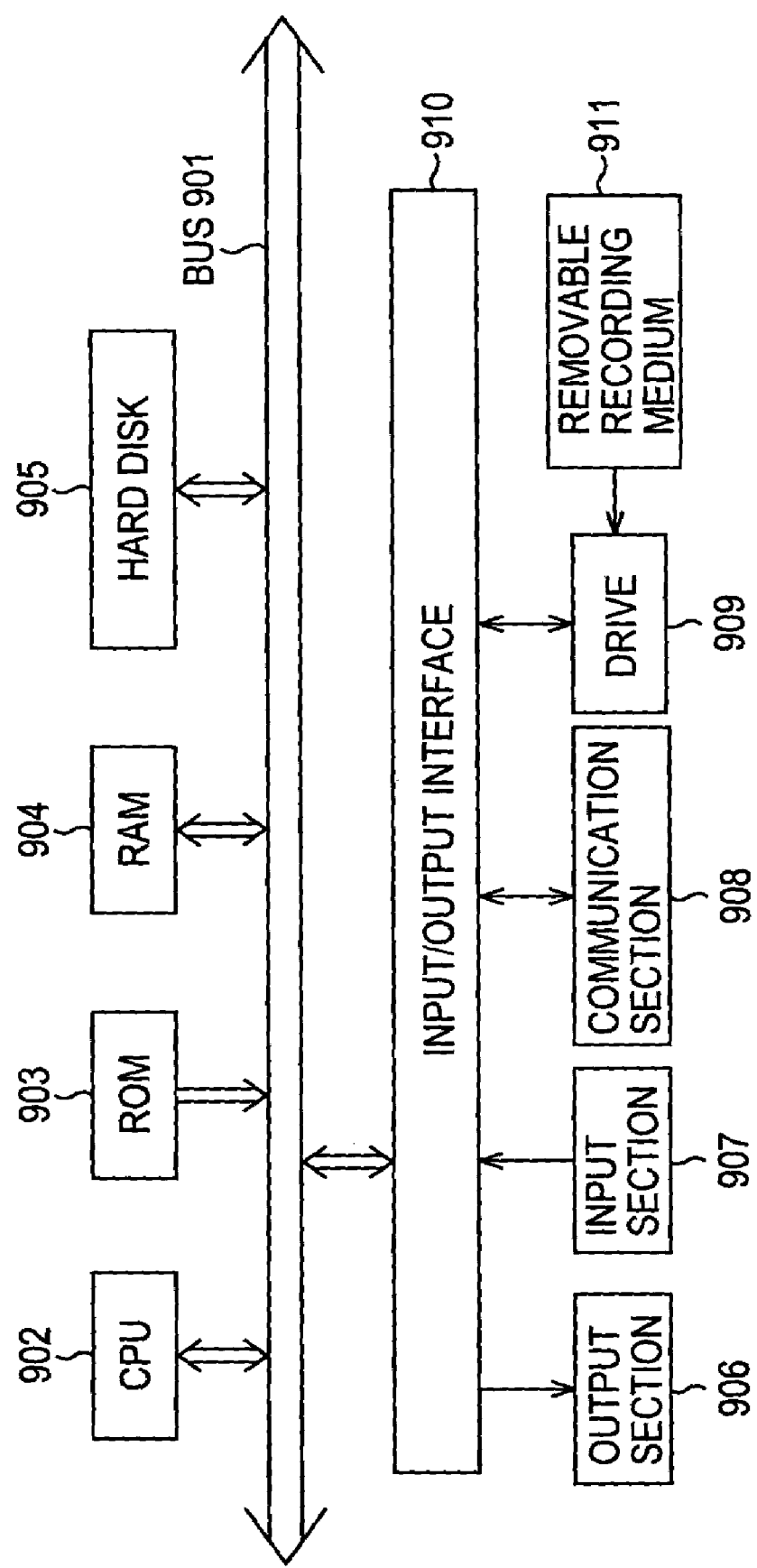
FIG. 34 is a block diagram showing an example of the configuration of an embodiment of a computer to which the present invention is applied.

Accordingly, FIG. 34 shows an example of the configuration of an embodiment of a computer to which a program for executing the above-described series of processes is installed.

The program may be recorded in advance in a hard disk 905 and a ROM 903 serving as a recording medium incorporated in the computer.

Alternatively, the program can be temporarily or permanently stored (recorded) in a removable recording medium 911, such as a flexible disk, a CD-ROM (Compact Disc Read-Only Memory), an MO (Magneto optical) disk, a DVD (Digital Versatile Disc), a magnetic disk, or a semiconductor memory. Such a removable recording medium 911 can be provided as so-called packaged software.

In addition to being installed into a computer from the removable recording medium 911 such as that described above, programs can be transferred to the computer in a wireless manner from a download site via a man-made satellite for digital satellite broadcasting or can be transferred by wire to the computer via a network, such as a LAN (Local Area Network) or the Internet. In the computer, the programs that are transferred in such a manner can be received at a communication section 908, and can be installed into the hard disk 905 contained therein.

The computer incorporates a CPU (Central Processing Unit) 902. An input/output interface 910 is connected to the CPU 902 via a bus 901. When an instruction is input by a user by operating an input section 907 including a keyboard, a mouse, a microphone, etc., via the input/output interface 910, the CPU 902 executes the program stored in the ROM (Read Only Memory) 903 in accordance with that instruction. Alternatively, the CPU 902 loads, into the RAM (Random Access Memory) 904, the program stored in the hard disk 905, the program that is transferred from a satellite or a network, that is received by the communication section 908, and that is installed into the hard disk 905, or the program that is read from the removable recording medium 911 loaded to a drive 909 and is installed into the hard disk 905, and the CPU 902 executes the program. As a result, the CPU 902 performs processing in accordance with the above-described flowcharts or processing according to the above-described block diagrams. Then, for example, the CPU 902 outputs the processing result via the input/output interface 910 from an output section 906 including an LCD (Liquid-Crystal Display), a speaker, etc., transmits the processing result from the communication section 908, and further records it in the hard disk 905 as required.

In this specification, processing steps for writing the program for enabling the computer to perform various processing need not to be executed chronologically according to the orders written as flowcharts. Also, they may be executed concurrently or individually (for example, parallel processing or object-based processing).

The program may be processed by one computer or may be processed by a plurality of computers in a distributed manner. Furthermore, the program may be transferred to a distant computer and may be processed thereby.

For decoding LDPC codes having a check matrix that can be represented by a combination of a (P×P) unit matrix, a quasi-unit matrix in which one or more 1s, which are elements of the unit matrix, are substituted with 0, a shift matrix in which the unit matrix or the quasi-unit matrix is cyclically shifted, a sum matrix, which is the sum of two or more of the unit matrix, the quasi-unit matrix, and the shift matrix, and a (P×P) 0-matrix, an architecture for simultaneously performing p check node computations and p variable node computations is adopted. As a result, by simultaneously performing p node computations, the operating frequency can be suppressed within a feasible range. Thus, while a large number of iterative decodings can be performed, it is possible to prevent simultaneous access to different addresses from occurring during writing to and reading from the memory (FIFO and RAM).

When LDPC codes represented by the check matrix of FIG. 15 are decoded by repeatedly using the decoding apparatus 300 of FIGS. 16A to 16C, since it is possible to perform computations on 269 edges every five edges for each check node and each variable node. Therefore, for one decoding, the decoding apparatus needs to perform 269/5× 2≅108 clock operations. Therefore, in order to perform 50 decodings, while 90 pieces of code information are received, the decoding apparatus needs to perform 108×50=5400 clock operations, and thus, an operating frequency approximately 60 times as high as the receiving frequency may be used. Therefore, according to the decoding apparatus of FIGS. 16A to 16C, when compared to the decoding apparatus of FIG. 9 for performing node computations one-by-one, only an operating frequency of ⅕ is necessary. When viewed from the aspect of the circuit scale, since the size of the memory is the same, even if the logic circuit becomes large slightly, the influence on the whole is small.

The decoding apparatus 400 of FIG. 18 and the decoding apparatus 600 of FIG. 26 have a memory capacity smaller than that of the decoding apparatus 300 of FIGS. 16A to 16C.

For example, when the check matrix of the LDPC codes is the check matrix of FIG. 15 and the number of quantization bits of the LDPC codes is 6, in the decoding apparatus 300 of FIGS. 16A to 16C, the edge data storage memory requires two RAMs having the capacity of 269 (the total number of the edges)×6=1614 bits, that is, the capacity of 1614×2=3228 bits for the two RAMs. In comparison, for example, when the number of quantization bits of the decoding in-progress results v is 9, in the decoding apparatus 400 of FIG. 18, the memory 413 for storing decoding in-progress results needs to be provided with a RAM having a capacity of 1614 bits of the total number of the edges, and the memory 410 for storing decoding in-progress results needs to be provided with a RAM having a capacity of the multiplied value of the code length (the number of the columns of the check matrix) of the LDPC codes and the number of quantization bits of the decoding in-progress results v, that is, the capacity of 90×9=810 bits. Thus, the circuit scale of the decoding apparatus can be reduced. Furthermore, in the decoding apparatus 400 of FIG. 18, since it is not necessary for the calculation section 415 for performing the second computation to have an FIFO memory, the circuit scale of the logic can be reduced.

Furthermore, for example, when the check matrix of the LDPC codes is the check matrix of FIG. 15 and the number of quantization bits of the decoding in-progress results v is 10, in the decoding apparatus 600 of FIG. 26, the memory 610 for storing decoding in-progress results needs to be provided with a RAM having a capacity of 1614 bits of the total number of the edges, and the memory 613 for storing decoding in-progress results needs to be provided with a RAM having a capacity of the multiplied value of the number of rows of the check matrix and the decoding in-progress results v, that is, a capacity of 30×10=300 bits. Thus, the circuit scale of the decoding apparatus can be reduced. Furthermore, in the decoding apparatus 600 of FIG. 26, since it is not necessary for the calculation section 612 for performing the first computation to have an FIFO memory, the circuit scale of the logic can be reduced.

In general, since the code length of the LDPC codes is as great as several thousands to several tens of thousands, the LDPC codes whose value of p has a size of several hundreds are used. In that case, the advantages of using the decoding apparatus according to the present invention increase.

Furthermore, since the decoding apparatus according to the present invention faithfully implements the sum product algorithm, decoding loss other than quantization of messages does not occur.

INDUSTRIAL APPLICABILITY

From the above viewpoints, by using the decoding apparatus according to the present invention, high-performance decoding becomes possible.

The invention claimed is:

1. A decoding apparatus for decoding Low Density Parity Check ("LDPC") codes, the LDPC codes being represented by a check matrix, which is composed of a plurality of sub-matrices, the sub-matrices including a (P×P) unit matrix, a quasi-unit matrix, a shift matrix, a sum matrix, and a (P×P) zero matrix, wherein the quasi-unit matrix is a unit matrix having one or more 1s being substituted with 0, the shift matrix is a unit matrix or a quasi-unit matrix which is cyclically shifted, the sum matrix is the sum of two or more of said unit matrix, said quasi-unit matrix, and said shift matrix, the decoding apparatus comprising:
first computation means for simultaneously performing P check node computations for decoding said LDPC codes;
second computation means for simultaneously performing P variable node computations for decoding said LDPC codes; and
message storage means for simultaneously reading and writing message data corresponding to P edges, the message data being obtained as a result of said P check node computations or said P variable node computations;
wherein said message storage means stores message data corresponding to the edges, the message data being read during the check node computation in such a manner that the sub-matrices of the check matrix are packed closer in a predetermined direction excluding the zero matrix.

2. The decoding apparatus according to claim 1, wherein said first computation means has P check node calculators for performing check node computations; and
said second computation means has P variable node calculators for performing variable node computations.

3. The decoding apparatus according to claim 1, wherein the sub-matrices of the check matrix are packed closer in the row direction.

4. The decoding apparatus according to claim 1, wherein the sub-matrices of the check matrix are packed closer in the column direction.

5. The decoding apparatus according to claim 1, wherein said message storage means stores, at the same address, messages corresponding to P edges belonging to a unit matrix whose weight is 1, a quasi-unit matrix, or a shift matrix, when the sub-matrices, whose weight is 2 or more from among the sub-matrices representing said check matrix, are represented in the form of the sum of the unit matrix whose weight is 1, the quasi-unit matrix, or the shift matrix.

6. The decoding apparatus according to claim 1, wherein said message storage means comprises number-of-rows/p FIFOs and number-of-columns/p FIFOs; and said number-of-rows/p FIFOs and said number-of-columns/p FIFOs each have a number of words corresponding to the weight of the row and the weight of the column of said check matrix, respectively.

7. The decoding apparatus according to claim 1, wherein said message storage means comprises a Random Access Memory ("RAM"); and
said RAM stores said message data in the read-out sequence in such a manner as to be packed closer and reads said message data in the storage position sequence.

8. The decoding apparatus according to claim 1, further comprising:
received information storage means for storing received information of LDPC codes and for simultaneously reading P pieces of said received information.

9. The decoding apparatus according to claim 8, wherein said received information storage means stores said received information in such a manner that the received information can be read in the sequence necessary for said variable node computation.

10. The decoding apparatus according to claim 1 further comprising:
rearranging means for rearranging messages obtained as a result of said P check node computations or said P variable node computations.

11. The decoding apparatus according to claim 10, wherein
said rearranging means comprises a barrel shifter.

12. The decoding apparatus according to claim 1, wherein said first computation means and said second computation means determine messages corresponding to P edges.

13. The decoding apparatus according to claim 1, wherein said first computation means performs some of said P check node computations and said P variable node computations; and
said second computation means performs some of the others of said P variable node computations.

14. The decoding apparatus according to claim 13, wherein
said first computation means comprises P calculators for performing some of said P check node computations and said P variable node computations; and
said second computation means comprises P calculators for performing some of the others of said P variable node computations.

15. The decoding apparatus according to claim 13, further comprising:
first decoding in-progress result storage means for simultaneously reading and writing first decoding in-progress results corresponding to P edges, which are obtained by said first computation means by performing some of said P check node computations and said P variable node computations.

16. The decoding apparatus according to claim 15, wherein
said first decoding in-progress result storage means stores said first decoding in-progress results corresponding to the edge, which are read when some of the others of said P variable node computations are performed, in such a manner that 1s of the check matrix are packed closer in the row direction.

17. The decoding apparatus according to claim 15, wherein
said first decoding in-progress result storage means are two single-port Random Access Memories ("RAMs").

18. The decoding apparatus according to claim 17, wherein
said two single-port RAMs alternately store said first decoding in-progress results in units of said first decoding in-progress results corresponding to edges of P rows of said check matrix.

19. The decoding apparatus according to claim 17, wherein
said two single-port RAMs each read said first decoding in-progress results stored at the same address, where said decoding in-progress results were previously stored.

20. The decoding apparatus according to claim 15, wherein
said first decoding in-progress result storage means stores, at the same address, said first decoding in-progress results corresponding to P edges belonging to a unit matrix whose weight is 1, a quasi-unit matrix, or a shift matrix when the sub-matrices, whose weight is 2 or more from among the sub-matrices representing said check matrix, are represented in the form of the sum of the unit matrix whose weight is 1, the quasi-unit matrix, or the shift matrix.

21. The decoding apparatus according to claim 13, further comprising:
second decoding in-progress result storage means for simultaneously reading and writing said second decoding in-progress results corresponding to P edges, which are obtained by said second computation means by performing some of the others of said P variable node computations.

22. The decoding apparatus according to claim 13, further comprising:
received information storage means for storing received information of LDPC codes and simultaneously reading said P pieces of received information.

23. The decoding apparatus according to claim 22, wherein
said received information storage means stores said received information in such a manner that said received information can be read in the sequence necessary for some of the others of said P variable node computations.

24. The decoding apparatus according to claim 13, further comprising:
rearranging means for rearranging first decoding in-progress results obtained by said first computation means by performing some of said P check node computations and said P variable node computations, or second decoding in-progress results obtained by said second computation means by performing some of the others of said P variable node computations.

25. The decoding apparatus according to claim 24, wherein
said rearranging means comprises a barrel shifter.

26. The decoding apparatus according to claim 1, wherein
said first computation means performs some of said P check node computations; and
said second computation means performs some of the others of said P check node computations, and said P variable node computations.

27. The decoding apparatus according to claim 26, wherein
said first computation means comprises P calculators for performing some of said P check node computations; and
said second computation means comprises P calculators for performing some of the others of said P check node computations, and said P variable node computations.

28. The decoding apparatus according to claim 26, further comprising:
first decoding in-progress result storage means for simultaneously reading and writing first decoding in-progress results corresponding to P edges, which are obtained by said first computation means by performing some of said P check node computations.

29. The decoding apparatus according to claim 26, further comprising:
second decoding in-progress result storage means for simultaneously reading and writing second decoding in-progress results corresponding to P edges, which are obtained by said second computation means by performing some of the others of said P check node computations, and said P variable node computations.

30. The decoding apparatus according to claim 29, wherein
said second decoding in-progress result storage means stores said second decoding in-progress results corresponding to edges, which are read when some of the others of said P check node computations; and
said P variable node computations are performed, in such a manner that 1s of the check matrix are packed closer in the column direction.

31. The decoding apparatus according to claim 29, wherein
said second decoding in-progress result storage means are two single-port Random Access Memories ("RAMs").

32. The decoding apparatus according to claim 31, wherein
said single-port RAMs alternately store said second decoding in-progress results in units of said second decoding in-progress results corresponding to P edges of said check matrix.

33. The decoding apparatus according to claim 31, wherein
said two single-port RAMs each read said second decoding in-progress results stored at the same address, where said decoding in-progress results were previously stored.

34. The decoding apparatus according to claim 29, wherein
said second decoding in-progress result storage means stores, at the same address, said second decoding in-progress results corresponding to P edges belonging to a unit matrix whose weight is 1, a quasi-unit matrix, or a shift matrix when the sub-matrices whose weight is 2 or more from among the sub-matrices representing said check matrix are represented in the form of the sum of the unit matrix whose weight is 1, the quasi-unit matrix, or the shift matrix.

35. The decoding apparatus according to claim 26, further comprising:
received information storage means for storing received information of LDPC codes and for simultaneously reading said P pieces of received information.

36. The decoding apparatus according to claim 35, wherein
said received information storage means stores said received information in such a manner that said received information can be read in the sequence necessary for some of the others of said P check node computations, and said P variable node computations.

37. The decoding apparatus according to claim 26, further comprising:

rearranging means for rearranging first decoding in-progress results obtained by said first computation means by performing some of said P check node computations, or second decoding in-progress results obtained by said second computation means by performing some of the others of said P check node computations, and said P variable node computations.

38. The decoding apparatus according to claim 37, wherein said rearranging means comprises a barrel shifter.

39. A decoding method for use with a decoding apparatus for decoding Low Density Parity Check ("LDPC") codes, the LDPC codes being represented by a check matrix, which is composed of a plurality of sub-matrices, the sub-matrices including a (P×P) unit matrix, a quasi-unit matrix, a shift matrix, a sum matrix, and a (P×P) zero matrix, wherein the quasi-unit matrix is a unit matrix having one or more 1s being substituted with 0, the shift matrix is a unit matrix or a quasi-unit matrix which is cyclically shifted, the sum matrix is the sum of two or more of said unit matrix, said quasi-unit matrix, and said shift matrix, the decoding method comprising:

a first computation step of simultaneously performing P check node computations for decoding said LDPC codes;

a second computation step of simultaneously performing P variable node computations for decoding said LDPC codes; and a message storage step of simultaneously reading and writing message data corresponding to P edges, the message data being obtained as a result of said P check node computations or said P variable node computations;

wherein the message storage step stores message data corresponding to the edges, the message data being read during the check node computation in such a manner that the sub-matrices of the check matrix are packed closer in a predetermined direction excluding the zero matrix.

40. A computer readable medium having a program for causing a computer to perform a decoding method for use with a decoding apparatus for decoding Low Density Parity Check ("LDPC") codes, said method comprising:

a first computation step of simultaneously performing P check node computations for decoding said LDPC codes;

a second computation step of simultaneously performing P variable node computations for decoding said LDPC codes; and a message storage step for simultaneously reading and writing message data corresponding to P edges, the message data being obtained as a result of said P check node computations or said P variable node computations;

wherein the message storage step stores message data corresponding to the edges, the message data being read during the check node computation in such a manner that the sub-matrices of the check matrix are packed closer in a predetermined direction excluding the zero matrix.

* * * * *